(12) United States Patent
Chang et al.

(10) Patent No.: US 11,251,289 B2
(45) Date of Patent: Feb. 15, 2022

(54) FINFET DEVICE COMPRISING PLURALITY OF DUMMY PROTRUDING FEATURES

(71) Applicant: Taiwan Semiconductor Manufacturing Company, Ltd., Hsinchu (TW)

(72) Inventors: Che-Cheng Chang, New Taipei (TW); Po-Chi Wu, Zhubei (TW); Chih-Han Lin, Hsinchu (TW); Horng-Huei Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 473 days.

(21) Appl. No.: 16/049,879

(22) Filed: Jul. 31, 2018

(65) Prior Publication Data
US 2018/0337251 A1 Nov. 22, 2018

Related U.S. Application Data

(62) Division of application No. 15/640,920, filed on Jul. 3, 2017, now Pat. No. 10,355,110.
(Continued)

(51) Int. Cl.
*H01L 29/66* (2006.01)
*H01L 21/8234* (2006.01)
(Continued)

(52) U.S. Cl.
CPC .. *H01L 29/6681* (2013.01); *H01L 21/823431* (2013.01); *H01L 21/823481* (2013.01);
(Continued)

(58) Field of Classification Search
CPC ............. H01L 27/0886; H01L 29/0649; H01L 29/6681; H01L 21/823481;
(Continued)

(56) References Cited

U.S. PATENT DOCUMENTS 8,617,996 B1 * 12/2013 Chi ................... H01L 21/30604
257/E21.377
8,895,446 B2 * 11/2014 Peng ................. H01L 21/76224
438/700
(Continued)

FOREIGN PATENT DOCUMENTS

| CN | 1567593 A | 1/2005 |
| CN | 103474397 A | 12/2013 |
| CN | 105374871 A | 3/2016 |

OTHER PUBLICATIONS

Jonvanovic, V. et al., "Sub-100 nm Silicon-Nitride Hard Mask for High Aspect-Ratio Silicon Fins", 2007 pp. 1-5.

*Primary Examiner* — Allen L Parker
*Assistant Examiner* — Charles N Ausar-El
(74) *Attorney, Agent, or Firm* — Slater Matsil, LLP

(57) ABSTRACT

A method includes forming a first active fin structure and a second active fin structure on a substrate. A dummy fin structure is formed on the substrate, the dummy fin structure being interposed between the first active fin structure and the second active fin structure. The dummy fin structure is removed to expose a first portion of the substrate, the first portion of the substrate being disposed directly below the dummy fin structure. A plurality of protruding features is formed on the first portion of the substrate. A shallow trench isolation (STI) region is formed over the first portion of the substrate, the STI region covering the plurality of protruding features, at least a portion of the first active fin structure and at least a portion of the second active fin structure extending above a topmost surface of the STI region.

20 Claims, 47 Drawing Sheets

Related U.S. Application Data

(60) Provisional application No. 62/370,099, filed on Aug. 2, 2016, provisional application No. 62/405,735, filed on Oct. 7, 2016.

(51) Int. Cl.
*H01L 27/088* (2006.01)
*H01L 29/06* (2006.01)
*H01L 29/78* (2006.01)

(52) U.S. Cl.
CPC ...... *H01L 27/0886* (2013.01); *H01L 29/0649* (2013.01); *H01L 29/7848* (2013.01)

(58) Field of Classification Search
CPC ....... H01L 21/82431; H01L 21/823431; H01L 29/7848
See application file for complete search history.

(56) References Cited

U.S. PATENT DOCUMENTS

| | | | |
|---|---|---|---|
| 8,975,129 B1 * | 3/2015 | Shieh | H01L 21/3086 438/199 |
| 8,987,836 B2 * | 3/2015 | Kim | H01L 29/785 257/401 |
| 9,177,955 B2 * | 11/2015 | Peng | H01L 29/7831 |
| 9,190,496 B2 | 11/2015 | Lin et al. | |
| 9,209,178 B2 * | 12/2015 | Kanakasabapathy | H01L 27/0886 |
| 9,449,886 B2 * | 9/2016 | Wu | H01L 29/66795 |
| 9,455,176 B2 | 9/2016 | Tsao et al. | |
| 9,455,198 B1 * | 9/2016 | Yu | H01L 21/823481 |
| 9,455,255 B2 * | 9/2016 | Ju | H01L 27/0886 |
| 9,515,184 B2 * | 12/2016 | Chiang | H01L 29/785 |
| 9,530,868 B2 * | 12/2016 | Huang | H01L 21/3065 |
| 9,595,475 B2 * | 3/2017 | Liaw | H01L 21/823431 |
| 9,607,985 B1 * | 3/2017 | Tseng | H01L 27/0886 |
| 9,647,066 B2 * | 5/2017 | Lu | H01L 29/10 |
| 9,679,815 B2 * | 6/2017 | Lee | H01L 21/823431 |
| 9,679,816 B2 * | 6/2017 | Liou | H01L 21/3085 |
| 9,722,050 B2 * | 8/2017 | Li | H01L 21/308 |
| 9,805,984 B2 | 10/2017 | Yin et al. | |
| 9,825,173 B2 * | 11/2017 | Lin | H01L 29/66795 |
| 9,875,941 B1 * | 1/2018 | Hung | H01L 21/02164 |
| 9,899,388 B2 * | 2/2018 | Kim | H01L 21/823821 |
| 9,929,256 B2 * | 3/2018 | Cheng | H01L 21/823418 |
| 9,953,885 B2 * | 4/2018 | Yuan | H01L 21/76224 |
| 9,991,256 B2 * | 6/2018 | Chang | H01L 21/823431 |
| 10,109,531 B1 * | 10/2018 | Hsu | H01L 21/76224 |
| 10,256,328 B2 * | 4/2019 | Cheng | H01L 21/823807 |
| 10,283,415 B2 | 5/2019 | Hsu et al. | |
| 2013/0330889 A1 * | 12/2013 | Yin | H01L 27/0924 438/197 |
| 2013/0330906 A1 * | 12/2013 | Yu | H01L 29/66795 438/424 |
| 2014/0001562 A1 * | 1/2014 | Liaw | H01L 21/823431 257/369 |
| 2014/0227857 A1 * | 8/2014 | Youn | H01L 21/76229 438/427 |
| 2015/0069528 A1 * | 3/2015 | Chiang | H01L 29/785 257/401 |
| 2015/0111362 A1 * | 4/2015 | Shieh | H01L 21/823431 438/424 |
| 2015/0206759 A1 * | 7/2015 | Tsao | H01L 29/0653 257/506 |
| 2015/0206954 A1 * | 7/2015 | Lin | H01L 29/66795 257/365 |
| 2015/0357439 A1 * | 12/2015 | Liu | H01L 29/66795 257/401 |
| 2016/0005866 A1 * | 1/2016 | Wu | H01L 29/7851 257/401 |
| 2016/0056045 A1 * | 2/2016 | Huang | H01L 21/3065 257/623 |
| 2016/0148832 A1 * | 5/2016 | Leobandung | H01L 21/743 257/401 |
| 2016/0155670 A1 * | 6/2016 | Liaw | H01L 21/823431 257/401 |
| 2016/0329248 A1 * | 11/2016 | Liou | H01L 21/3085 |
| 2017/0069504 A1 * | 3/2017 | Li | H01L 21/306 |
| 2017/0092643 A1 * | 3/2017 | Tseng | H01L 27/0886 |
| 2017/0207216 A1 * | 7/2017 | Peng | H01L 27/0886 |
| 2018/0006032 A1 * | 1/2018 | You | H01L 21/823431 |
| 2018/0047634 A1 * | 2/2018 | Jun | H01L 21/823481 |

* cited by examiner

FINFET DEVICE COMPRISING PLURALITY OF DUMMY PROTRUDING FEATURES

PRIORITY CLAIM AND CROSS-REFERENCE

This application is a divisional U.S. application Ser. No. 15/640,920, filed on Jul. 3, 2017, which claims the benefit of U.S. Provisional Application Ser. No. 62/370,099, filed on Aug. 2, 2016, and U.S. Provisional Application Ser. No. 62/405,735, filed on Oct. 7, 2016, which applications are hereby incorporated herein by reference in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a fin field-effect transistor (FinFET), which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
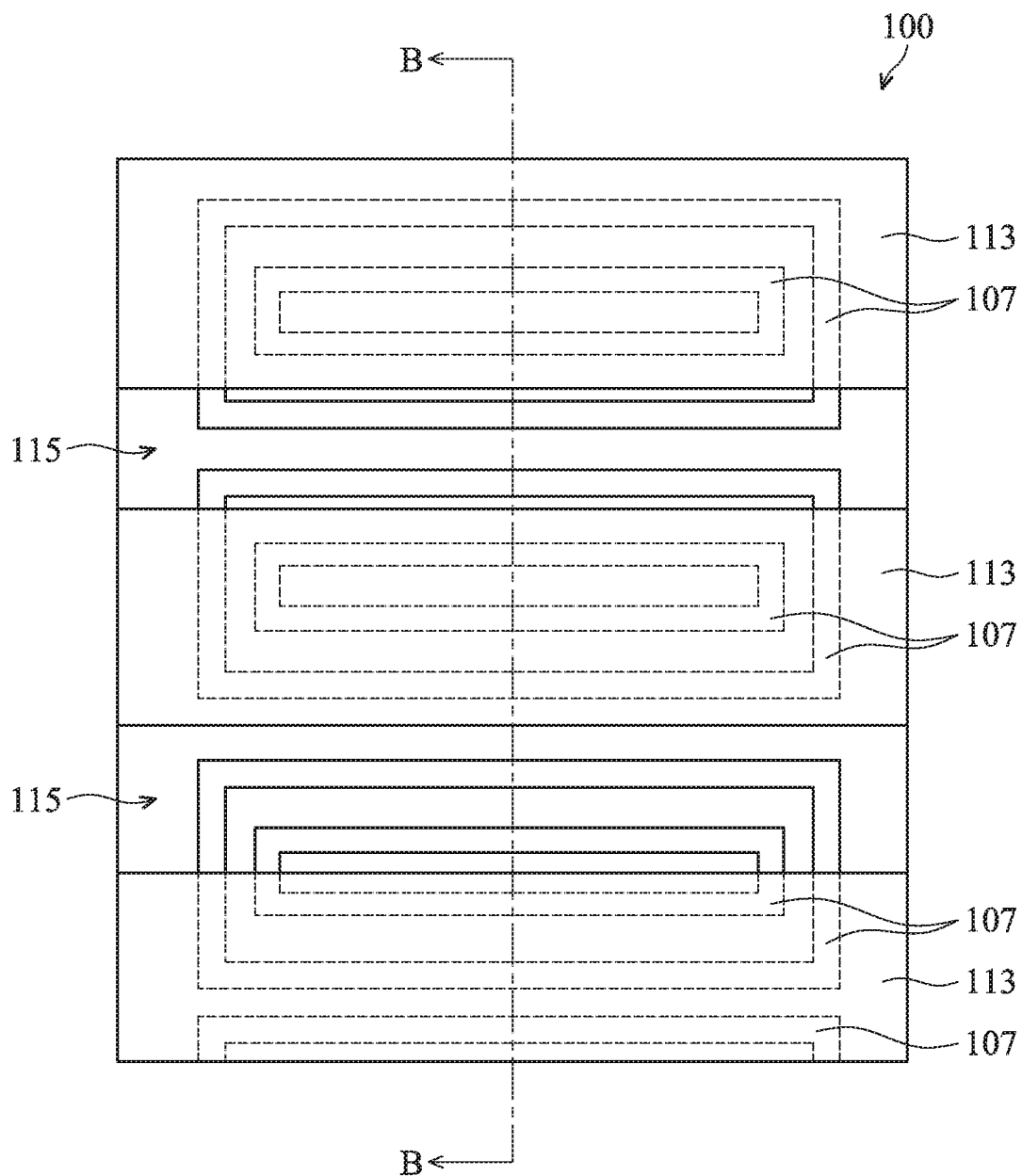
FIGS. 1A-11B illustrate top and cross-sectional views of various intermediate stages of fabrication of a fin structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a fin structure and a method of forming the same. In some embodiments, a fin structure may be used to form a fin field-effect transistor (FinFET). Various embodiments described herein allow for enlarging a fin etch process window, better critical dimension (CD) loading for strained source and drain (SSD) epitaxial (EPI) process, CVD stress effect (bending) improvement, better wafer acceptance test (WAT) and reliability performance, and better circuit probe (CP) yield performance.

Figure 1B:
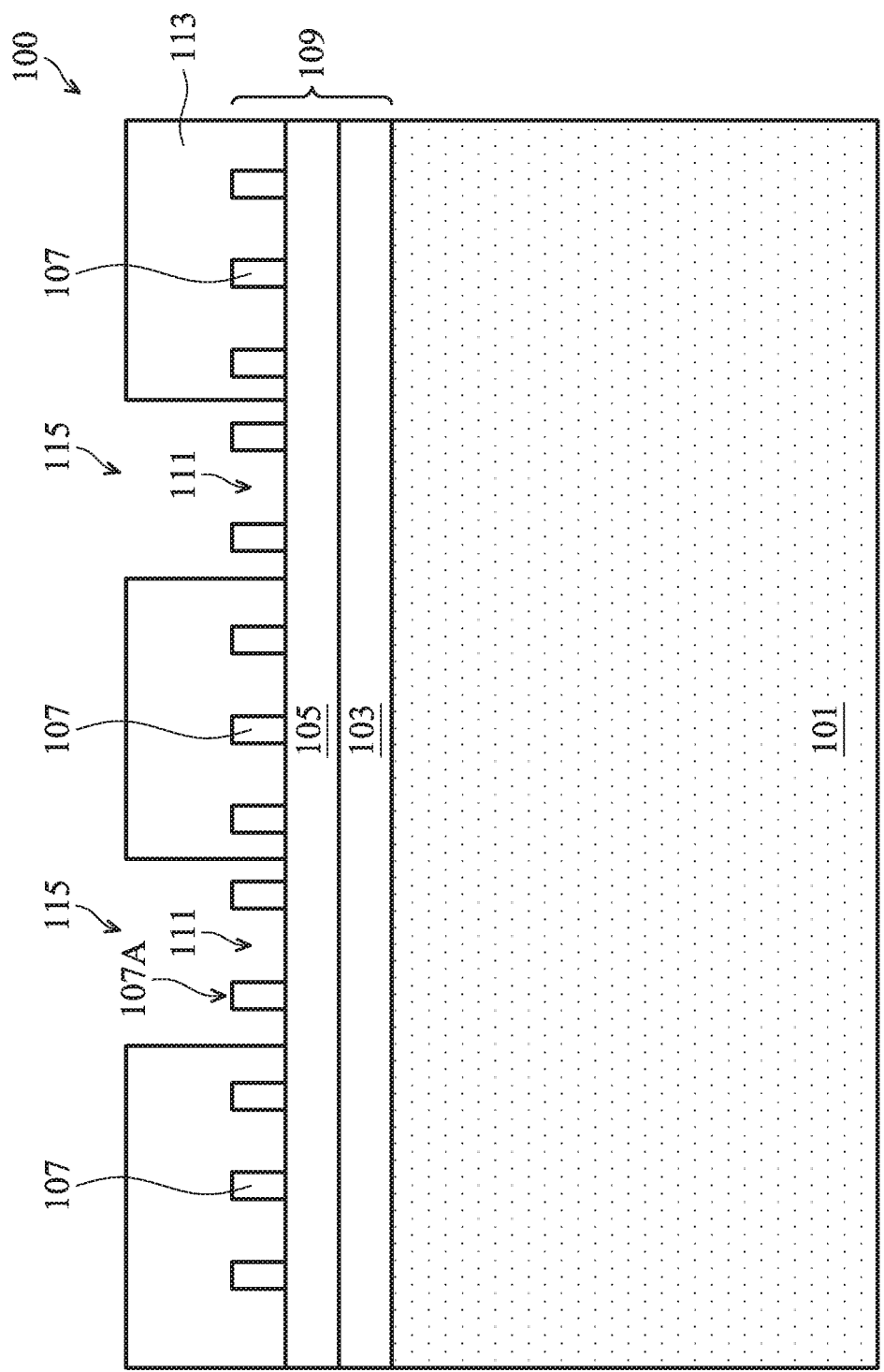

FIGS. 1A-11B illustrate top and cross-sectional views of various intermediate stages of fabrication of a fin structure in accordance with some embodiments, where an "A" figure represents a top view and a "B" figure represents a cross-sectional view along a B-B line of the respective "A" figure. In some embodiments, further process steps may be performed on the fin structure to form a FinFET as described below with reference to FIGS. 14-18C. FIGS. 1A and 1B illustrate top and cross-sectional views of a substrate 101, which may be a part of a wafer 100. The substrate 101 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 101 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 101 to generate the structural and functional requirements of the design for the resulting FinFET. The integrated circuit devices may be formed using any suitable methods.

In some embodiments, a first mask layer 103 is formed over the substrate 101, a second mask layer 105 is formed over the first mask layer 103, and a third mask layer 107 is formed over the second mask layer 105. The first mask layer 103 may be a hard mask comprising silicon nitride, silicon oxynitride, silicon carbide, silicon carbonitride, the like, or a combination thereof. In some embodiments where the first mask layer 103 comprises silicon nitride, the first mask layer 103 may be formed using thermal nitridation, plasma anodic nitridation, Low-Pressure Chemical Vapor Deposition (LPCVD), Plasma Enhanced Chemical Vapor Deposition (PECVD), the like, or a combination thereof. In some embodiments, the first mask layer 103 may have a thickness between about 10 Å and about 1000 Å. It is appreciated that the values recited throughout the description are examples, and different values may also be adopted without changing the principle of the present disclosure.

The second mask layer 105 may be a hard mask comprising an oxide, such as silicon oxide, or the like. The second mask layer 105 may also be referred to as a pad oxide. In some embodiments, the second mask layer 105 may be formed using Atomic Layer Deposition (ALD), Chemical Vapor Deposition (CVD), thermal oxidation, the like, or a combination thereof. In some embodiments, the second mask layer 105 may have a thickness between about 20 Å and about 500 Å. The third mask layer 107 may be formed using similar materials and methods as the first mask layer 103 and the description is not repeated herein. In some embodiments, the third mask layer 107 may have a thickness between about 100 Å and about 2000 Å. A stack of the first mask layer 103, the second mask layer 105, and the third mask layer 107 may also be referred to as a mask stack 109, or a hard mask stack 109.

Referring further to FIGS. 1A and 1B, the third mask layer 107 of the mask stack 109 is patterned to form a plurality of openings 111 in the third mask layer 107. In some embodiments, the third mask layer 107 may be patterned using suitable photolithography and etch processes. In other embodiments, the patterned third mask layer 107 may be formed using a multiple-patterning process, such as a self-aligned double patterning (SADP) process, a self-aligned quadruple patterning (SAQP) process, or the like, that allows for forming features having a reduced critical dimension (CD) and pitch. In such embodiments, one or more additional mask layers (not shown), one or more mandrel layers (not shown), and one or more spacer layers (not shown) may be formed over the mask stack 109. For example, a mandrel layer (not shown) is formed and patterned over the second mask layer 105. The patterned third mask layer 107 is formed on the sidewalls of the patterned mandrel layer. Subsequently, the patterned mandrel layer is removed, leaving behind the patterned third mask layer 107. In the illustrated embodiment, unremoved features 107A of the patterned third mask layer 107 have a uniform width and pitch. In other embodiments, the features 107A of the patterned third mask layer 107 may have a non-uniform width and/or a non-uniform pitch.

In some embodiments, a patterned mask layer 113 having openings 115 is formed over the mask stack 109. The patterned mask layer 113 may comprise a photo-patternable material, such as a photoresist material, and may be formed using a spin-on coating, or the like. Alternatively, the patterned mask layer 113 may comprise a non-photo-patternable material. In yet other embodiments, the patterned mask layer 113 may comprise a multi-layer mask formed of layers of photo-patternable and non-photo-patternable materials. In some embodiments where the patterned mask layer 113 comprises a photoresist material, the photoresist material is irradiated (exposed) and developed to remove portions of the photoresist material and form the openings 115. In the illustrated embodiment, each of the openings 115 exposes two features 107A of the patterned third mask layer 107. In other embodiments, each of the openings 115 may expose less than two or more than two features 107A of the patterned third mask layer 107.

Figure 2A:
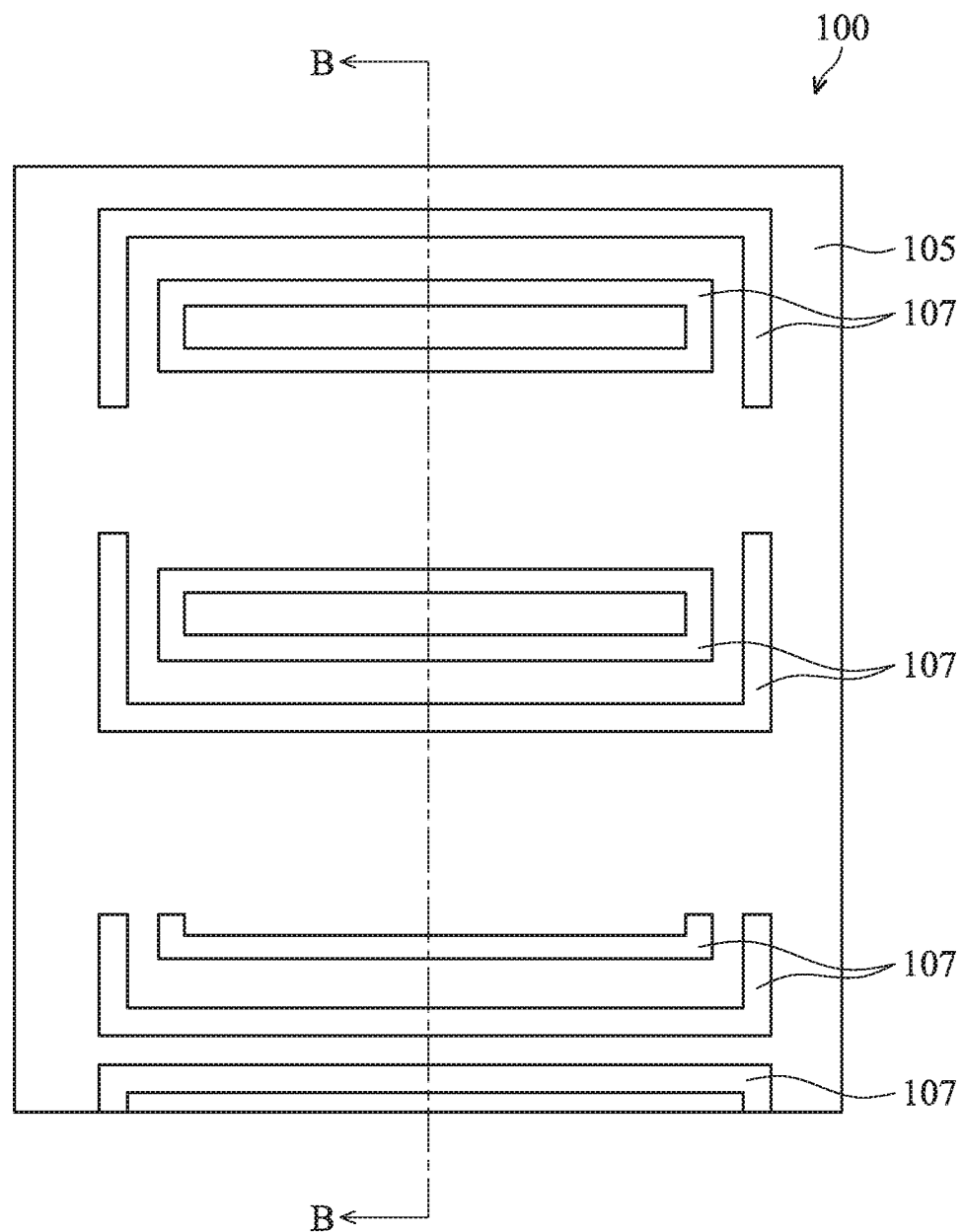
Figure 2B:
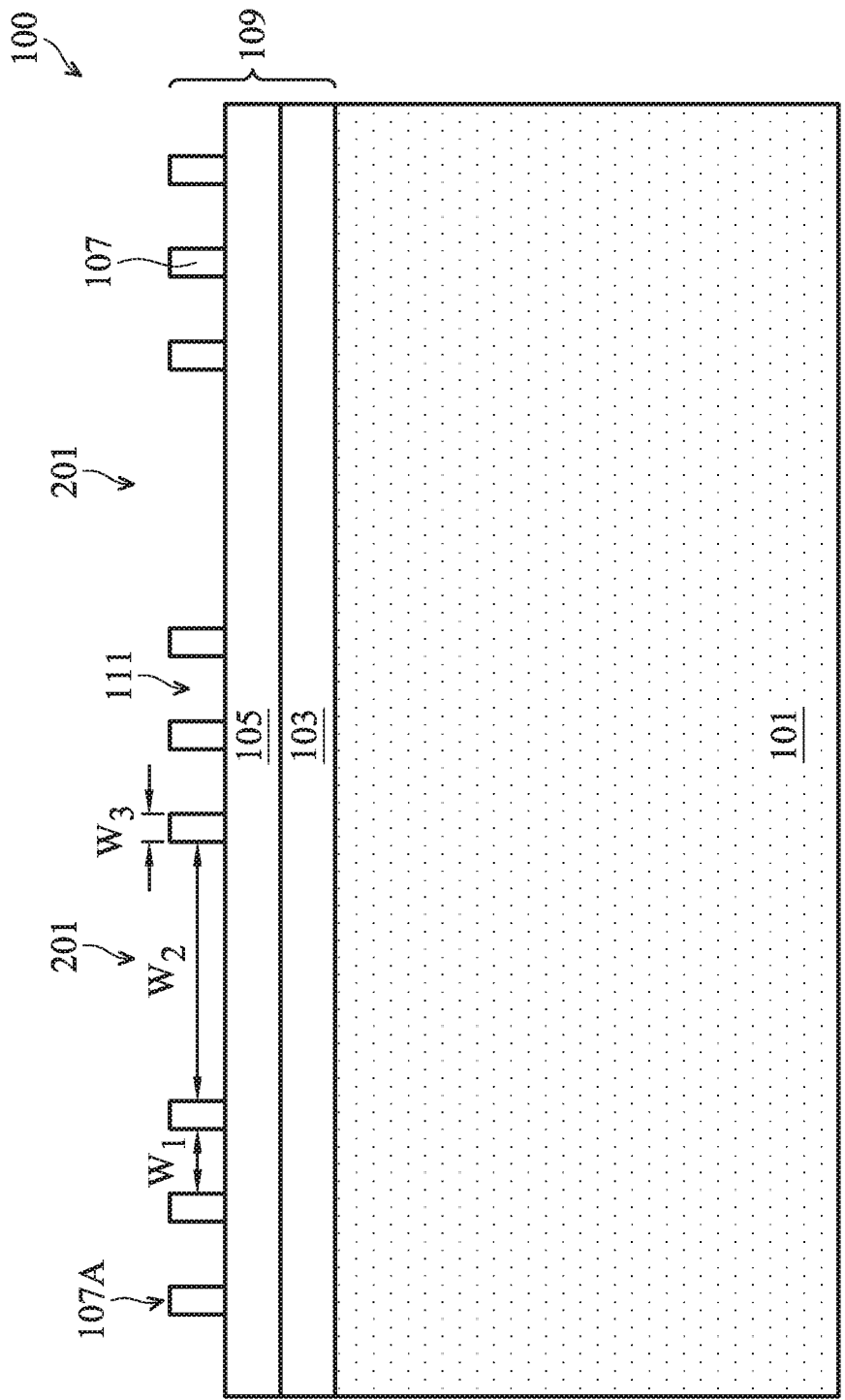

Referring to FIGS. 2A and 2B, the exposed features 107A of the third mask layer 107 are removed using a suitable etching process. In some embodiments where the third mask layer 107 comprises silicon nitride, the exposed features 107A of the third mask layer 107 are selectively removed in a wet process using hot phosphoric acid ($H_3PO_4$) as an etchant. Subsequently, the patterned mask layer 113 (see FIGS. 1A and 1B) is removed using a suitable removal process. In some embodiments where the patterned mask layer 113 is formed of a photoresist material, the patterned mask layer 113 may be removed using, for example, an ashing process followed by a wet clean process. In some embodiments, after removing the patterned mask layer 113, a capping layer (not shown) is conformally formed over the second mask layer 105 and the third mask layer 107. The capping layer may comprise silicon nitride and may have a thickness between about 100 Å and about 1000 Å.

Referring further to FIGS. 2A and 2B, after removing the exposed features 107A of the patterned third mask layer 107, the resulting patterned third mask layer 107 comprises the original openings 111 and new openings 201 formed as a result of removing the exposed features 107A of the patterned third mask layer 107. In some embodiments, a width $W_2$ of the openings 201 is greater than a width $W_1$ of the openings 111. For example, in some embodiments where each of the openings 201 are formed by removing two features 107A of the patterned third mask layer 107, the width $W_2$ of the openings 201 approximately equals to a sum of three times the width $W_1$ of the openings 111 and two times a width $W_3$ of the features 107A of the patterned third mask layer 107. The width $W_1$ of the openings 111 may be between about 10 Å and about 200 Å, and the width $W_2$ of the openings 201 may be between about 50 Å and about 1000 Å, and the width $W_3$ of the features 107A of the patterned third mask layer 107 may be between about 100 Å and about 1000 Å.

Figure 3A:
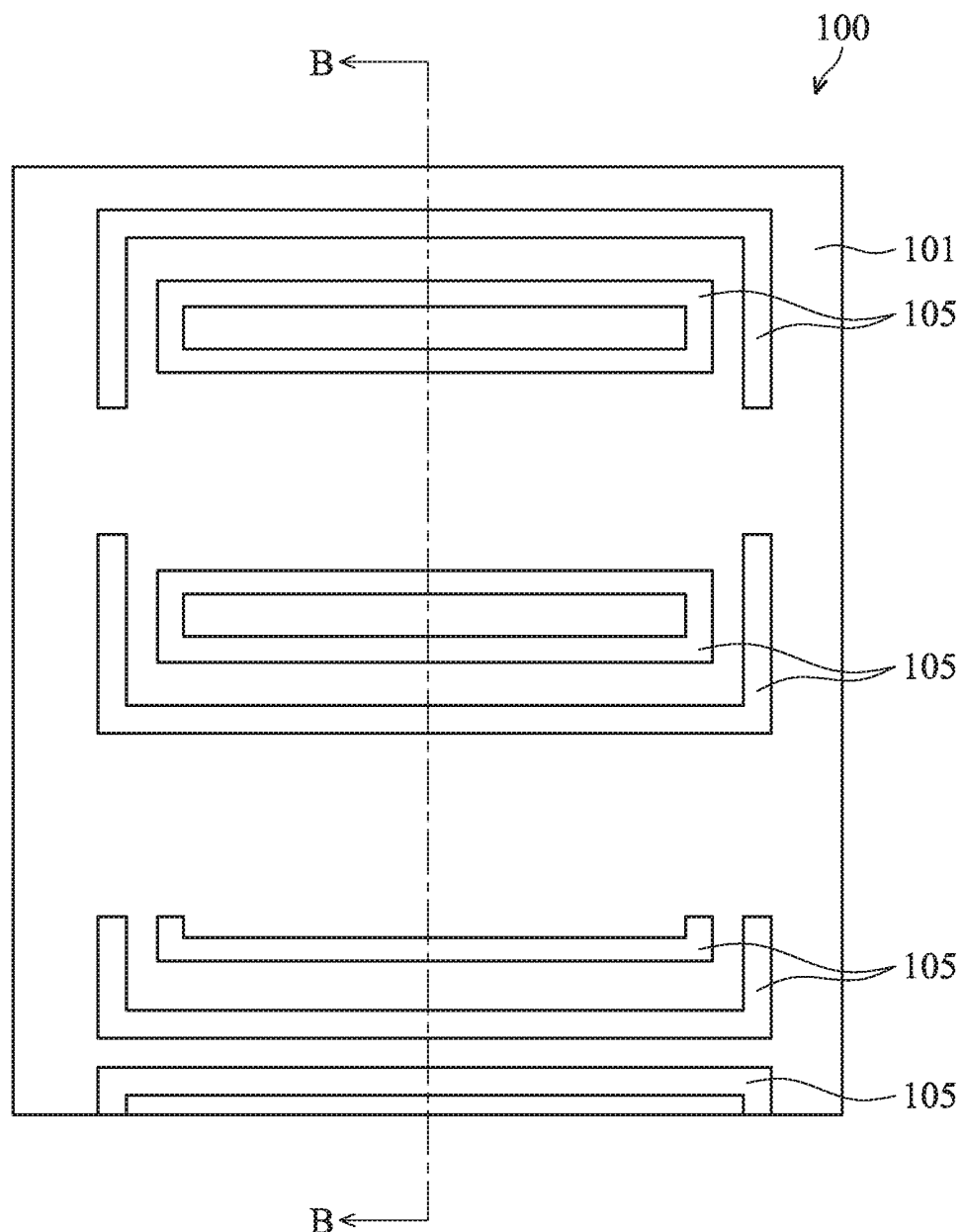
Figure 3B:
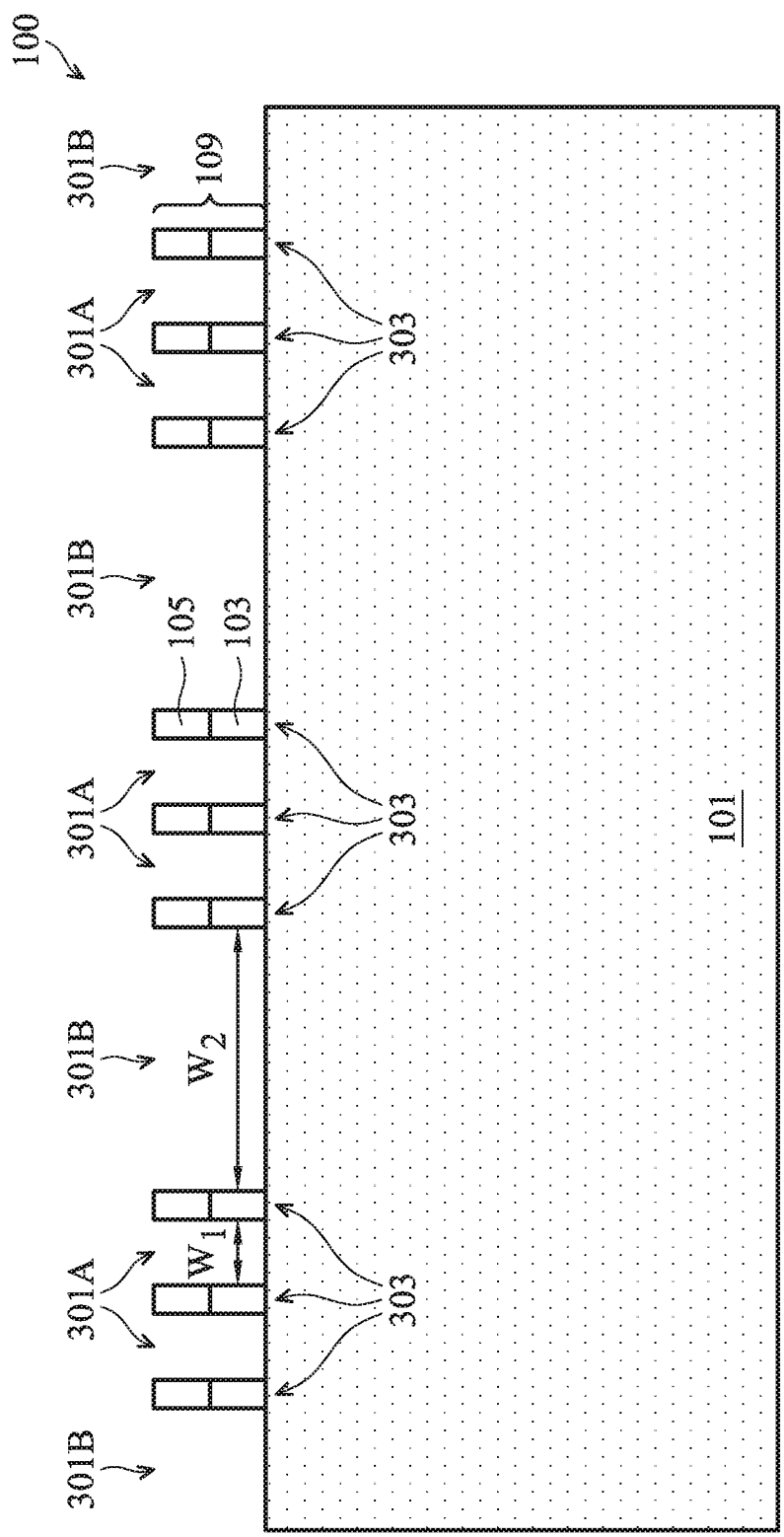

Referring to FIGS. 3A and 3B, the first mask layer 103 and the second mask layer 105 of the mask stack 109 are patterned to form openings 301A and 301B in the mask stack 109 while using the third mask layer 107 (see FIGS. 2A and 2B) as an etch mask. In some embodiments, the first mask layer 103 and the second mask layer 105 of the mask stack 109 are patterned using one or more suitable etch processes. During the patterning process, the third mask layer 107 may be consumed. The openings 301A and 301B expose portions of the substrate 101. The patterns of the openings 301A and 301B, and the pattern of the unremoved portions 303 of the mask stack 109 as illustrated in FIGS. 3A and 3B are provided for illustration only. In other embodiments, the patterns of the openings 301A and 301B, and the pattern of the unremoved portions 303 of the mask stack 109 may be altered according to design requirements of the resulting FinFET. The openings 301A correspond to the openings 111 (see FIGS. 2A and 2B) and may have a width approximately equal to the width $W_1$. The openings 301B correspond to the openings 201 (see FIGS. 2A and 2B) and may have a width approximately equal to the width $W_2$.

Figure 4A:
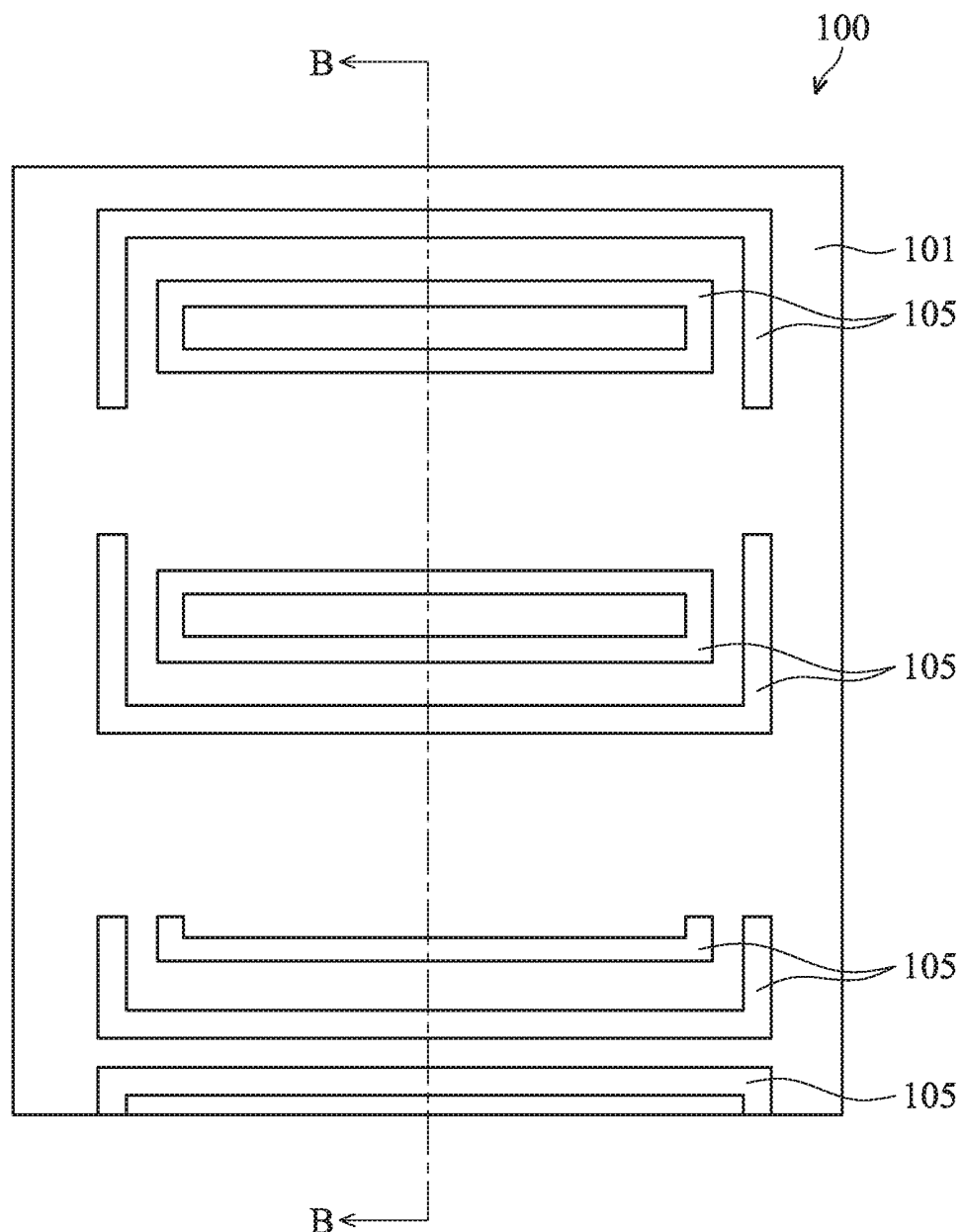
Figure 4B:
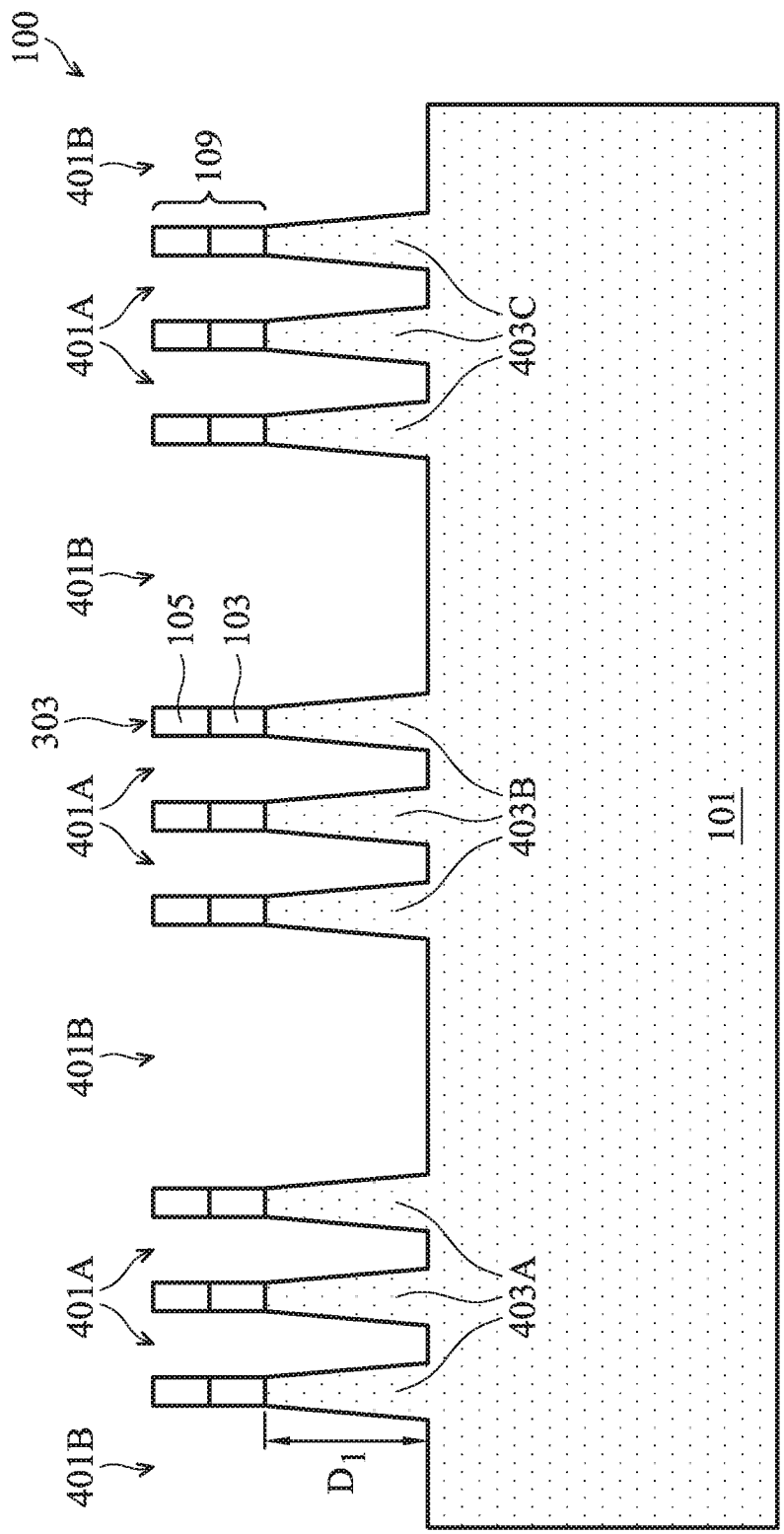

Referring to FIGS. 4A and 4B, the substrate 101 is patterned to form openings 401A and 401B in the substrate 101. The openings 401A correspond to respective openings 301A in the mask stack 109, and the openings 401B correspond to respective openings 301B in the mask stack 109 (see FIGS. 3A and 3B). The openings 401A may have a similar pattern as the openings 301A as viewed from top, and the openings 401B may have a similar pattern as the openings 301B as viewed from top. In some embodiments, a width of the openings 401B may be greater than a width of the openings 401A. A depth $D_1$ of the openings 401A and 401B may be between about 50 Å and about 500 Å. Strips of a semiconductor material of the substrate 101 interposed between adjacent ones of the openings 401A and 401B form fins 403A, 403B and 403C. In some embodiments, adjacent fins 403A are separated by respective openings 401A, adjacent fins 403B are separated by respective openings 401A, and adjacent fins 403C are separated by respective openings 401A. Furthermore, the group of fins 403A is separated from the group of fins 403B by a respective opening 401B, and the group of fins 403B is separated from the group of fins 403C by a respective opening 401B. In some embodiments, the substrate 101 may be patterned by a suitable etch process using the unremoved portions 303 of the mask stack 109 as an etch mask. The suitable etch process may include an anisotropic dry etch process, or the like. In some embodiments where the substrate 101 is formed of silicon, the substrate 101 is patterned by a reactive ion etch (RIE) process with etch process gases including $N_2$, $CH_2F_2$, $CF_4$, $CHF_3$, $CH_3F$, HBr, $NF_3$, Ar, He, $Cl_2$, $CH_3F$, $SiCl_4$, the like, or a combination thereof. The RIE process may be performed at a pressure between about 1 mTorr and about 500 mTorr, a temperature between about 20° C. and 100° C., and a radio frequency (RF) power between about 50 W and about 1000 W.

Figure 5A:
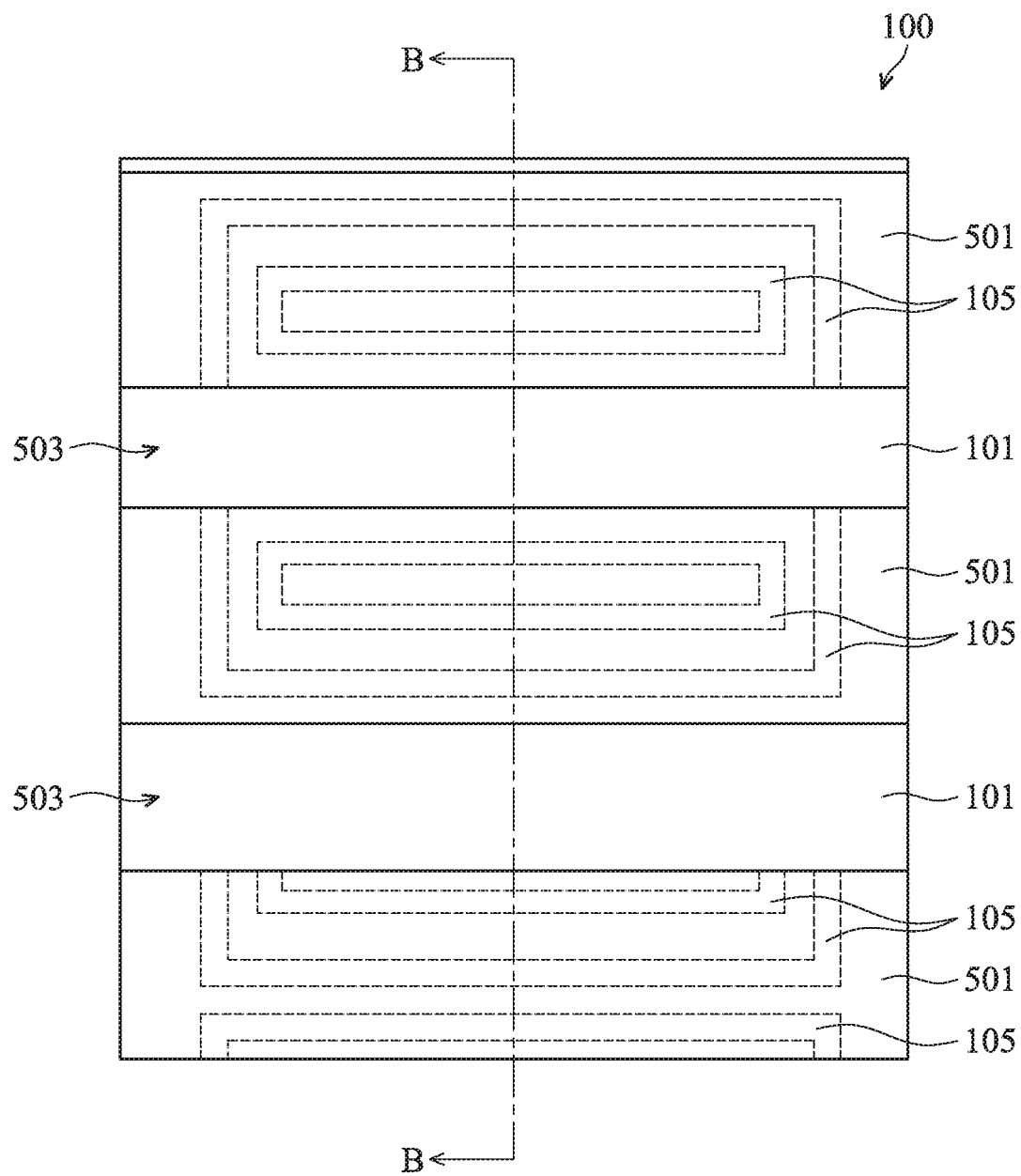
Figure 5B:
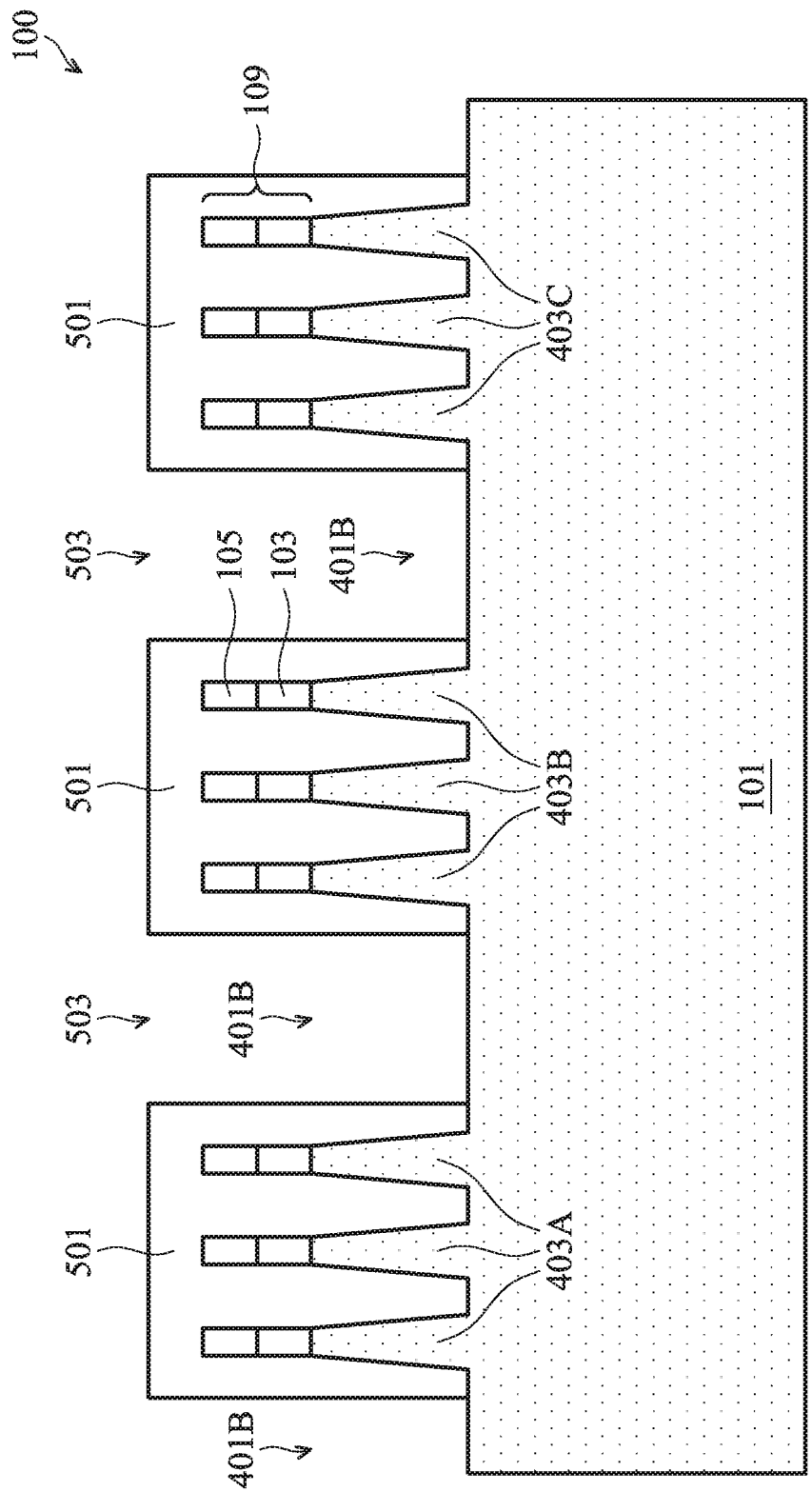

Referring to FIGS. 5A and 5B, a mask layer 501 is formed over the substrate 101 and the fins 403A, 403B and 403C. In some embodiments, the mask layer 501 may be formed using similar materials and methods as the mask layer 113, described above with reference to FIGS. 1A and 1B, and the description is not repeated herein for the sake of brevity. The mask layer 501 is patterned to form openings 503 in the mask layer 501. In some embodiments, the mask layer 501 may be patterned using similar methods as the mask layer 113, described above with reference to FIGS. 1A and 1B, and the description is not repeated herein for the sake of brevity. The openings 503 expose portions of bottoms of the openings 401B. In some embodiments, a width of the openings 503 is less than the width of the openings 401B. In some embodiments, the openings 503 may have elongated portions with lengthwise directions parallel to each other as viewed from top. Furthermore, the lengthwise directions of the openings 503 may be parallel to the lengthwise directions of the openings 111 and 201, and the openings 401A and 401B (see FIGS. 2A-4B).

Figure 6A:
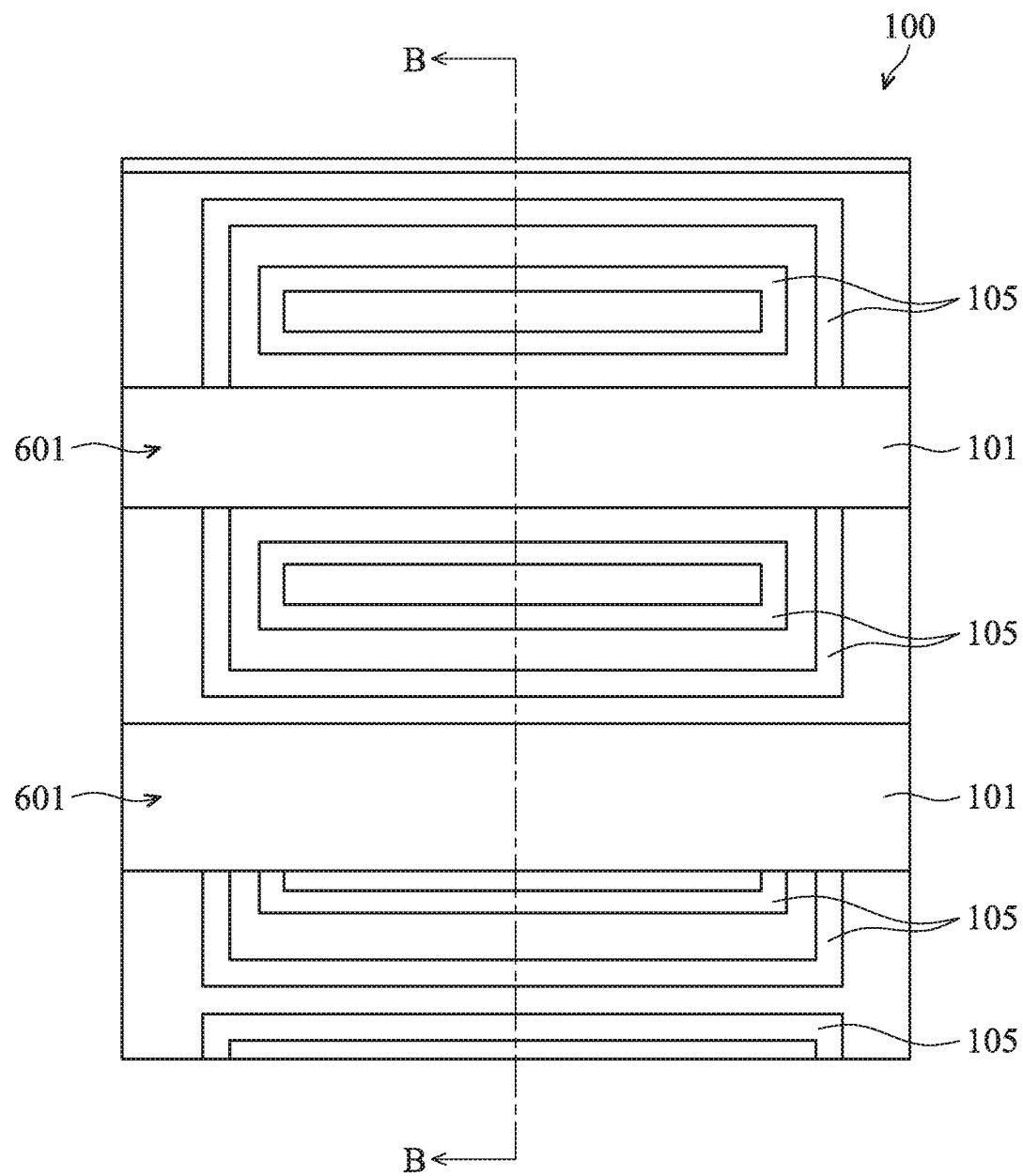
Figure 6B:
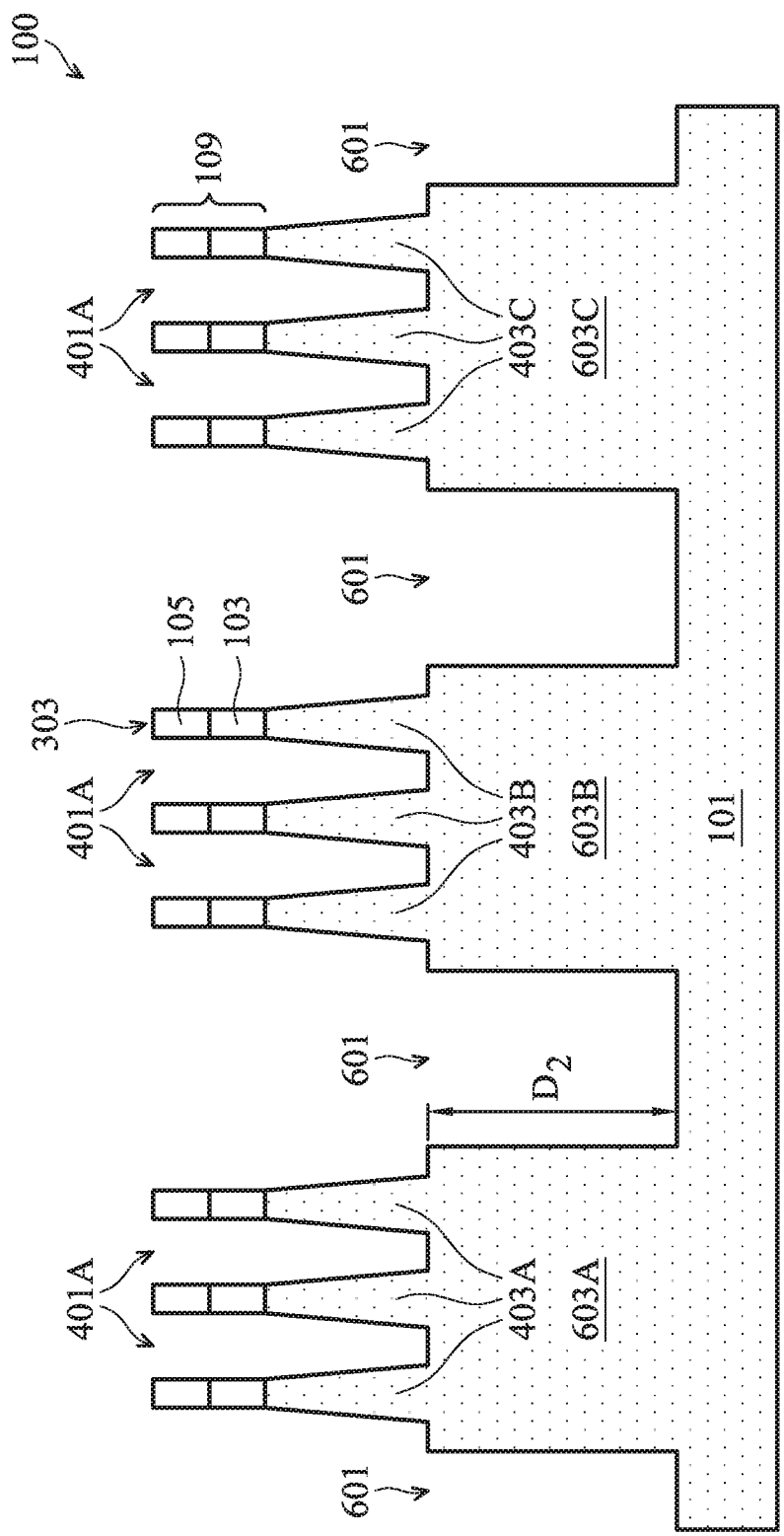

Referring to FIGS. 6A and 6B, the substrate 101 is patterned to form openings 601 in the substrate 101. The openings 601 correspond to respective openings 503 in the mask layer 501 (see FIGS. 5A and 5B). The openings 601 may have a similar pattern as the openings 503 as viewed from top. In some embodiments, a width of the openings 601 may be approximately equal to the width of the openings 503. A depth $D_2$ of the openings 601 may be between about 100 Å and about 1000 Å. Bottoms of the openings 601 are lower than bottoms of the openings 401A. The patterning process further forms bases 603A, 603B, and 603C for fins 403A, 403B, and 403C, respectively. Each of the bases 603A, 603B, and 603C is interposed between respective adjacent openings 601. In the illustrated embodiment, the group of fins 403A with the corresponding base 603A, the group of fins 403B with the corresponding base 603B, and the group of fins 403C with the corresponding base 603C have a shape of a crown. Accordingly, such structures may also be referred to as crown-shaped fin structures. In the illustrated embodiment, each crown-shaped fin structure comprises three fins. Alternatively, each crown-shaped fin structure may comprise less than or more than three fins, depending on the designed drive currents of the resulting FinFETs. In some embodiments, the substrate 101 may be patterned by a suitable etch process using the mask layer 501 (see FIGS. 5A and 5B) as an etch mask. The suitable etch process may include an anisotropic dry etch process, or the like. In some embodiments where the substrate 101 is formed of silicon, the substrate 101 is patterned by a reactive ion etch (RIE) process with etch process gases including $N_2$, $CH_2F_2$, $CF_4$, $CHF_3$, $CH_3F$, HBr, $NF_3$, Ar, He, $Cl_2$, $CH_3F$, $SiCl_4$, the like, or a combination thereof. The RIE process may be performed at a pressure between about 1 mTorr and about 500 mTorr, a temperature between about 20° C. and 150° C., and a radio frequency (RF) power between about 10 W and about 500 W. During the patterning process, the mask layer 501 may be partially or fully consumed. If any residue of the mask layer 501 is left over the substrate 101 and the fins 403A, 403B and 403C after the patterning processes, the residue may also be removed. In some embodiments where the mask layer 501 is formed of a photoresist material, the residue of the mask layer 501 may be removed using, for example, an ashing process followed by a wet clean process.

Referring further to FIGS. 6A and 6B, not all of the fins 403A, 403B and 403C are active fins and are used to form FinFETs. In some embodiments, the fins 403A and 403C are active fins, while the fins 403B are dummy fins and are not used for forming active FinFETs. Accordingly, the fins 403B and the corresponding base 603B may be also referred to as the dummy fins 403B and the dummy base 603B, respectively. As described below in greater detail, the dummy fins 403B and the dummy base 603B are removed. In the illustrated embodiment, two active fin structures (such as the active fins 403A with the corresponding active base 603A, and the active fins 403C with the corresponding active base 603C) and one dummy fin structure (such as the dummy fins 403B with the corresponding dummy base 603B) are shown. In other embodiments, a plurality of active fin structures and a plurality of dummy fin structures may be formed on the substrate 101, such that each dummy fin structure is interposed between respective adjacent active fin structures. In the illustrated embodiment, the active fin structures and the dummy fin structures are portions of the initial substrate 101. In other embodiments, the active fin structures and the dummy fin structures may be formed on the substrate 101 by, for example, epitaxially growing a suitable semiconducting material on the substrate 101.

Figure 7A:
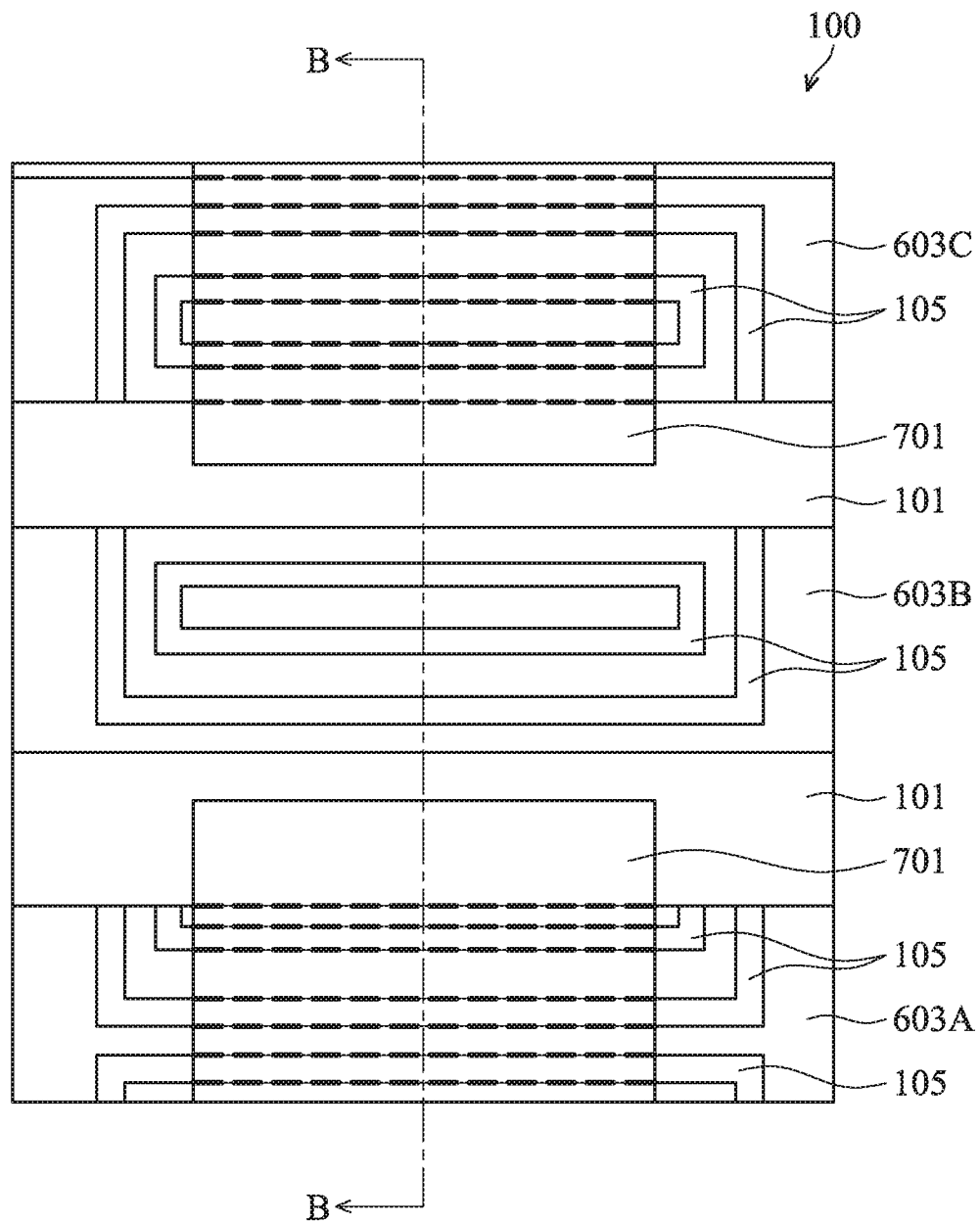
Figure 7B:
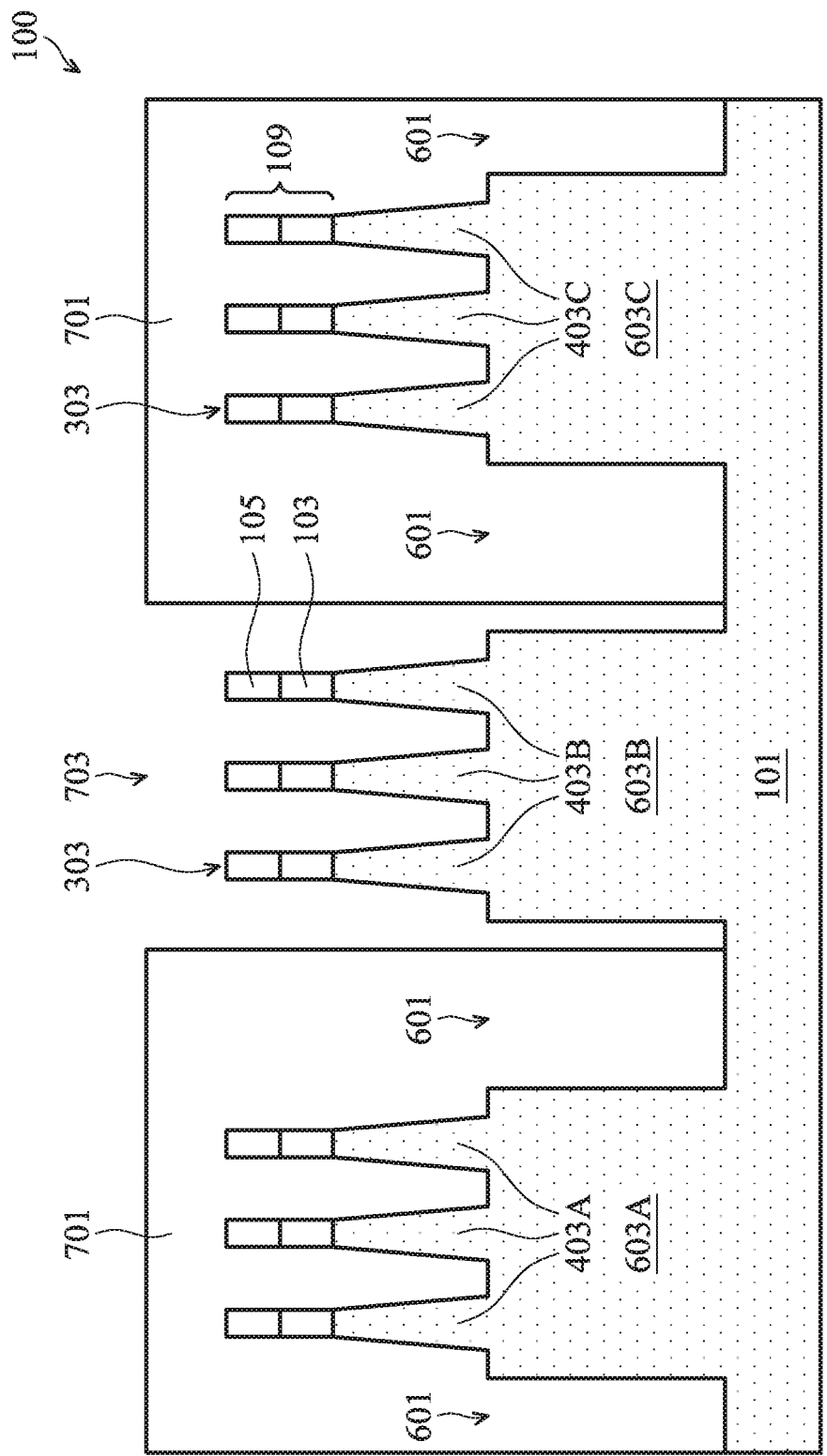

Referring to FIGS. 7A and 7B, a mask layer 701 is formed over the substrate 101 and the fins 403A, 403B and 403C. In some embodiments, the mask layer 701 may be formed using similar materials and methods as the mask layer 113, described above with reference to FIGS. 1A and 1B, and the description is not repeated herein for the sake of brevity. The mask layer 701 is patterned to form openings 703 in the mask layer 701. In some embodiments, the mask layer 701 may be patterned using similar methods as the mask layer 113, described above with reference to FIGS. 1A and 1B, and the description is not repeated herein for the sake of brevity. The openings 703 expose respective dummy fin structures, such as the dummy fins 403B and the corresponding dummy base 603B. In some embodiments, a width of the openings 703 may be approximately equal to or greater than a width of the dummy base 603B.

Figure 8A:
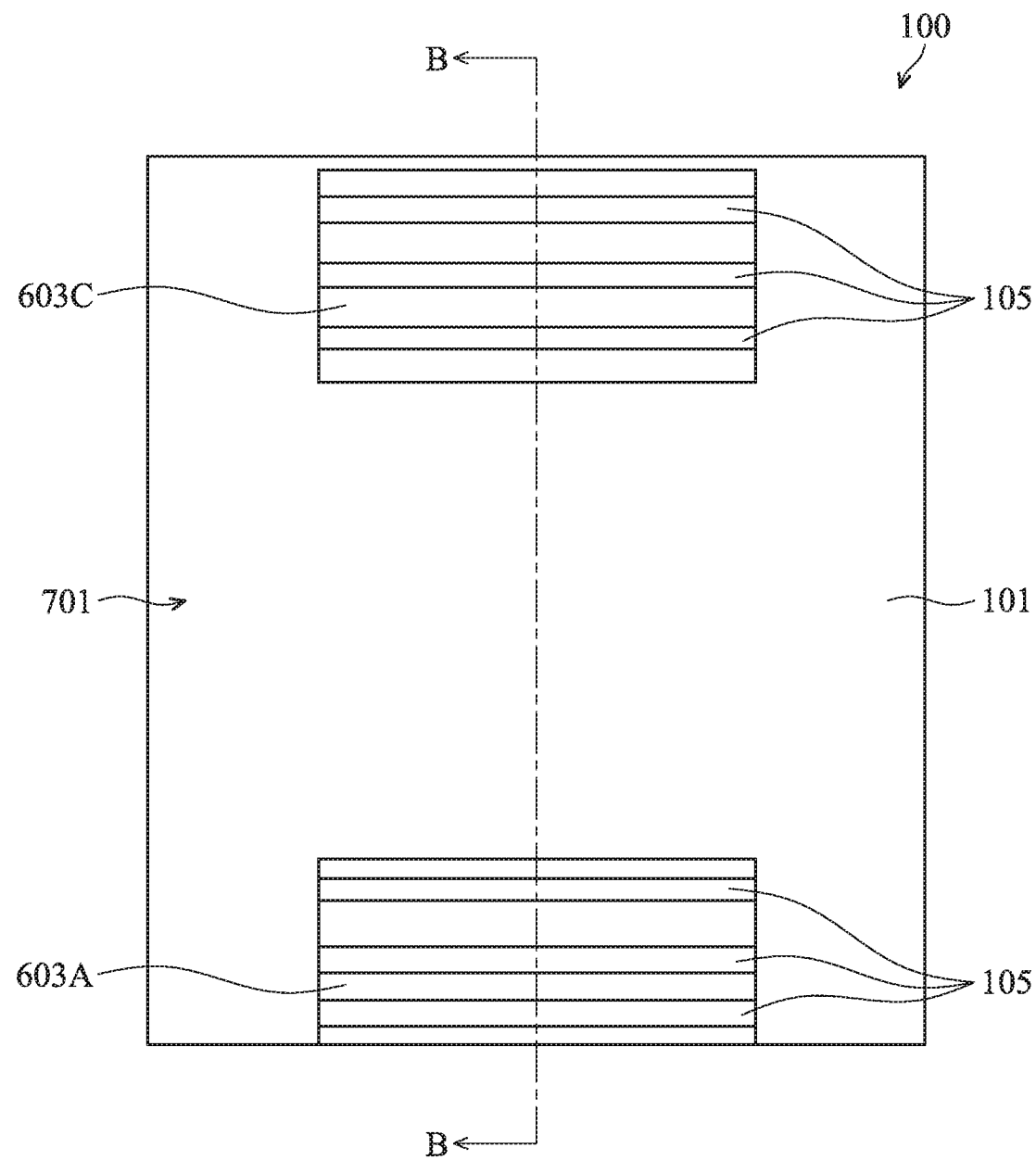
Figure 8B:
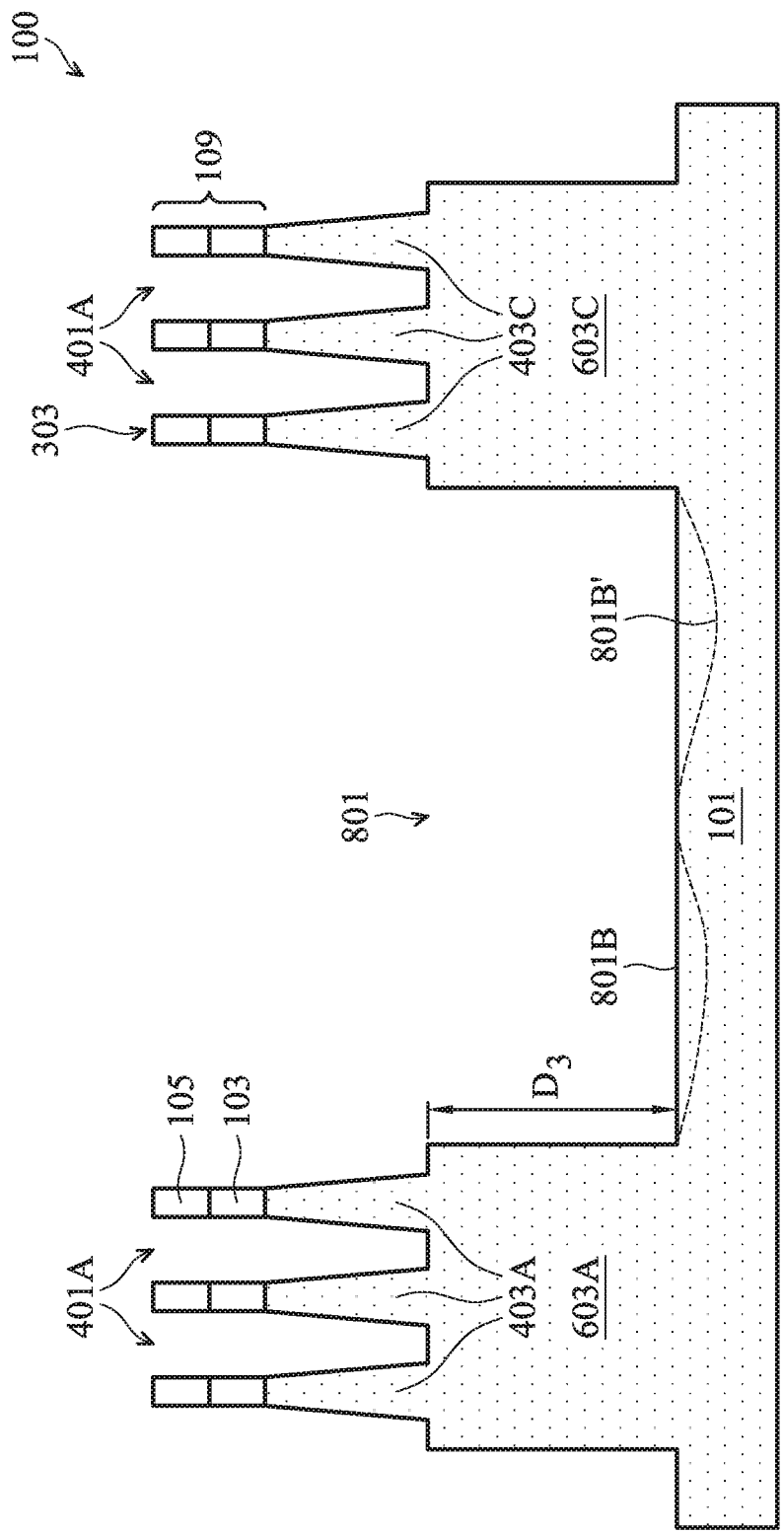

Referring to FIGS. 8A and 8B, the dummy fin structures, such as the dummy fins 403B and the corresponding dummy base 603B, are removed to form openings 801 separating active fin structures, such as the active fins 403A with the corresponding active base 603A and the active fins 403C with the corresponding active base 603C. Furthermore, end portions of the active fins, such as the active fins 403A and the active fins 403C, are removed. In some embodiments, the dummy fin structures, such as the dummy fins 403B and the corresponding dummy base 603B, may be removed by a main etch process using the mask layer 701 (see FIGS. 7A and 7B) as an etch mask. The main etch process may include a suitable etch process, such as an anisotropic dry etch process, or the like. In some embodiments where the substrate 101 is formed of silicon, the main etch process includes a reactive ion etch (RIE) process with etch process gases including $N_2$, $CH_2F_2$, $CF_4$, $CHF_3$, $CH_3F$, HBr, $NF_3$, Ar, He, $Cl_2$, $CH_3F$, $SiCl_4$, the like, or a combination thereof. The RIE process may be performed at a pressure between about 3 mTorr and about 30 mTorr, a temperature between about 15° C. and 70° C., and a radio frequency (RF) power less than about 1500 W.

During the main etch process, the unremoved portions 303 of the mask stack 109 over the dummy fins, such as the dummy fins 403B, are exposed to etchants during a certain time and are etched to expose the underlying dummy fins (see FIGS. 7A and 7B). The exposed dummy fins, such as the dummy fins 403B, are then etched and corresponding dummy bases, such as the dummy base 603B, are exposed. The dummy bases, such as the dummy base 603B, are then etched until the dummy bases are fully removed. In some embodiments, the main etch process is performed for an etch time $t_{etch}$ to fully remove the dummy fin structures, such as the dummy fins 403B and the dummy base 603B. In some embodiments, the etch time $t_{etch}$ may be between about 5 sec and about 200 sec.

In some embodiments, after the full removal of the dummy fin structures, such as the dummy fins 403B and the corresponding dummy base 603B, an over-etch process may be performed on the underlying substrate 101 for an over-etch time $t_{over-etch}$. In some embodiments, the over-etch time $t_{over-etch}$ may be between about 1 sec and about 20 sec, and an over-etch ratio $t_{over-etch}/t_{etch}$ may be between about 0.1 and about 1.5. Depending on the main etch and over etch process recipes and the over-etch ratio, bottoms of the openings 801 may have different structures and shapes. In some embodiments, the bottom surfaces 801B may be planar surfaces. In other embodiments, two, three, or more divots and protrusions may be formed at the bottoms of the opening 801 such that the bottom surfaces 801B' are non-planar surfaces. In such embodiments, the protrusions may be generated directly underlying and vertically aligned to the removed dummy fins, such as the dummy fins 403B (see FIGS. 7A and 7B), with the number of protrusions equal to the number of the dummy fins. Alternatively, the divots are generated directly underlying and vertically aligned to the removed dummy fins, such as the dummy fins 403B, with the number of divots equal to the number of the dummy fins. In yet other embodiments, the number of divots and/or the number of protrusions may be different from the number of the removed dummy fins, such as the dummy fins 403B. In some embodiments, the main etch process and the over-etch process may be performed using different mixtures of etch process gases, different temperatures, different pressures, different RF powers, different bias voltages, and/or different etch times to obtain desired structures of the bottoms of the opening 801. For example, the main etch process may be performed using a mixture of process gases including $CF_4$, $SF_6$, $NF_3$, $N_2$, $Cl_2$, the like, or a combination thereof, and the over-etch process may be performed using a mixture of process gases including $O_2$, HBr, $H_2$, $N_2$, the like, or a combination thereof.

During performing the main etch and over-etch processes, the mask layer 701 (see FIGS. 7A and 8B) may be partially consumed. The remaining mask layer 701 may be then removed. In some embodiments where the mask layer 701 is formed of a photoresist material, the remaining mask layer 701 may be removed using, for example, an ashing process followed by a wet clean process. After completing the main etch and over-etch processes, the openings 801 may have a depth $D_3$ between about 10 nm and about 200 nm. In some embodiments, the depth $D_3$ of the openings 801 may be greater than the depth $D_2$ of the openings 601 (see FIGS. 6A and 6B). In other embodiments, the depth $D_3$ of the openings 801 may approximately equal to the depth $D_2$ of the openings 601.

Figure 9A:
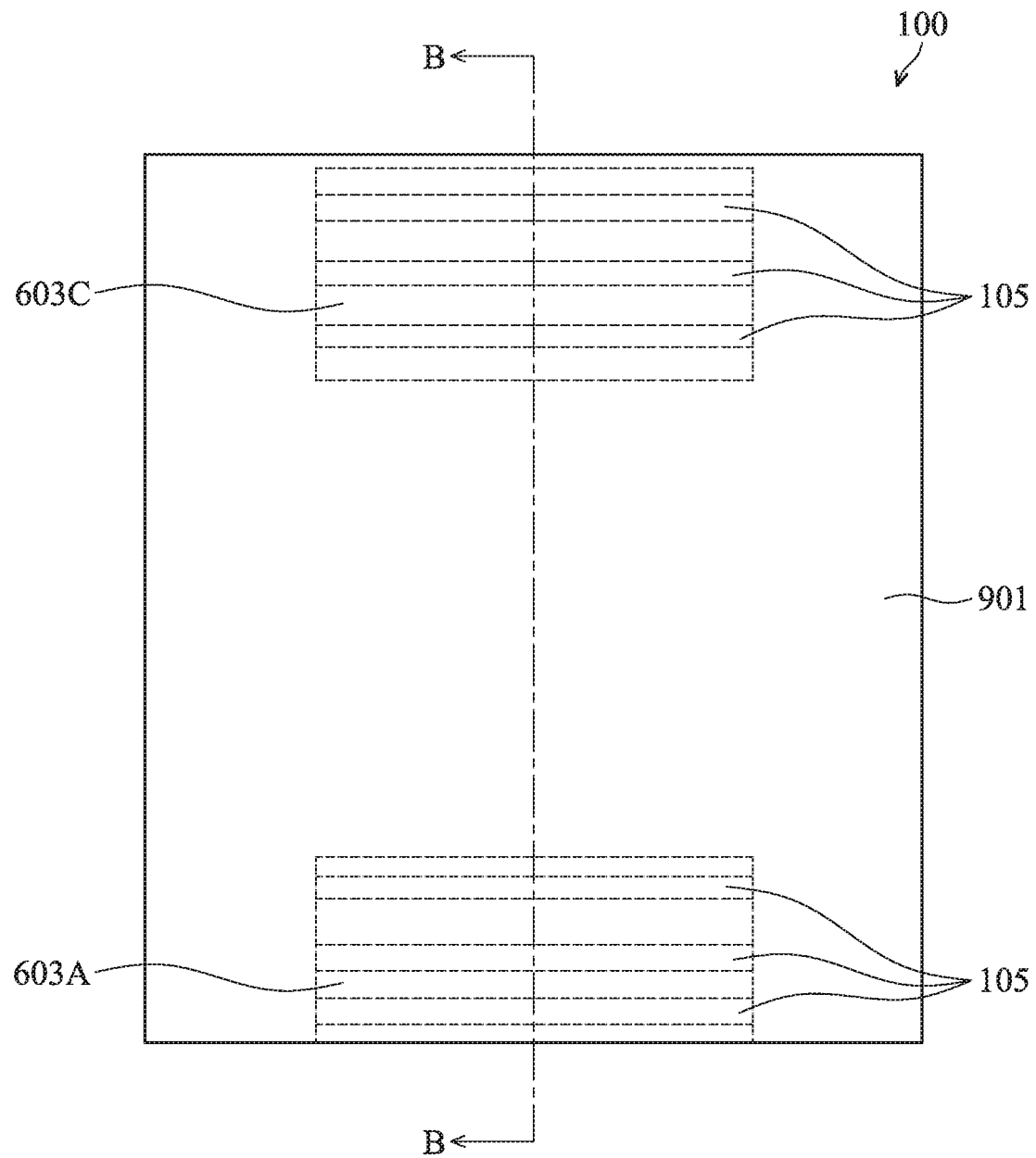
Figure 9B:
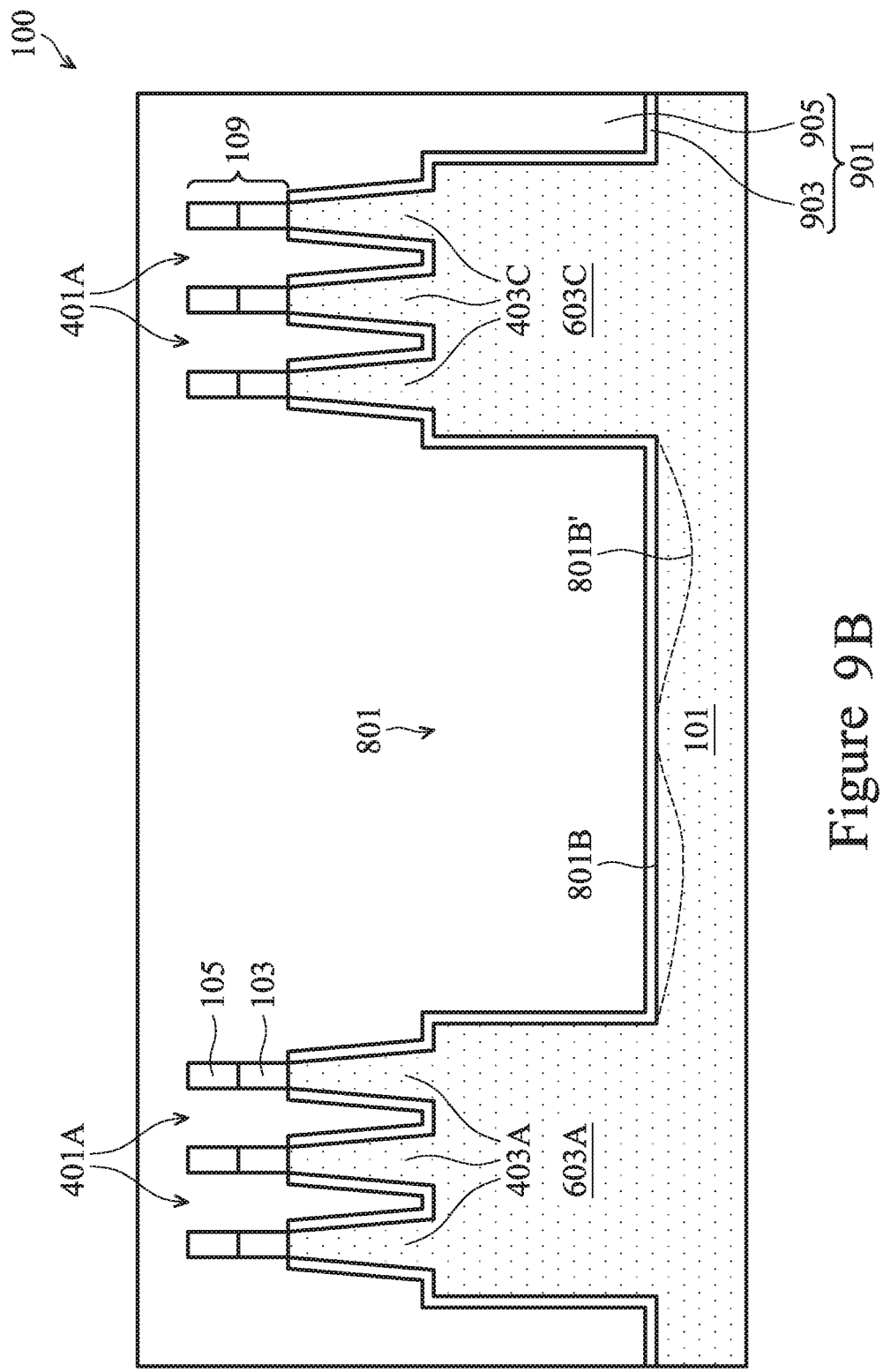

Referring to FIGS. 9A and 9B, a dielectric material 901 is formed over the substrate 101 to fill the openings 401A and 801 (see FIGS. 8A and 8B). In some embodiments, the dielectric material 901 includes a liner oxide 903, and a dielectric material 905 over the liner oxide 903. The liner oxide 903 may be formed as a conformal layer, whose horizontal portions and vertical portions have thicknesses close to each other. In some embodiments, the thickness of the liner oxide 903 may be between about 5 Å and about 100 Å.

In some embodiments, the liner oxide 903 is formed by oxidizing exposed surfaces of the substrate 101, the active fins 403A and 403C, and the active bases 603A and 603C in an oxygen-containing environment, for example, through Local Oxidation of Silicon (LOCOS), wherein oxygen ($O_2$) may be included in the respective process gas. In other embodiments, the liner oxide 903 may be formed using, for example, In-Situ Steam Generation (ISSG) with water steam or a combined gas of hydrogen ($H_2$) and oxygen ($O_2$) used to oxidize the exposed surfaces of the substrate 101, the active fins 403A and 403C, and the active bases 603A and 603C. The ISSG oxidation may be performed at an elevated temperature. In yet other embodiments, the liner oxide 903 is formed using a deposition technique, such as ALD, CVD, Sub Atmospheric Chemical Vapor Deposition (SACVD), or the like, or a combination thereof.

The dielectric material 905 is then formed to fill the remaining portions of the openings 401A and 801 (see FIGS. 8A and 8B). The dielectric material 905 may overfill the openings 401A and 801, such that a portion of the dielectric material 905 extends above a top surface of the patterned mask stack 109. In some embodiments, the dielectric material 905 may comprise silicon oxide, silicon carbide, silicon nitride, the like, or a combination thereof, and may be formed using Flowable Chemical Vapor Deposition (FCVD), spin-on coating, CVD, ALD, High-Density Plasma Chemical Vapor Deposition (HDPCVD), LPCVD, the like, or a combination thereof. In some embodiments where FCVD is used to form the dielectric material 905, a silicon- and nitrogen-containing precursor (for example, trisilylamine (TSA) or disilylamine (DSA)) is used, and hence the resulting dielectric material 905 is flowable (jelly-like). In other embodiments, the flowable dielectric material 905 is formed using an alkylamino silane based precursor. During the deposition of the dielectric material 905, plasma is turned on to activate the gaseous precursors for forming the flowable oxide. After dielectric material 905 is deposited, an anneal/curing step is performed, which converts flowable dielectric material 905 into a solid dielectric material.

Figure 10A:
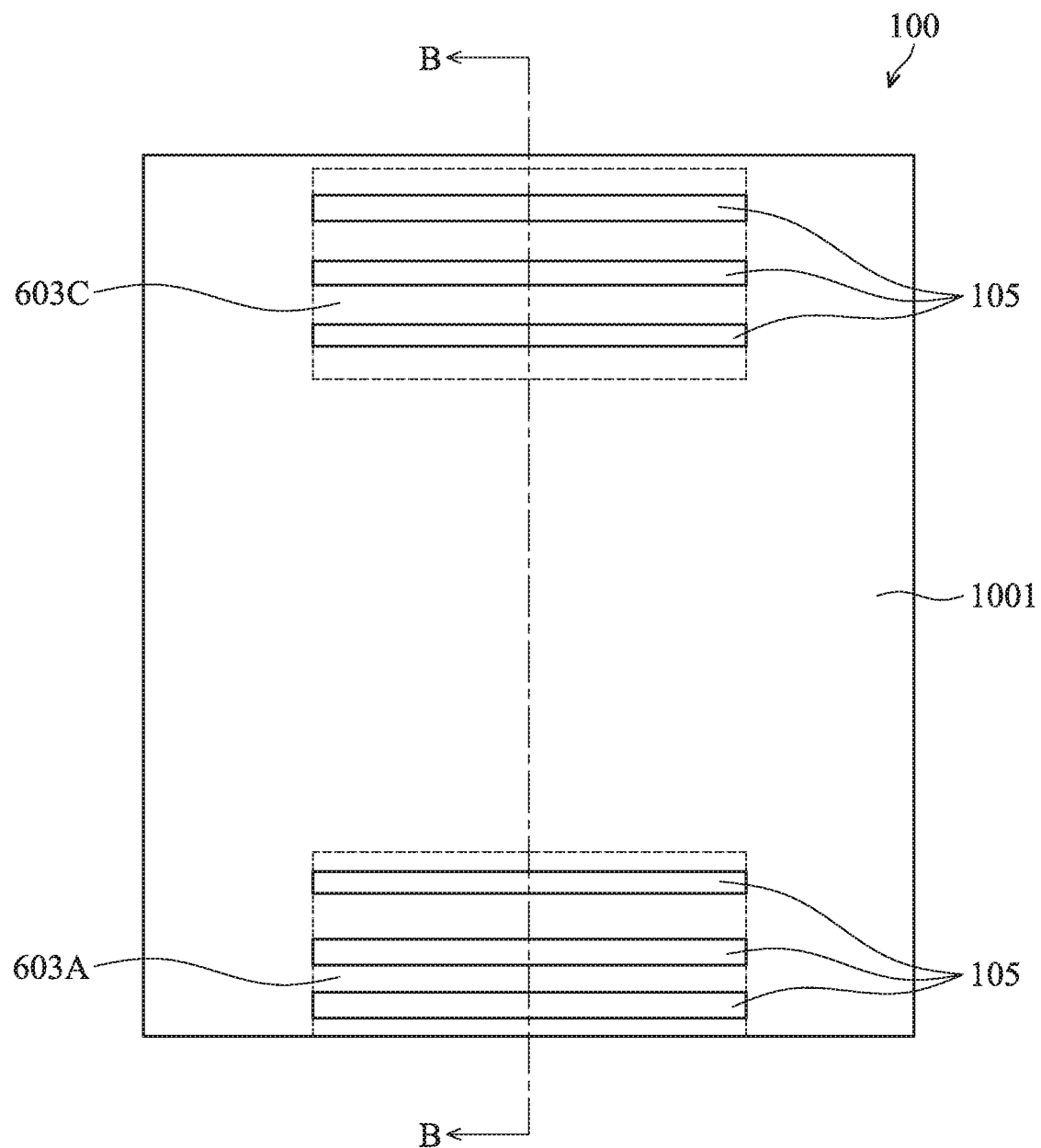
Figure 10B:
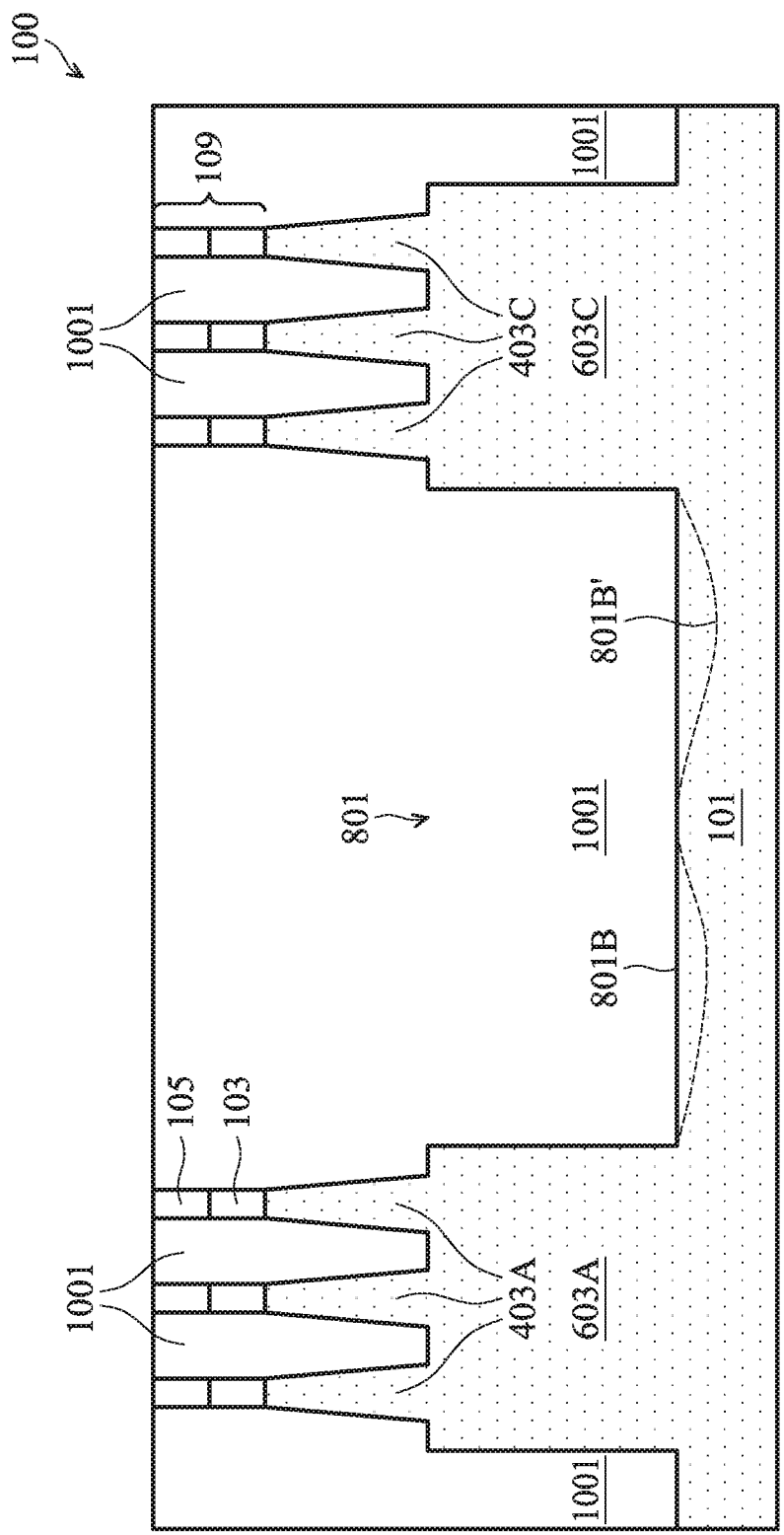

Referring to FIGS. 10A and 10B, the portions of the dielectric material 901 (see FIGS. 9A and 9B) extending over the top surface of the patterned mask stack 109 is removed. The remaining portions of the dielectric material 901 form isolation regions that may be also referred to as shallow trench isolation (STI) regions 1001. In some embodiments, a chemical mechanical polishing (CMP) is performed to remove the portions of the dielectric material 901 extending over the top surface of the patterned mask stack 109. In such embodiments, the mask stack 109 may be used as a CMP stop layer, and hence the top surface of the mask stack 109 is substantially coplanar with the top surfaces of the STI regions 1001. In other embodiments, the portions of the dielectric material 901 extending over the top surface of the patterned mask stack 109 may be removed using grinding, etching, the like, or a combination thereof. In FIGS. 10A and 10B, and in subsequent FIGS. 11A-19C, the liner oxide 903 and the dielectric material 905 (see FIGS. 9A and 9B) may not be shown separately, although they still exist. An interface between the liner oxide 903 and the dielectric material 905 may be distinguishable due to different material properties such as different types of materials and/or different densities, or may not be distinguishable.

Figure 11A:
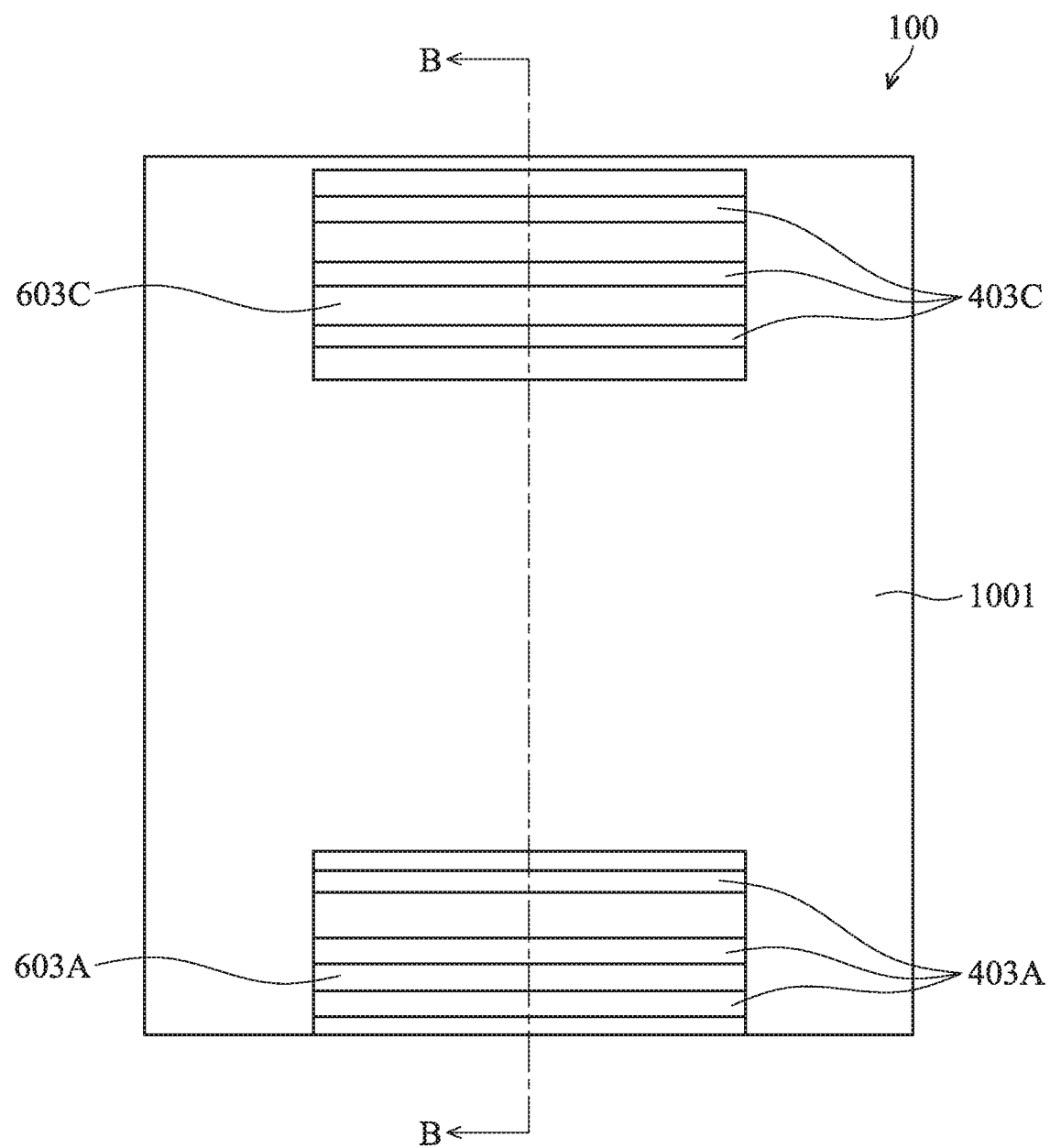
Figure 11B:
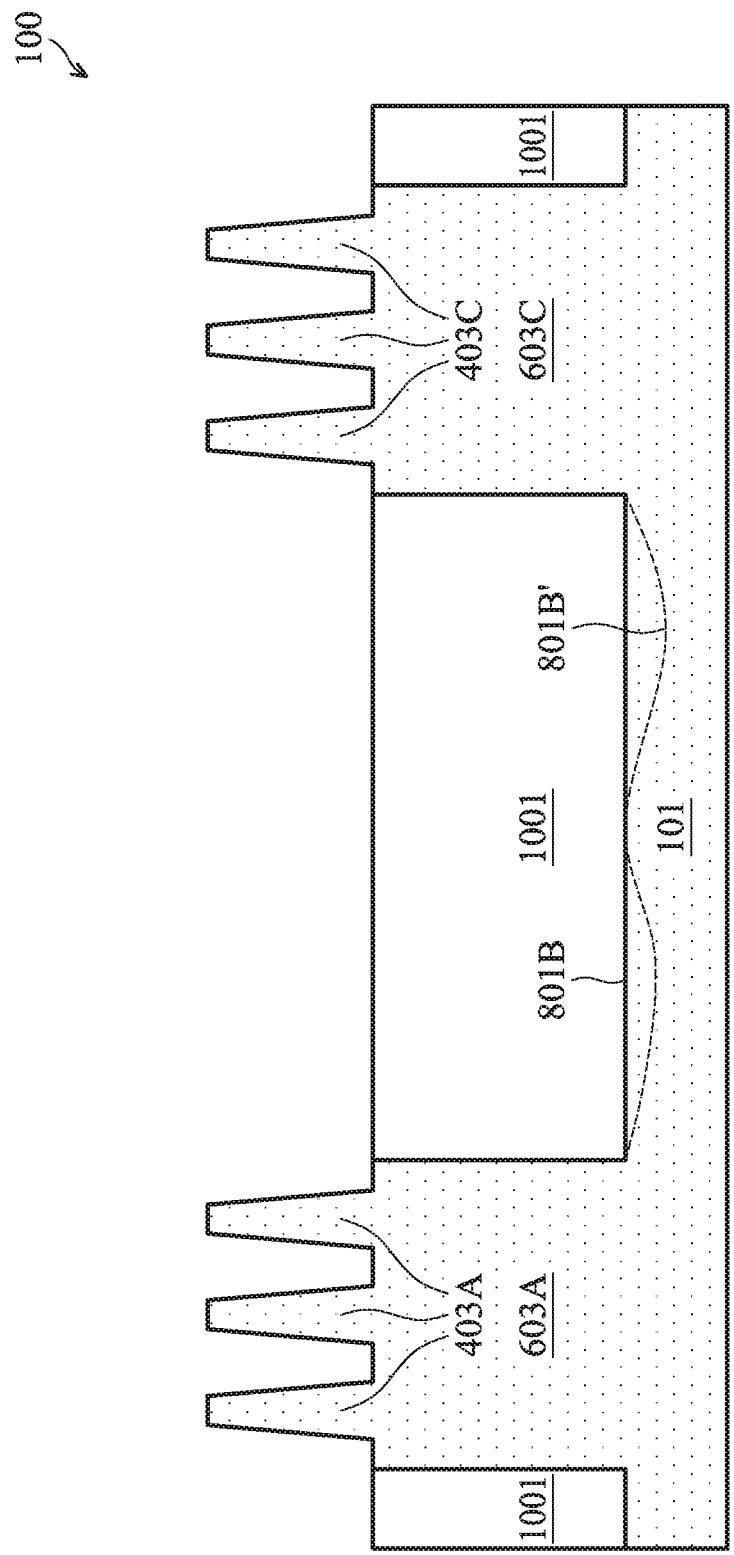

Referring to FIGS. 11A and 11B, the patterned mask stack 109 (see FIGS. 10A and 10B) is removed. In some embodiments where the first mask layer 103 comprises silicon nitride and the second mask layer 105 comprises silicon oxide, the second mask layer 105 may be removed in a wet process using buffered hydrofluoric acid (BHF) as an etchant, and the first mask layer 103 may be removed in a wet process using hot phosphoric acid ($H_3PO_4$) as an etchant. Subsequently, the STI regions 1001 are recessed to expose the active fins 403A and 403C. The STI regions 1001 may be recessed using an isotropic or anisotropic etching process, which may be a dry etch process or a wet etch process. In some embodiments, the STI regions 1001 are recessed using a dry etch method, in which the process gases including $NH_3$ and $NF_3$ are used. In other embodiments, the STI regions 1001 are recessed using a wet etch method, in which the etchant solution is a dilute HF solution, which may have an HF concentration lower than about 1 percent. In some embodiments wherein both the second mask layer 105 and the STI regions 1001 are formed of silicon oxide, a same etching process may remove the second mask layer 105 and recess the STI regions 1001.

After recessing the STI regions 1001, the active fins 403A and 403C protrude over the top surfaces of STI regions 1001. In some embodiments, the portions of STI regions 1001 directly over the active bases 603A and 603C are fully removed, and the top surfaces of remaining STI regions 1001 are substantially coplanar with, or slightly lower than, top surfaces of the active bases 603A and 603C. In other embodiments, the portions of STI regions 1001 directly over the active bases 603A and 603C are partially removed, and the top surfaces of remaining STI regions 1001 are higher than the top surfaces of the active bases 603A and 603C.

Figure 12A:
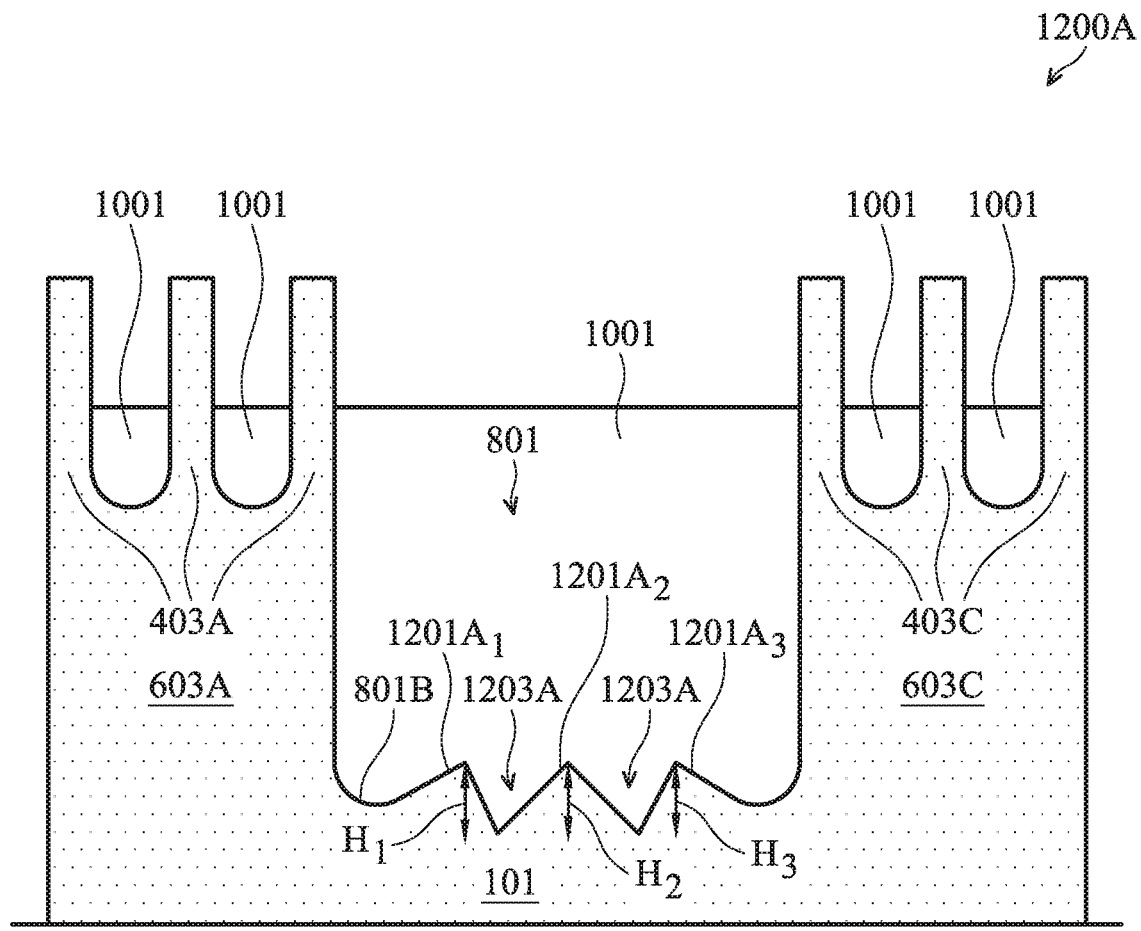
FIGS. 12A-12E illustrate cross-sectional views of fin structures in accordance with some embodiments.

FIGS. 12A-12E illustrate cross-sectional views of fin structures 1200A-1200E, respectively, in accordance with some embodiments. FIGS. 12A-12E illustrate embodiments wherein the number of protrusions in the bottom of the openings 801 is equal to the number of removed dummy fins. FIG. 12A illustrates a cross-sectional view of a fin structure 1200A in accordance with some embodiments. The fin structure 1200A may be formed using similar method as the fin structure illustrated in FIGS. 11A and 11B, described above with reference to FIGS. 1A-11B, and the description is not repeated herein for the sake of brevity. Like features of the fin structure 1200A and the fin structure of FIGS. 11A and 11B are labeled by like numerical references. The fin structure 1200A comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises three protrusions $1201A_1$, $1201A_2$ and $1201A_3$ (collectively referred to as protrusions 1201A) separated by divots 1203A, such that the number of protrusions 1201A is equal to the number of removed dummy fins 403B (see FIGS. 7A and 7B). In the illustrated embodiment, bottommost surfaces of the divots 1203A are portions of the bottom surface 801B of the opening 801 that are disposed farthest from the top surfaces of the STI regions 1001. The protrusions 1201A may be vertically aligned to the removed dummy fins 403B. In some embodiments, the number of the protrusions 1201A may be altered by altering the number of the removed dummy fins 403B. In the illustrated embodiment, a height $H_1$ of the protrusion $1201A_1$ and a height $H_3$ of the protrusion $1201A_3$ are substantially equal, while a height $H_2$ of the protrusion $1201A_2$ is less than the height $H_1$ of the protrusion $1201A_1$ and the height $H_3$ of the protrusion $1201A_3$. The height $H_1$ may be between about 10 nm and about 200 nm, the height $H_2$ may be between about 10 nm and about 150 nm, and a difference between the height $H_1$ and the height $H_2$ may be between about 1 nm and about 200 nm. In other embodiments, the heights $H_1$, $H_2$, and $H_3$ may be substantially equal or may be different from each other depending on the etching process recipes of the main etch process and the over-etch process, and on the over-etch ratio. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ is tuned to be between about 0.1 and about 0.35.

Figure 12B:
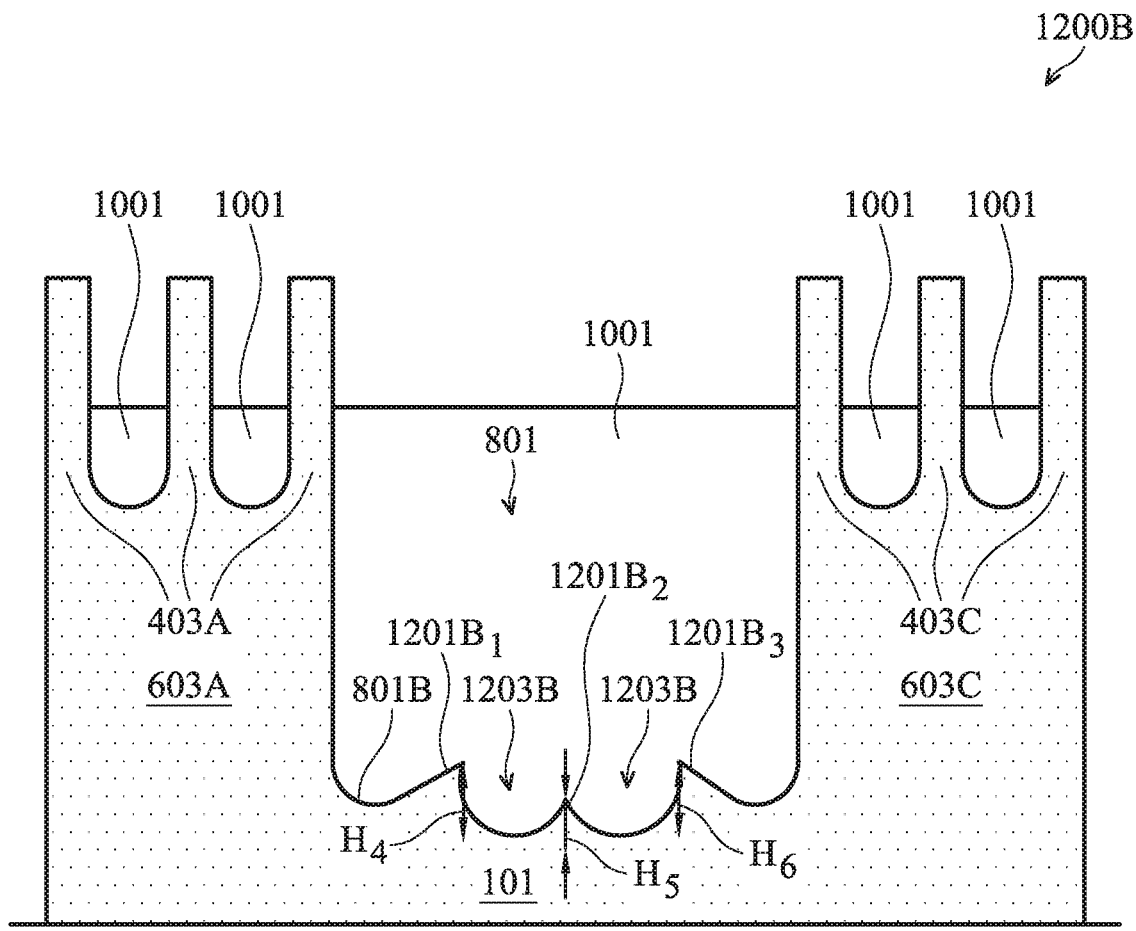

FIG. 12B illustrates a cross-sectional view of a fin structure 1200B in accordance with some embodiments. The fin structure 1200B may be formed using similar method as the fin structure illustrated in FIGS. 11A and 11B, described above with reference to FIGS. 1A-11B, and the description is not repeated herein for the sake of brevity. Like features of the fin structure 1200B and the fin structure of FIGS. 11A and 11B are labeled by like numerical references. The fin structure 1200B comprises a substrate 101, active fins 403A and 403C, corresponding active bases 603A and 603C, and STI regions 1001 in the openings 401A and 801 (see FIGS.

9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises three protrusions $1201B_1$, $1201B_2$ and $1201B_3$ (collectively referred to as protrusions 1201B) separated by divots 1203B, such that the number of the protrusions 1201B is equal to the number of the removed dummy fins 403B (see FIGS. 7A and 7B). In the illustrated embodiment, bottommost surfaces of the divots 1203B are portions of the bottom surface 801B of the opening 801 that are disposed farthest from the top surfaces of the STI regions 1001. The protrusions 1201B may be vertically aligned to the removed dummy fins 403B. In some embodiments, the number of the protrusions 1201B may be altered by altering the number of the removed dummy fins 403B. In illustrated embodiment, a height $H_4$ of the protrusion $1201B_1$ and a height $H_6$ of the protrusion $1201B_3$ are substantially equal, while a height $H_5$ of the protrusion $1201B_2$ is less than the height $H_4$ of the protrusion $1201B_1$ and the height $H_6$ of the protrusion $1201B_3$. The height $H_4$ may be between about 10 nm and about 250 nm, the height $H_5$ may be between about 1 nm and about 200 nm, and a difference between the height $H_4$ and the height $H_5$ may be between about 10 nm and about 50 nm. In other embodiments, the heights $H_4$, $H_5$, and $H_6$ may be substantially equal or may be different from each other depending on the etching process recipe of the main etch process and the over-etch process, and on the over-etch ratio. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.4 and about 0.8.

Figure 12C:
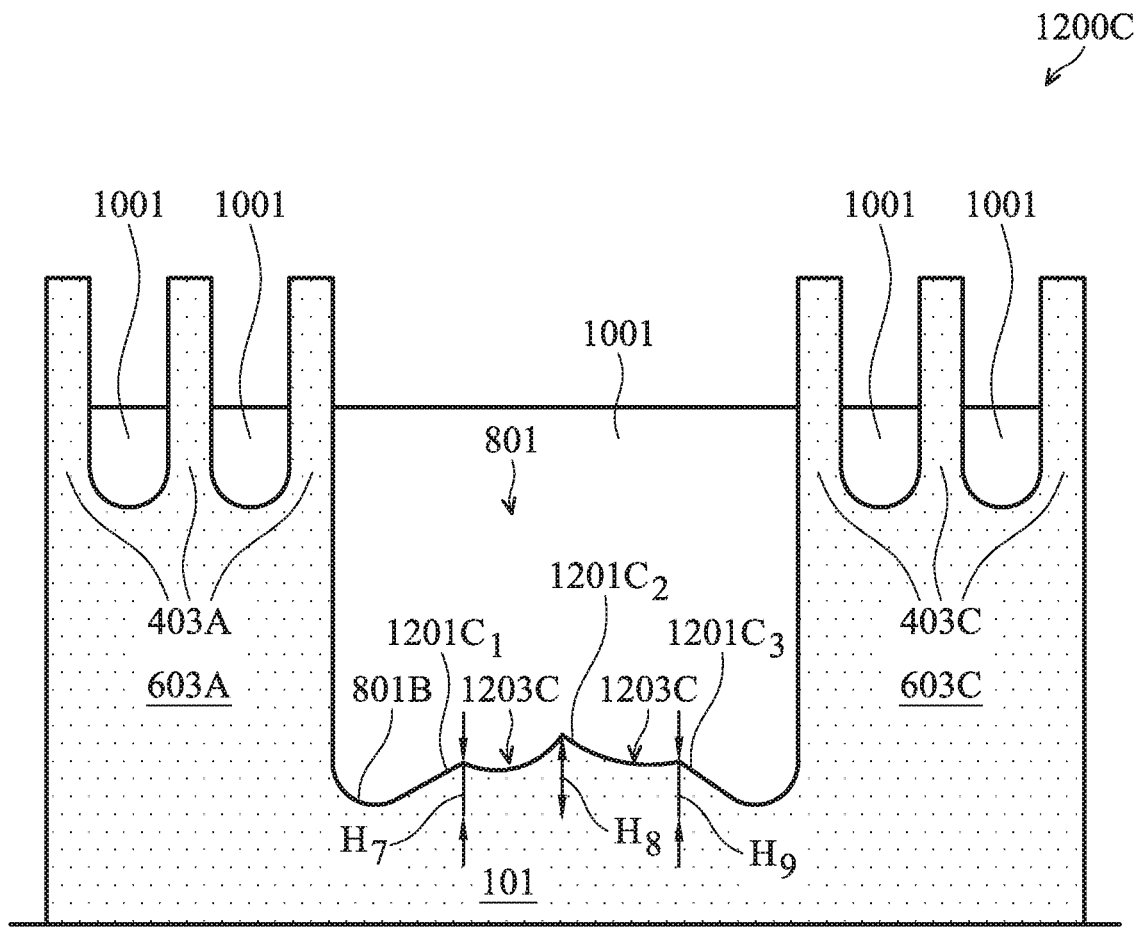

FIG. 12C illustrates a cross-sectional view of a fin structure 1200C in accordance with some embodiments. The fin structure 1200C may be formed using similar method as the fin structure illustrated in FIGS. 11A and 11B, described above with reference to FIGS. 1A-11B, and the description is not repeated herein for the sake of brevity. Like features of the fin structure 1200C and the fin structure of FIGS. 11A and 11B are labeled by like numerical references. The fin structure 1200C comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises three protrusions $1201C_1$, $1201C_2$ and $1201C_3$ (collectively referred to as protrusions 1201C) separated by divots 1203C, such that the number of the protrusions 1201C is equal to the number of the removed dummy fins 403B (see FIGS. 7A and 7B). In the illustrated embodiment, bottommost surfaces of the divots 1203C are higher than portions of the bottom surface 801B of the opening 801 that are disposed farthest from the top surfaces of the STI regions 1001. The protrusions 1201C may be vertically aligned to the removed dummy fins 403B. In some embodiments, the number of the protrusions 1201C may be altered by altering the number of the removed dummy fins 403B. In illustrated embodiment, a height $H_7$ of the protrusion $1201C_1$ and a height $H_9$ of the protrusion $1201C_3$ are substantially equal, while a height $H_8$ of the protrusion $1201C_2$ is greater than the height $H_7$ of the protrusion $1201C_1$ and the height $H_9$ of the protrusion $1201C_3$. The height $H_7$ may be between about 5 nm and about 100 nm, the height $H_8$ may be between about 5 nm and about 80 nm, and the height $H_9$ may be between about 5 nm and about 200 nm. In other embodiments, the heights $H_7$, $H_8$, and $H_9$ may be substantially equal or may be different from each other depending on the etching process recipe of the main etch process and the over-etch process, and on the over-etch ratio. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.5 and about 0.7.

Figure 12D:
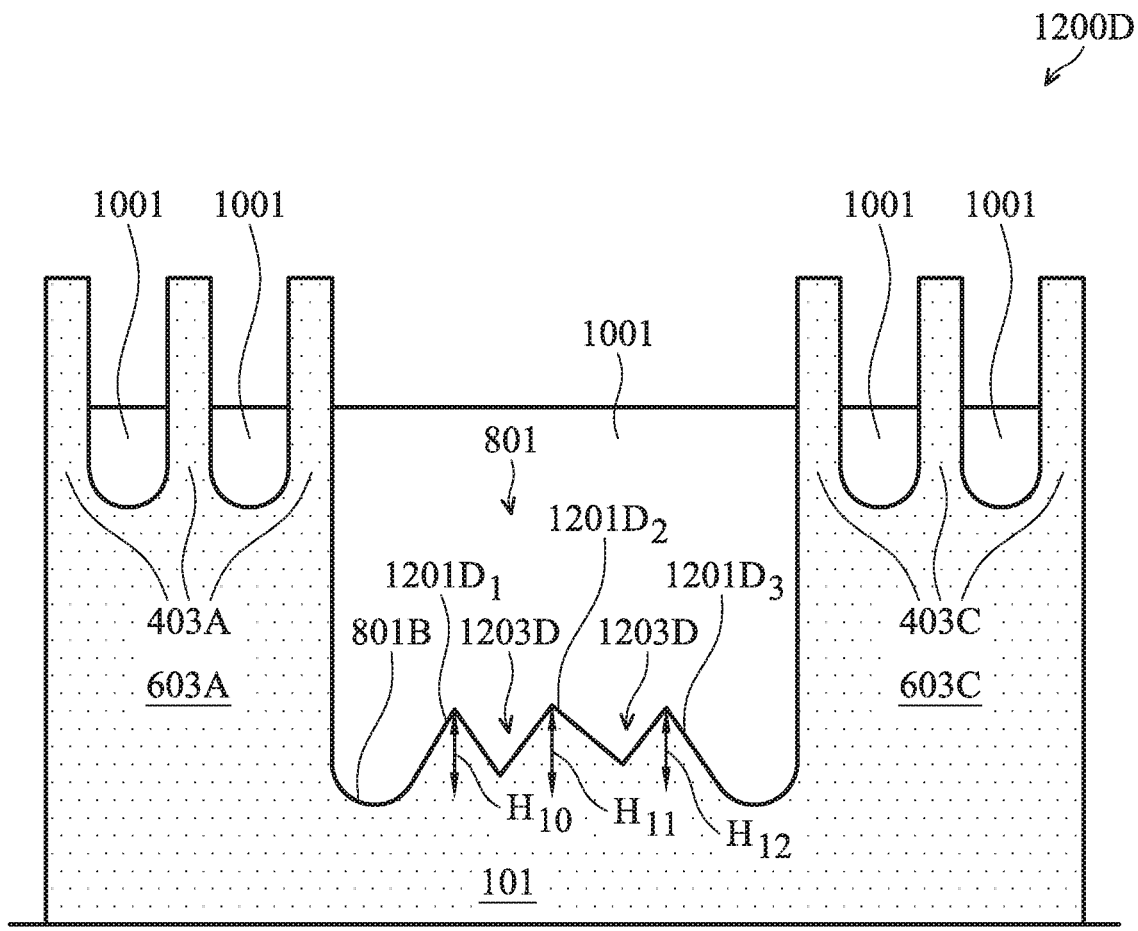

FIG. 12D illustrates a cross-sectional view of a fin structure 1200D in accordance with some embodiments. The fin structure 1200D may be formed using similar method as the fin structure illustrated in FIGS. 11A and 11B, described above with reference to FIGS. 1A-11B, and the description is not repeated herein for the sake of brevity. Like features of the fin structure 1200D and the fin structure of FIGS. 11A and 11B are labeled by like numerical references. The fin structure 1200D comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises three protrusions $1201D_1$, $1201D_2$ and $1201D_3$ (collectively referred to as protrusions 1201D) separated by divots 1203D, such that the number of the protrusions 1201D is equal to the number of the removed dummy fins 403B (see FIGS. 7A and 7B). In the illustrated embodiment, bottommost surfaces of the divots 1203D are higher than portions of the bottom surface 801B of the opening 801 that are disposed farthest from the top surfaces of the STI regions 1001. The protrusions 1201D may be vertically aligned to the removed dummy fins 403B. In some embodiments, the number of the protrusions 1201D may be altered by altering the number of the removed dummy fins 403B. In illustrated embodiment, a height $H_{10}$ of the protrusion $1201D_1$, a height $H_{11}$ of the protrusion $1201D_2$, and a height $H_{12}$ of the protrusion $1201D_3$ are substantially equal. The height $H_{10}$ may be between about 5 nm and about 150 nm, the height $H_{11}$ may be between about 5 nm and about 100 nm, and the height $H_{12}$ may be between about 5 nm and about 200 nm. In other embodiments, the heights $H_{10}$, $H_{11}$, and $H_{12}$ may be different from each other depending on the etching process recipe of the main etch process and the over-etch process, and on the over-etch ratio. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.8 and about 1.2.

Figure 12E:
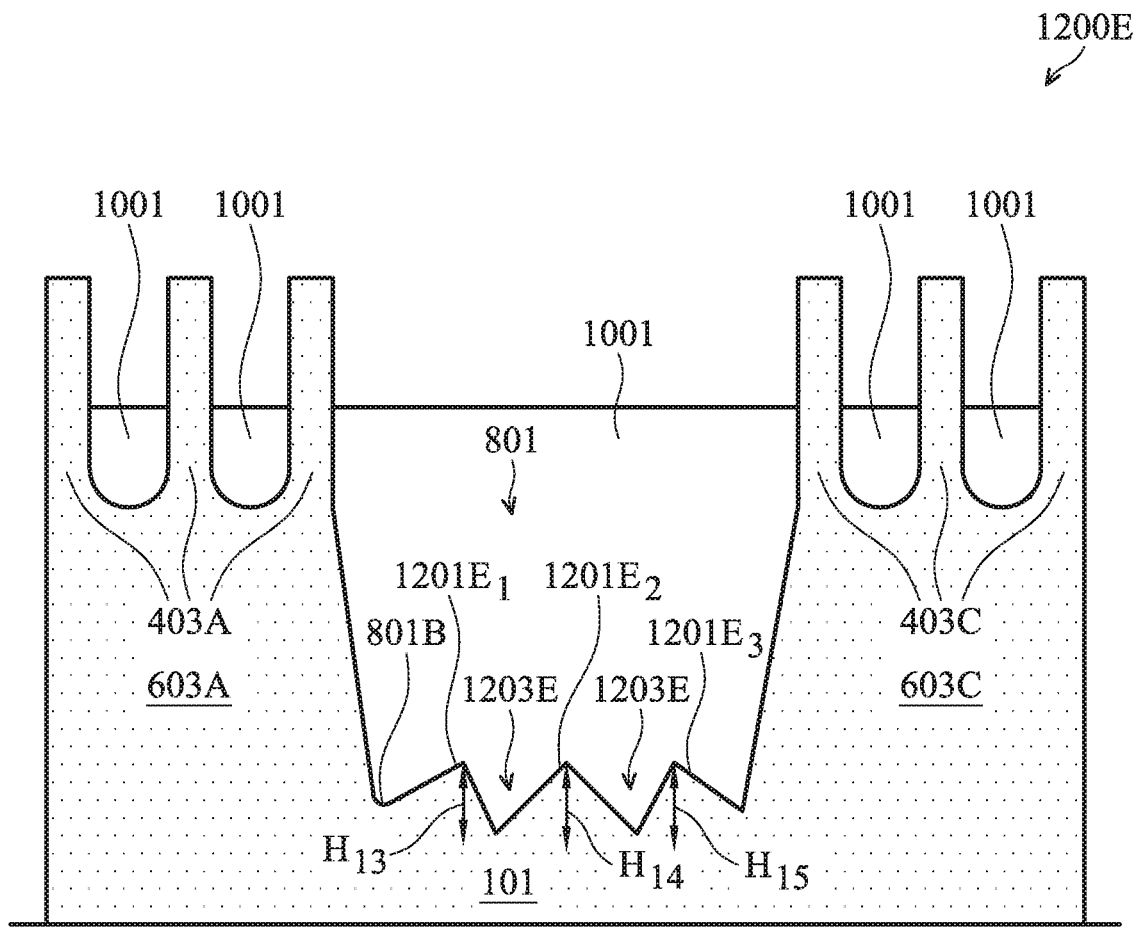

FIG. 12E illustrates a cross-sectional view of a fin structure 1200E in accordance with some embodiments. The fin structure 1200E may be formed using similar method as the fin structure illustrated in FIGS. 11A and 11B, described above with reference to FIGS. 1A-11B, and the description is not repeated herein for the sake of brevity. Like features of the fin structure 1200E and the fin structure of FIGS. 11A and 11B are labeled by like numerical references. The fin structure 1200E comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises three protrusions $1201E_1$, $1201E_2$ and $1201E_3$ (collectively referred to as protrusions 1201E) separated by divots 1203E, such that the number of the protrusions 1201E is equal to the number of the removed dummy fins 403B (see FIGS. 7A and 7B). In the illustrated embodiment, bottommost surfaces of the divots 1203E are portions of the bottom surface 801B of the opening 801 that are disposed farthest from the top surfaces of the STI regions 1001. The protrusions 1201E may be vertically aligned to the removed dummy fins 403B. In some embodiments, the number of the protrusions 1201E may be altered by altering the number of the removed dummy fins 403B. In illustrated embodiment, a height $H_{13}$ of the protrusion $1201E_1$, a height $H_{14}$ of the protrusion $1201E_2$, and a height $H_{15}$ of the protrusion $1201E_2$ are substantially equal. The height $H_{13}$ may be between about 10 nm and about 80 nm, the height $H_{14}$ may be between about 10 nm and about 60 nm, and the height $H_{15}$ may be between about 10 nm and about 150 nm. In other embodiments, the heights $H_{13}$, $H_{14}$, and $H_{15}$ may be different from each other depending on the etching process recipe of the main etch process and the over-etch process, and on the over-etch ratio. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.2 and about 0.4.

Figure 13A:
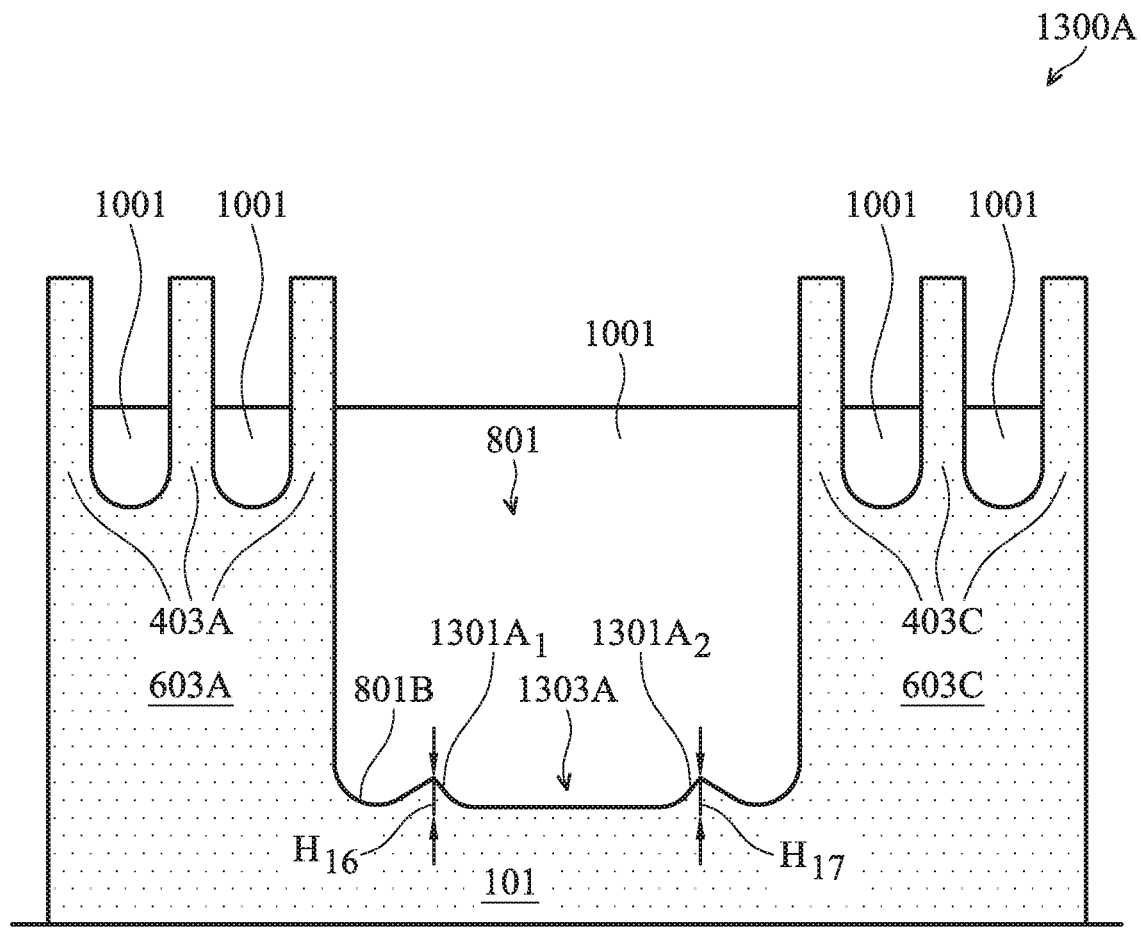
FIGS. 13A-13C illustrate cross-sectional views of fin structures in accordance with some embodiments.
Figure 13B:
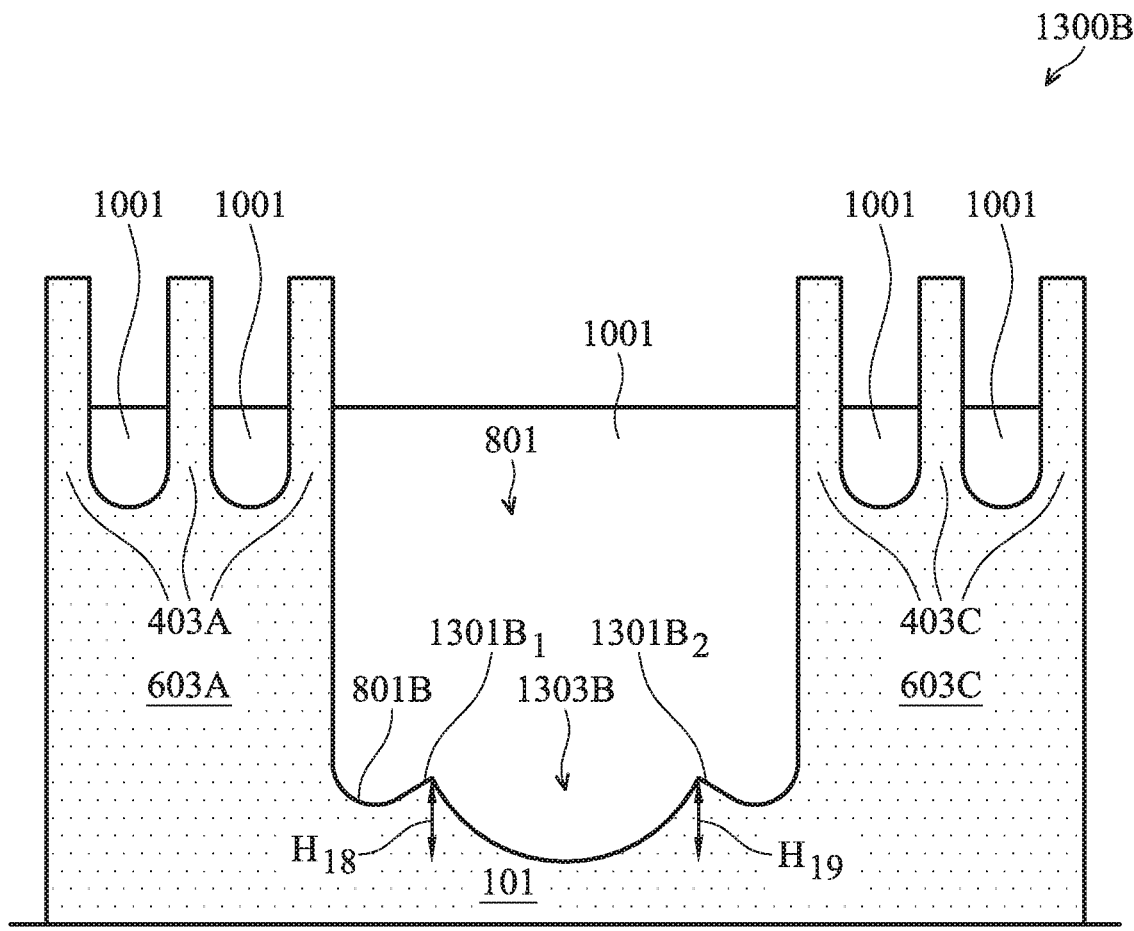
Figure 13C:
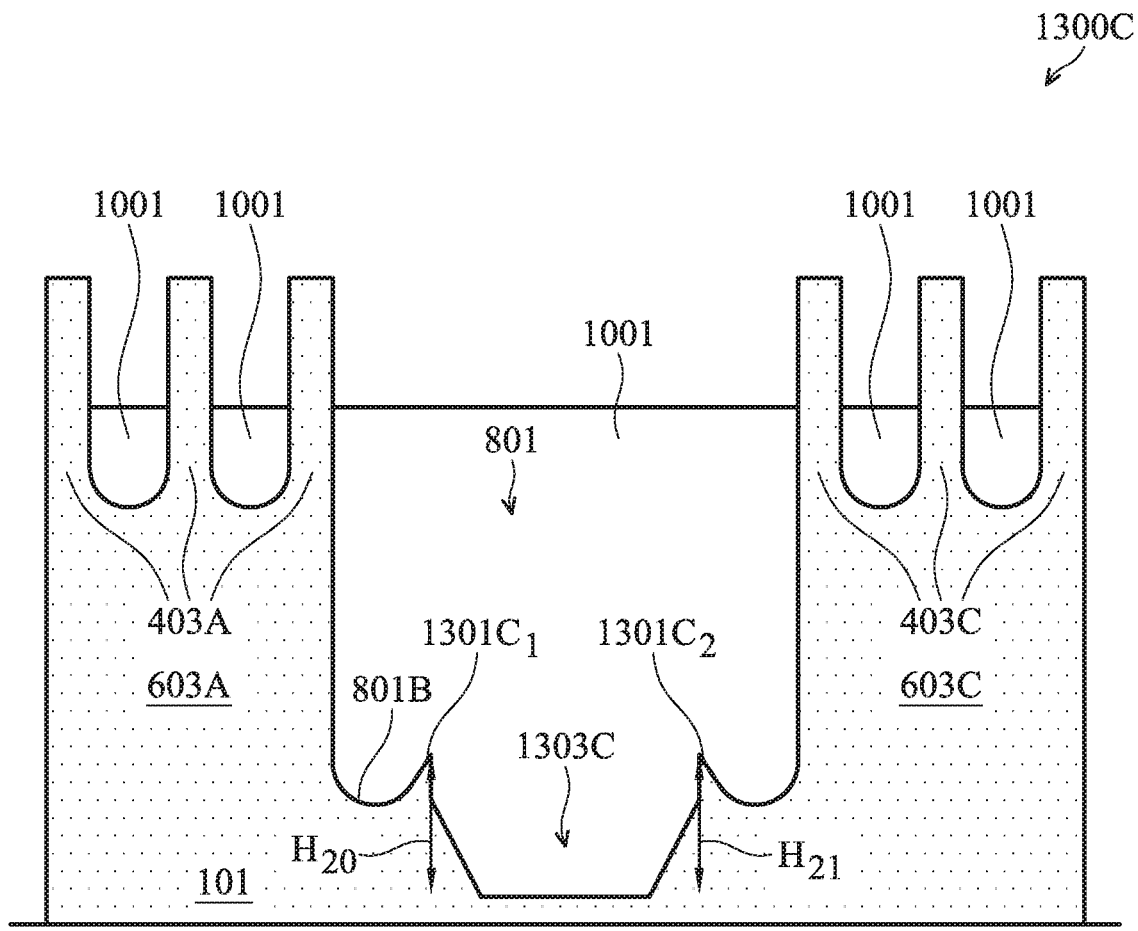

FIGS. 13A-13C illustrate cross-sectional views of fin structures 1300A-1300C in accordance with some embodiments. FIGS. 13A-13C illustrate embodiments wherein the number of protrusions in the bottom of the openings 801 does not equal to the number of removed dummy fins. FIG. 13A illustrates a cross-sectional view of a fin structure 1300A in accordance with some embodiments. The fin structure 1300A may be formed using similar method as the fin structure illustrated in FIGS. 11A and 11B, described above with reference to FIGS. 1A-11B, and the description is not repeated herein for the sake of brevity. Like features of the fin structure 1300A and the fin structure of FIGS. 11A and 11B are labeled by like numerical references. The fin structure 1300A comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises two protrusions $1301A_1$ and $1301A_2$ (collectively referred to as protrusions 1301A) separated by a divot 1303A, such that the number of the protrusions 1301A is different from the number of the removed dummy fins 403B (see FIGS. 7A and 7B). In the illustrated embodiment, a bottommost surface of the divot 1303A is a portion of the bottom surface 801B of the opening 801 that is disposed farthest from the top surfaces of the STI regions 1001. In illustrated embodiment, a height $H_{16}$ of the protrusion $1301A_1$ and a height $H_{17}$ of the protrusion $1301A_2$ are substantially equal. Alternatively, the height $H_{16}$ of the protrusion $1301A_1$ may be different from the height $H_{17}$ of the protrusion $1301A_2$. In some embodiments, the height $H_{16}$ may be between about 1 nm and about 200 nm, and the height $H_{17}$ may be between about 1 nm and about 200 nm. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.85 and about 1.5.

FIG. 13B illustrates a cross-sectional view of a fin structure 1300B in accordance with some embodiments. The fin structure 1300B may be formed using similar method as the fin structure illustrated in FIGS. 11A and 11B, described above with reference to FIGS. 1A-11B, and the description is not repeated herein for the sake of brevity. Like features of the fin structure 1300B and the fin structure of FIGS. 11A and 11B are labeled by like numerical references. The fin structure 1300B comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises two protrusions $1301B_1$ and $1301B_2$ (collectively referred to as protrusions 1301B) separated by a divot 1303B, such that the number of the protrusions 1301B is different from the number of the removed dummy fins 403B (see FIGS. 7A and 7B). In the illustrated embodiment, a bottommost surface of the divot 1303B is lower than portions of the bottom surface 801B of the opening 801 that are disposed farthest from the top surfaces of the STI regions 1001. In illustrated embodiment, a height $H_{18}$ of the protrusion $1301B_1$ and a height $H_{19}$ of the protrusion $1301B_2$ are substantially equal. Alternatively, the height $H_{18}$ of the protrusion $1301B_1$ may be different from the height $H_{19}$ of the protrusion $1301B_2$. In some embodiments, the height $H_{18}$ may be between about 10 nm and about 100 nm, and the height $H_{19}$ may be between about 10 nm and about 130 nm. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 0.9 and about 1.3.

FIG. 13C illustrates a cross-sectional view of a fin structure 1300C in accordance with some embodiments. The fin structure 1300C may be formed using similar method as the fin structure illustrated in FIGS. 11A and 11B, described above with reference to FIGS. 1A-11B, and the description is not repeated herein for the sake of brevity. Like features of the fin structure 1300C and the fin structure of FIGS. 11A and 11B are labeled by like numerical references. The fin structure 1300C comprises a substrate 101, active fins 403A and 403C, corresponding active bases 603A and 603C, and STI regions 1001 in the openings 401A and 801 (see FIGS. 9A and 9B). The active fins 403A and 403C and the corresponding active bases 603A and 603C are separated by the opening 801, which may be formed by removing dummy fins 403B and a corresponding dummy base 603B using similar methods as described above with reference to FIGS. 7A-8B, and the description is not repeated herein for the sake of brevity. In the illustrated embodiment, a bottom surface 801B of the opening 801 is a non-planar surface. The bottom of the opening 801 comprises two protrusions $1301C_1$ and $1301C_2$ (collectively referred to as protrusions 1301C) separated by a divot 1303C, such that the number of the protrusions 1301C is different from the number of the removed dummy fins 403B (see FIGS. 7A and 7B). In the illustrated embodiment, a bottommost surface of the divot 1303C is lower than portions of the bottom surface 801B of the opening 801 that are disposed farthest from the top surfaces of the STI regions 1001. In illustrated embodiment, a height $H_{20}$ of the protrusion $1301C_1$ and a height $H_{21}$ of the protrusion $1301C_2$ are substantially equal. Alternatively, the height $H_{20}$ of the protrusion $1301C_1$ may be different from the height $H_{21}$ of the protrusion $1301C_2$. In some embodiments, the height $H_{20}$ may be between about 20 nm and about 120 nm, and the height $H_{21}$ may be between about 15 nm and about 150 nm. The illustrated structure of the bottom of the opening 801 may be obtained by tuning the process parameters of the main etch process and the over-etch process. The tunable process parameters may include a process gas mixture, temperature, pressure, an RF power, a bias voltage, and/or an over-etch ratio. In the illustrated embodiment, the over-etch ratio $t_{over-etch}/t_{etch}$ may be between about 1 and about 1.5.

Referring further to FIGS. 12A-12E and 13A-13C, the various structures of the bottom of the opening 801 illustrated in FIGS. 12A-12E and 13A-13C improve isolation of the active fin structures and aid in reducing stress in the resulting FinFETs. Depending on the isolation and/or stress requirements for the resulting FinFETs, a suitable structure illustrated in FIGS. 12A-12E and 13A-13C may be used to form the FinFETs.

Figure 14:
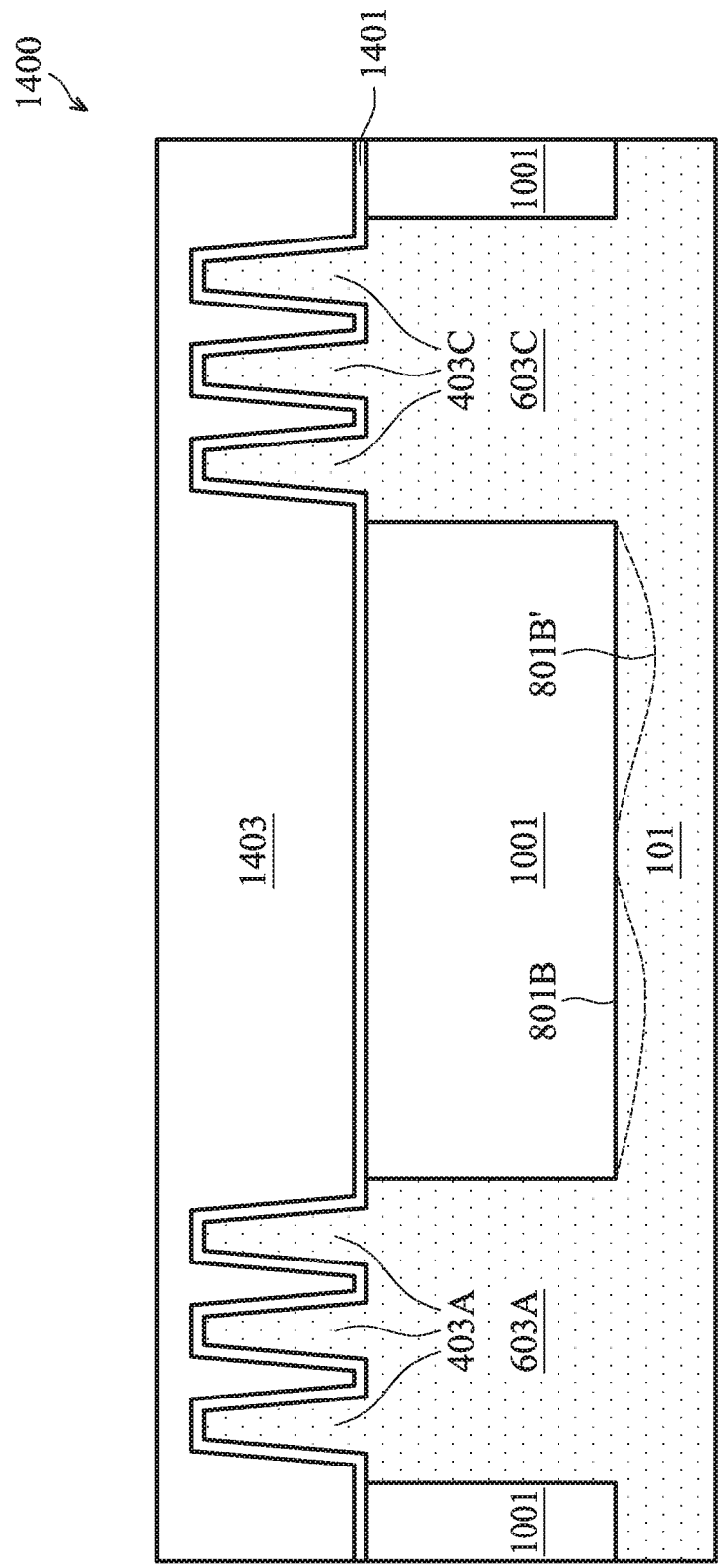
FIGS. 14-18C illustrate cross-sectional views of various intermediate stages of fabrication of a semiconductor device in accordance with some embodiments.

FIGS. 14-18C illustrate cross-sectional views of various intermediate stages of fabrication of a semiconductor device 1400 from the fin structure illustrated in FIGS. 11A and 11B in accordance with some embodiments. Similar process steps may be also applied to the fin structures illustrated in FIGS. 12A-12E and 13A-13C to form respective semiconductor devices. Referring to FIG. 14, a dummy gate dielectric 1401 is formed over the active fins 403A and 403C and the STI regions 1001, and a dummy gate electrode 1403 is formed over the dummy gate dielectric 1401. The dummy gate dielectric 1401 may comprise silicon oxide, and may be formed using oxidation, CVD, LPCD, the like, or a combination thereof. The dummy gate electrode 1403 may comprise polysilicon, and may be formed using CVD, LPCD, the like, or a combination thereof.

Figure 15A:
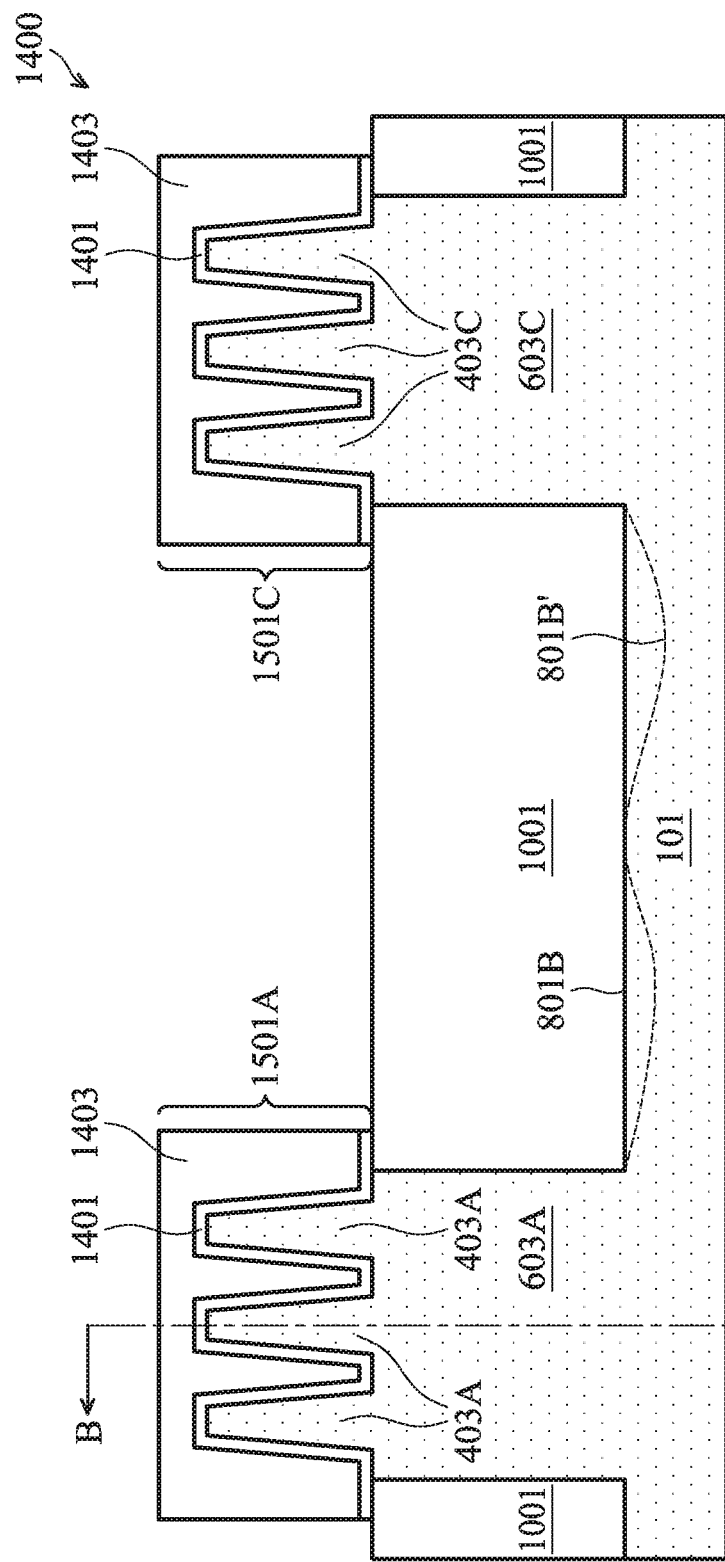
Figure 15B:
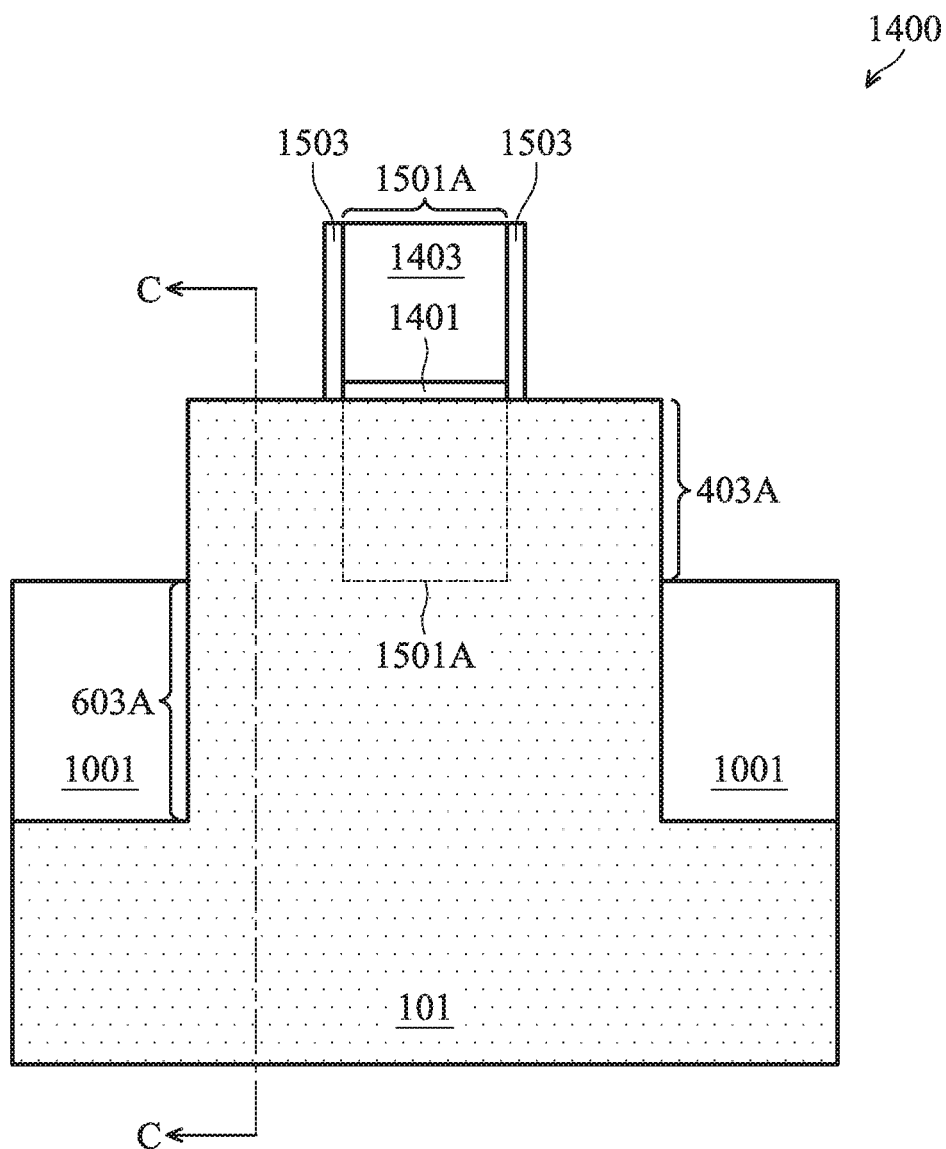
Figure 15C:
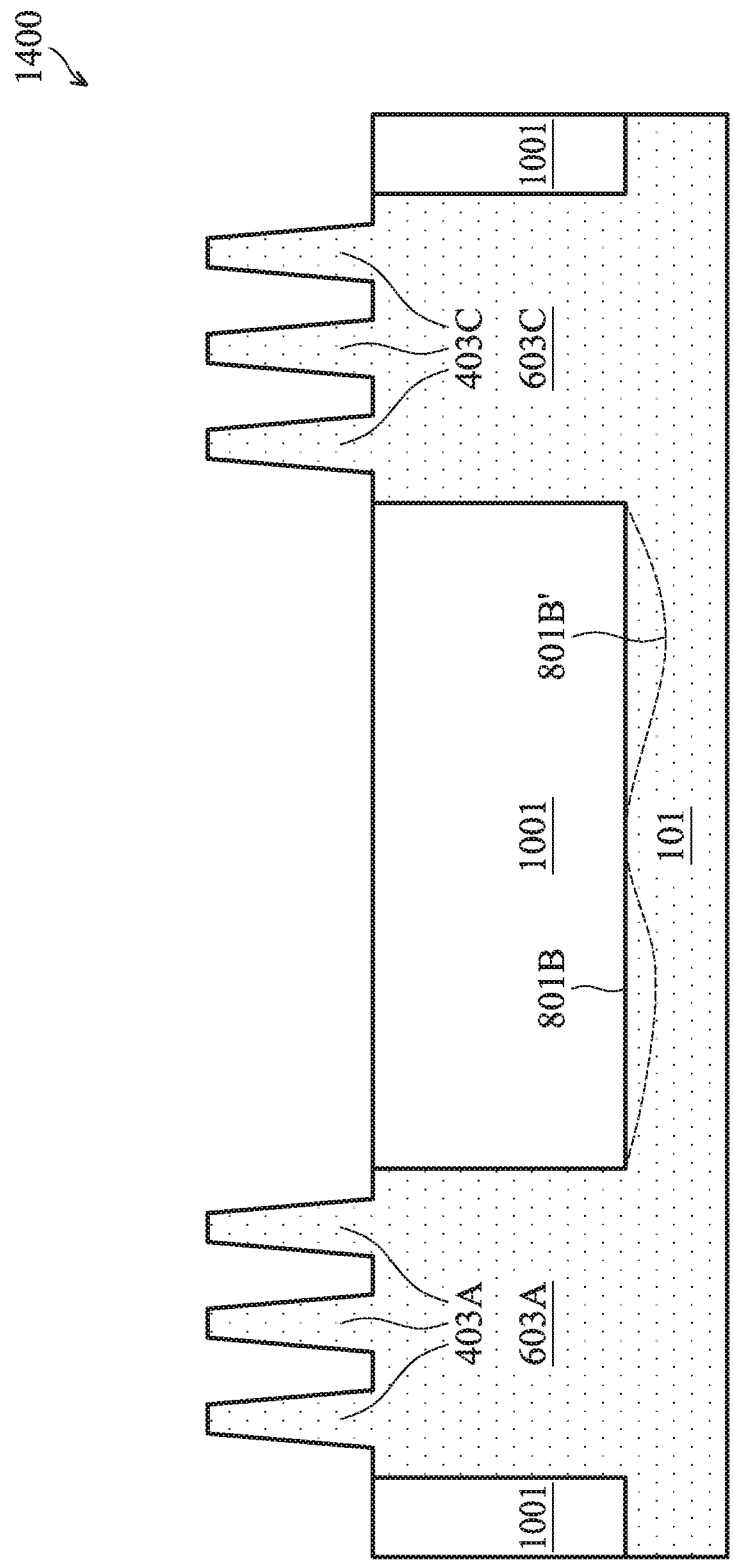

Referring to FIGS. 15A, 15B and 15C, the dummy gate dielectric 1401 and the dummy gate electrode 1403 are patterned to form dummy gate stacks 1501A and 1501C over the active fins 403A and 403C, respectively. FIG. 15B illustrates a cross-sectional view obtained from a vertical plane containing a line B-B in FIG. 15A, and FIG. 15C illustrates a cross-sectional view obtained from a vertical plane containing a line C-C in FIG. 15B. In some embodiments, the dummy gate electrode 1403 and the dummy gate dielectric 1401 may be patterned using suitable lithography and etching processes. As illustrated in FIGS. 15A, 15B, and 15C, the dummy gate stack 1501A is formed on sidewalls and top surfaces of middle portions of the active fins 403A, such that end portions of the active fins 403A are exposed. Similarly, the dummy gate stack 1501C is formed on sidewalls and top surfaces of middle portions of the active fins 403C, such that end portions of the active fins 403C are exposed.

Referring further to FIGS. 15A, 15B and 15C, gate spacers 1503 are formed on sidewalls of the dummy gate stacks 1501A and 1501C. The gate spacers 1503 may comprise an oxide (such a silicon oxide, aluminum oxide, titanium oxide, or the like), a nitride (such as silicon nitride, titanium nitride, or the like), an oxynitride (such as silicon oxynitride, or the like), an oxycarbide (such as silicon oxycarbide, or the like), a carbonitride (such as silicon carbonitride, or the like), the like, or a combination thereof. In some embodiments, a gate spacer layer may be formed on top surfaces and sidewalls of the dummy gate stacks 1501A and 1501C using CVD, PECVD, ALD, the like, or a combination thereof. Subsequently, the gate spacer layer is patterned using, for example, an anisotropic dry etch process to remove horizontal portions of the spacer layer from the top surfaces of the dummy gate stacks 1501A and 1501C. Portions of the gate spacer layer remaining on the sidewalls of the dummy gate stacks 1501A and 1501C form the gate spacers 1503.

Figure 16A:
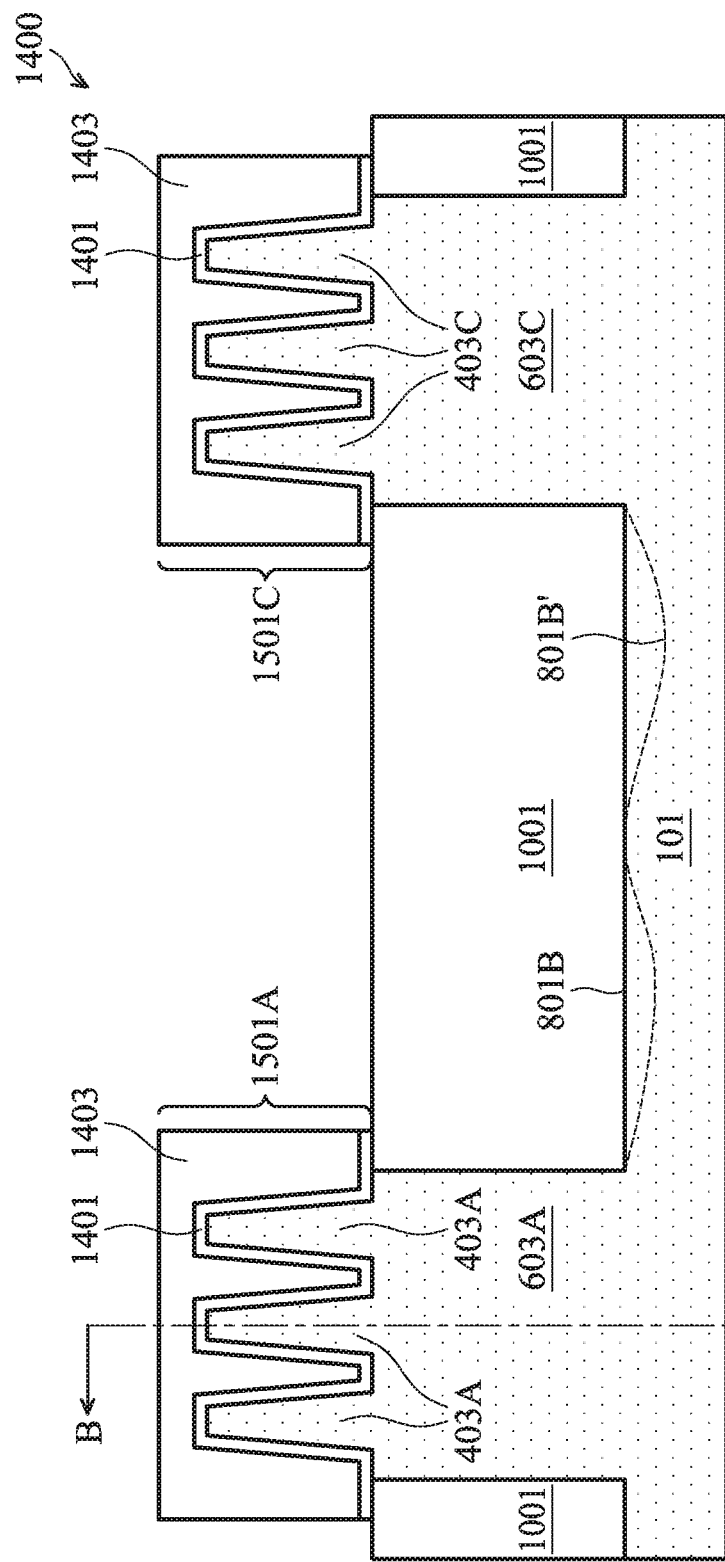
Figure 16B:
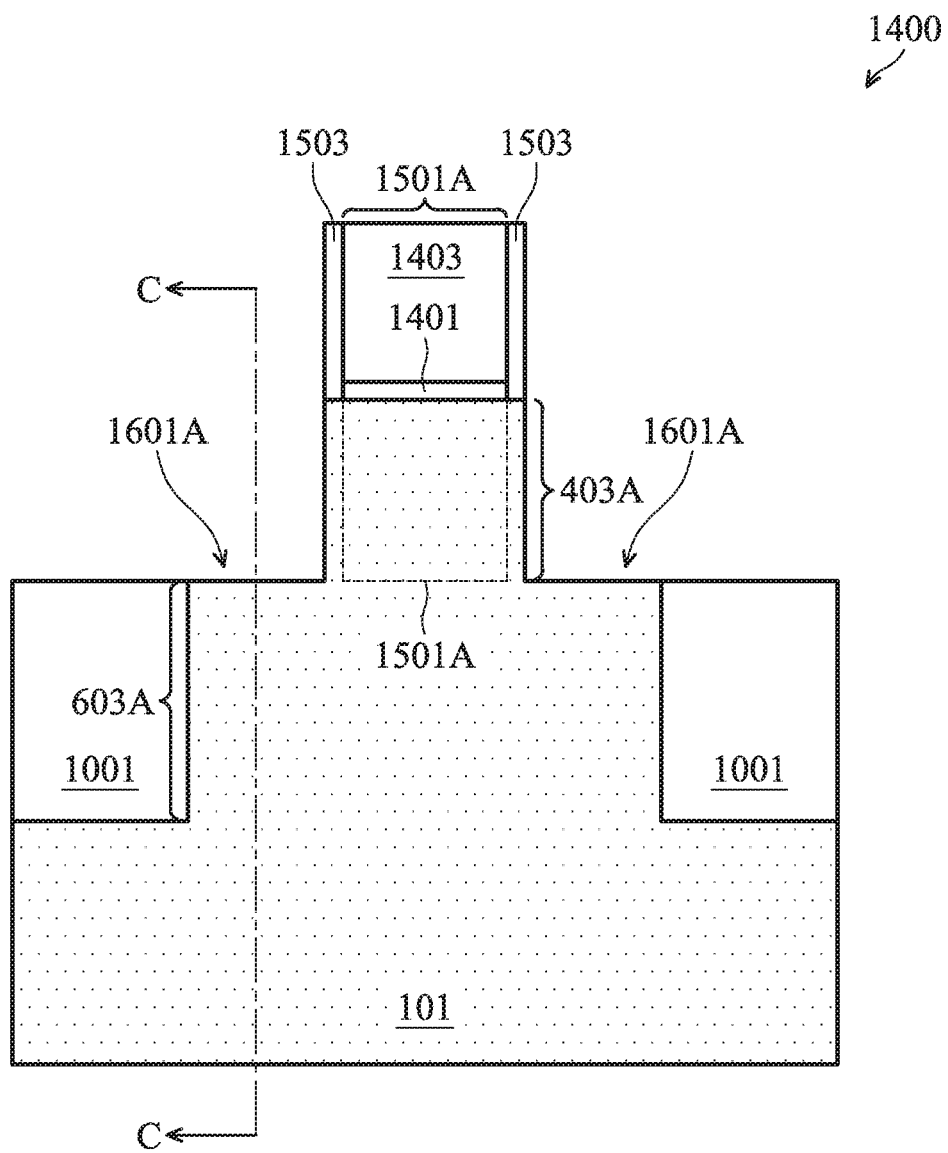
Figure 16C:
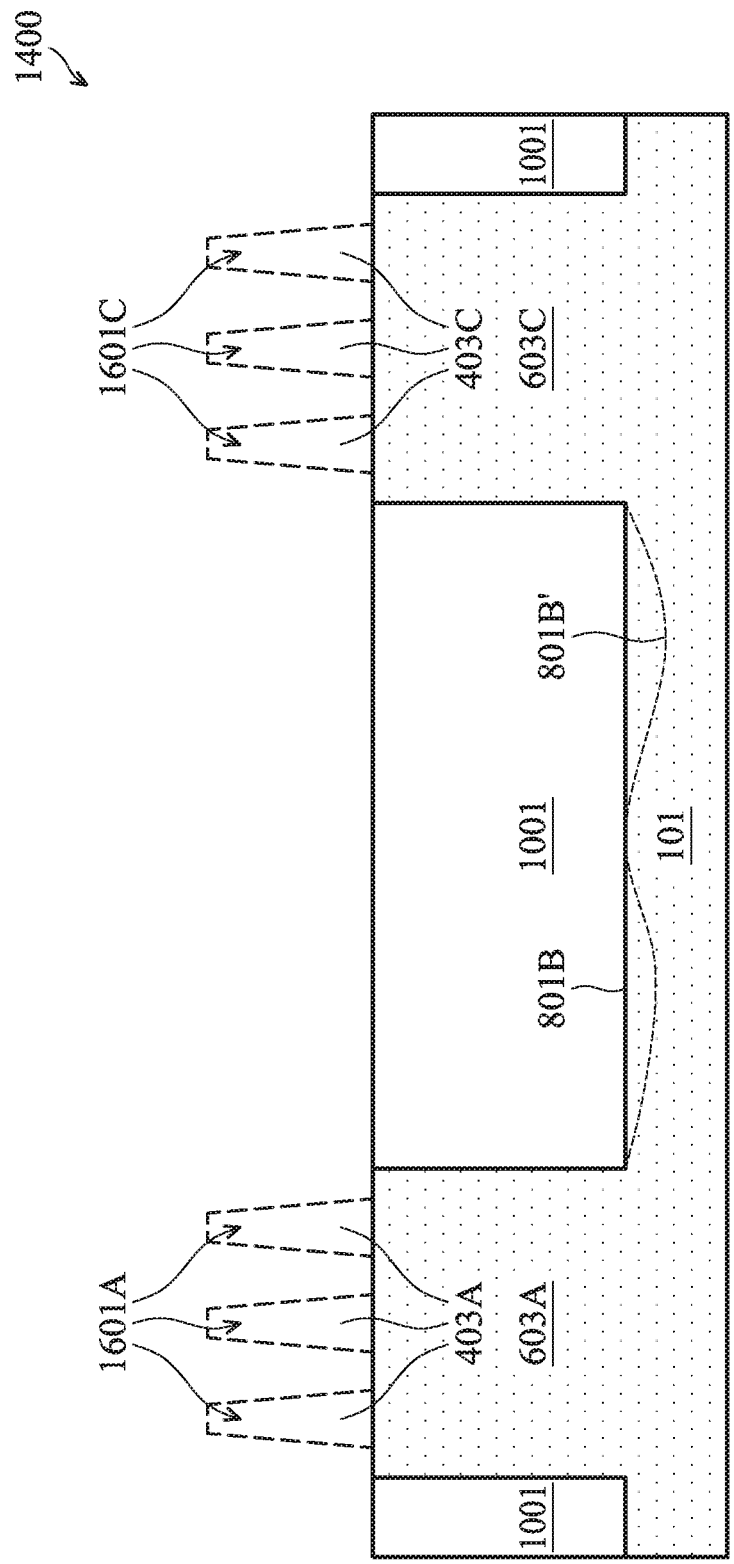

Referring to FIGS. 16A, 16B and 16C, the exposed end portions of the active fins 403A and 403C are removed. FIG. 16B illustrates a cross-sectional view obtained from a vertical plane containing a line B-B in FIG. 16A, and FIG. 16C illustrates a cross-sectional view obtained from a vertical plane containing a line C-C in FIG. 16B. Since the unremoved portions of the active fins 403A and 403C are not in the illustrated plane of FIG. 16C, they are shown with dashed lines in FIG. 16C. In some embodiments, the exposed end portions of the active fins 403A and 403C are removed by a suitable etching process using the dummy gate stacks 1501A and 1501C, respectively, as etch masks. After the etching process, the portions of the active fins 403A and 403C directly underling the dummy gate stacks 1501A and 1501C, respectively, remain unremoved. The unremoved portions of the active fins 403A and 403C form channel regions of the resulting FinFETs. In some embodiments, the exposed end portions of the active fins 403A and 403C may removed by etching using any acceptable etch process, such as a RIE, neutral beam etch (NBE), tetramethylammonium hydroxide (TMAH), ammonium hydroxide ($NH_4OH$) the like, or a combination thereof. In the illustrated embodiments, recesses 1601A and 1601C formed after removing the exposed end portions of the active fins 403A and 403C have bottoms substantially level with the top surfaces of the adjacent STI regions 1001. In other embodiments, the bottoms of the recesses 1601A and 1601C may be below the top surfaces of the adjacent STI regions 1001.

Figure 17A:
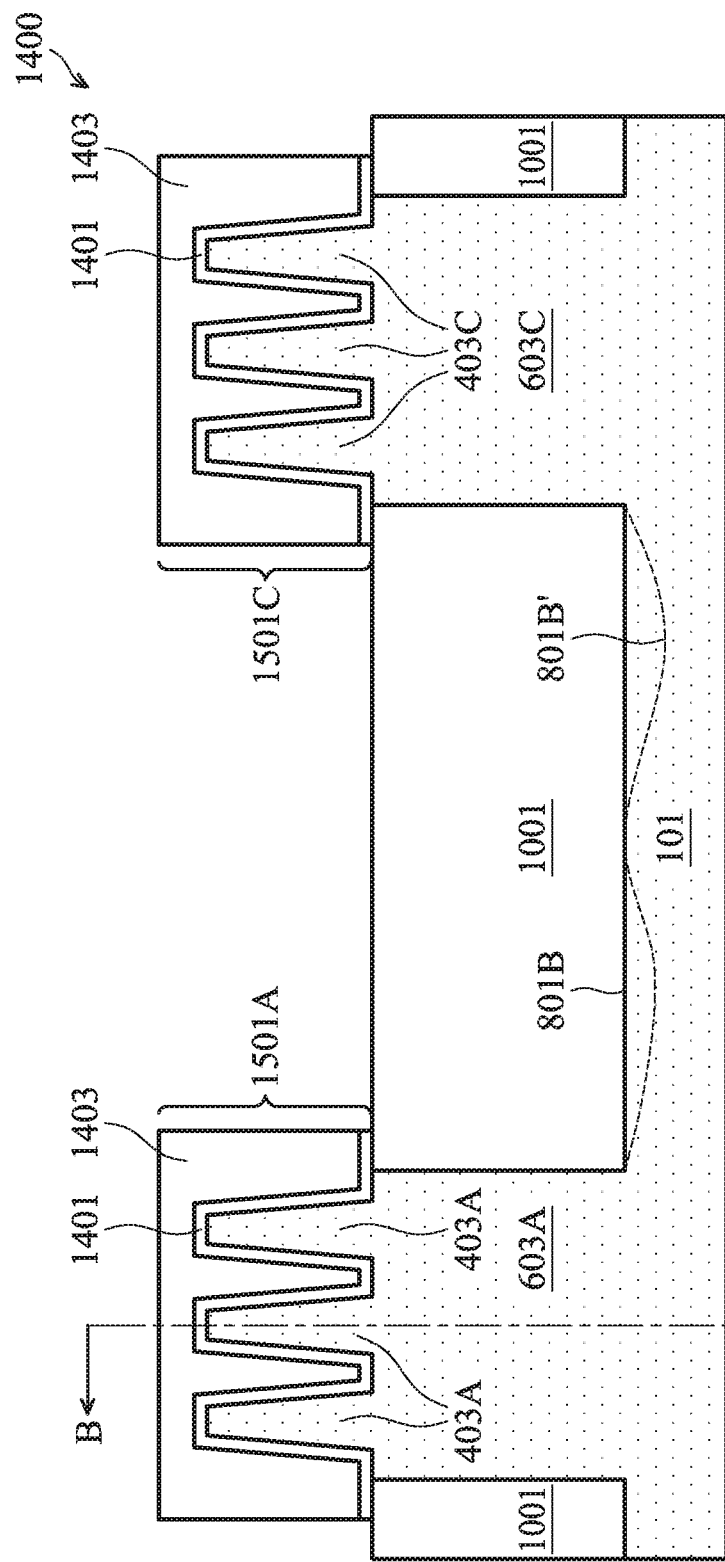
Figure 17B:
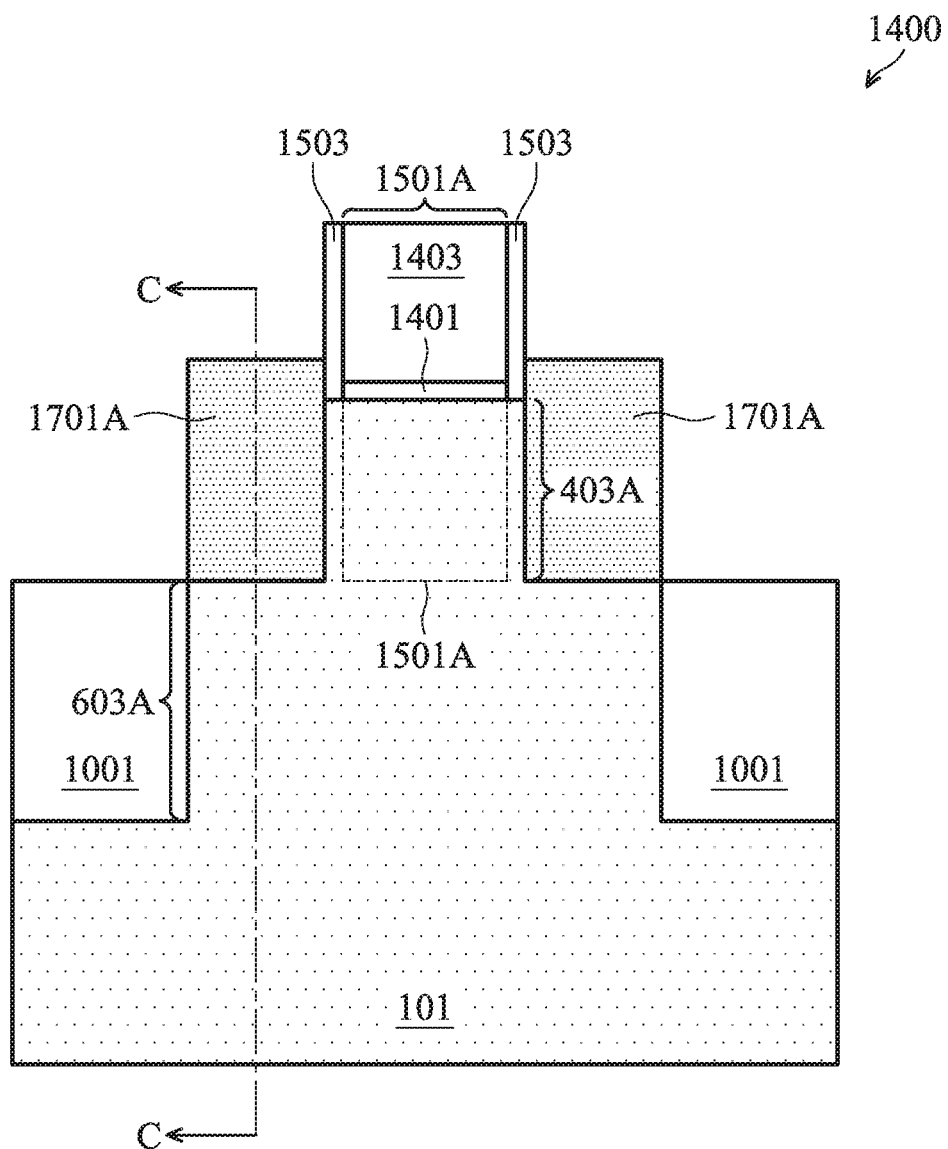
Figure 17C:
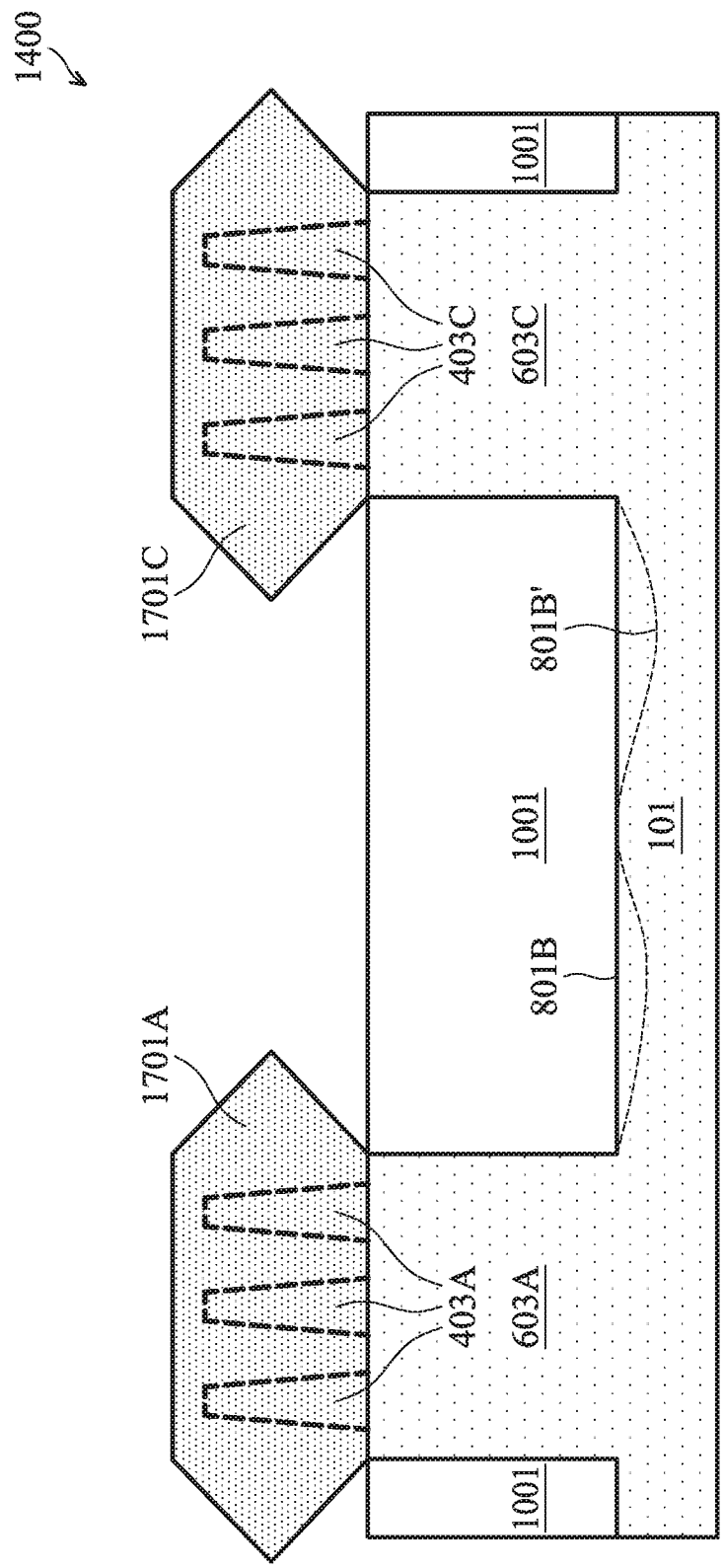

Referring to FIGS. 17A, 17B and 17C, source/drain regions 1701A and 1701C are formed in the recesses 1601A and 1601C (see FIGS. 16A, 16B and 16C), respectively. FIG. 17B illustrates a cross-sectional view obtained from a vertical plane containing a line B-B in FIG. 17A, and FIG. 17C illustrates a cross-sectional view obtained from a vertical plane containing a line C-C in FIG. 17B. The source/drain regions 1701A and 1701C are formed in the recesses 1601A and 1601C, respectively, by epitaxially growing a material in the recesses 1601A and 1601C, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 17C, the source/drain region 1701A is a common continuous source/drain region for the active fins 403A, and the source/drain region 1701C is a common continuous source/drain region for the active fins 403C. The source/drain regions 1701A and 1701C may have upward facing facets and downward facing facets in accordance with some embodiments, or may have other shapes.

In some embodiments in which the resulting FinFETs are n-type FinFETs, the source/drain regions 1701A and 1701C comprise silicon carbide (SiC), silicon phosphorous (SiP), phosphorous-doped silicon carbon (SiCP), or the like. In some embodiments in which the resulting FinFETs are p-type FinFETs, the source/drain regions 1701A and 1701C comprise SiGe, and a p-type impurity such as boron or indium. In some embodiments in which the resulting FinFETs are both n-type FinFETs and p-type FinFETs, the source/drain regions 1701A comprise silicon carbide (SiC), silicon phosphorous (SiP), phosphorous-doped silicon carbon (SiCP), or the like, and the source/drain regions 1701C comprise SiGe, and a p-type impurity such as boron or indium. In some embodiments, the source/drain regions 1701A and 1701C may be implanted with suitable dopants followed by an anneal. The implanting process may include forming and patterning masks such as a photoresist to cover the regions of the FinFET that are to be protected from the implanting process. In other embodiments, the source/drain regions 1701A and 1701C may be in situ doped during the epitaxial growth process.

Figure 18A:
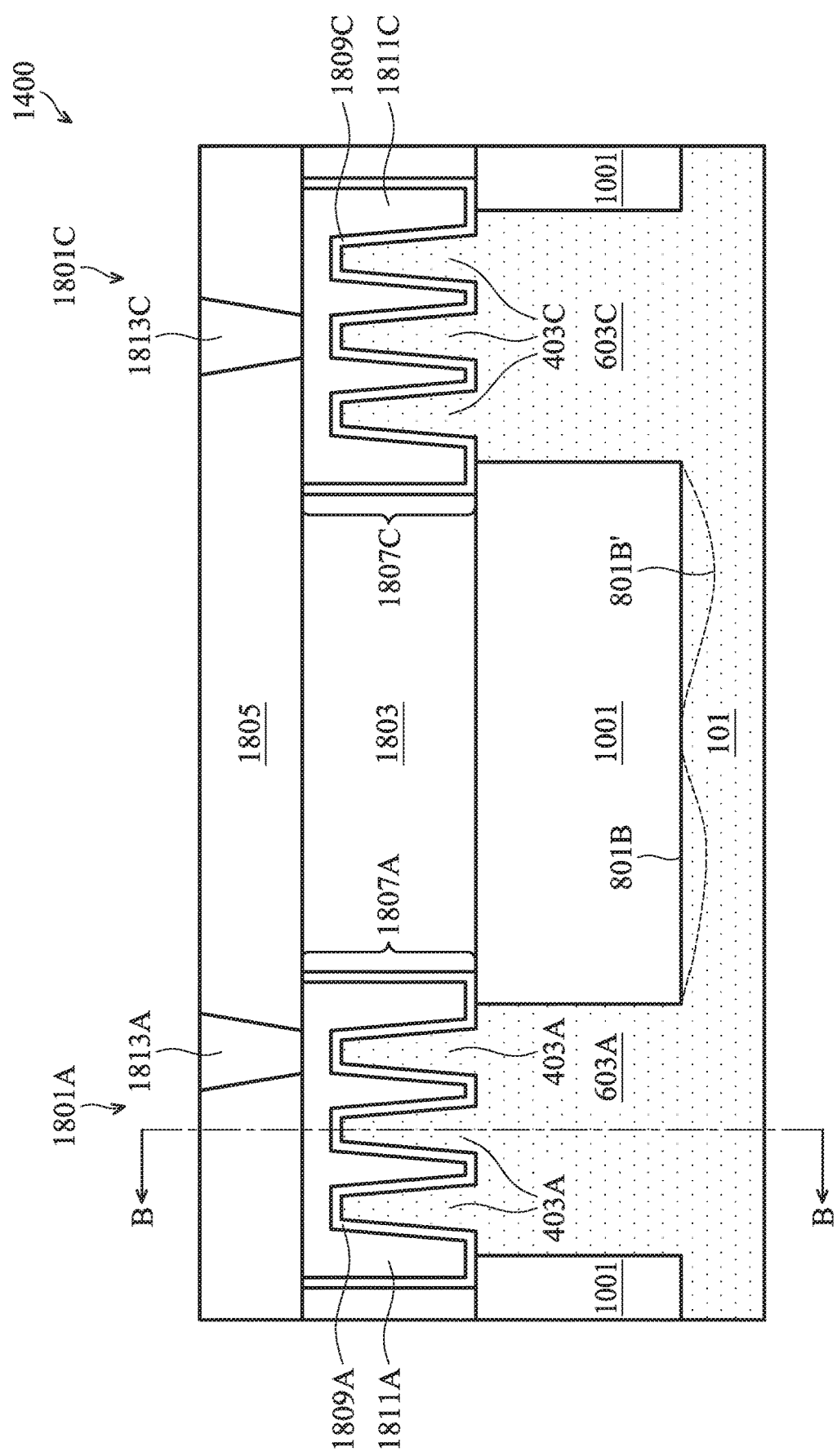
Figure 18B:
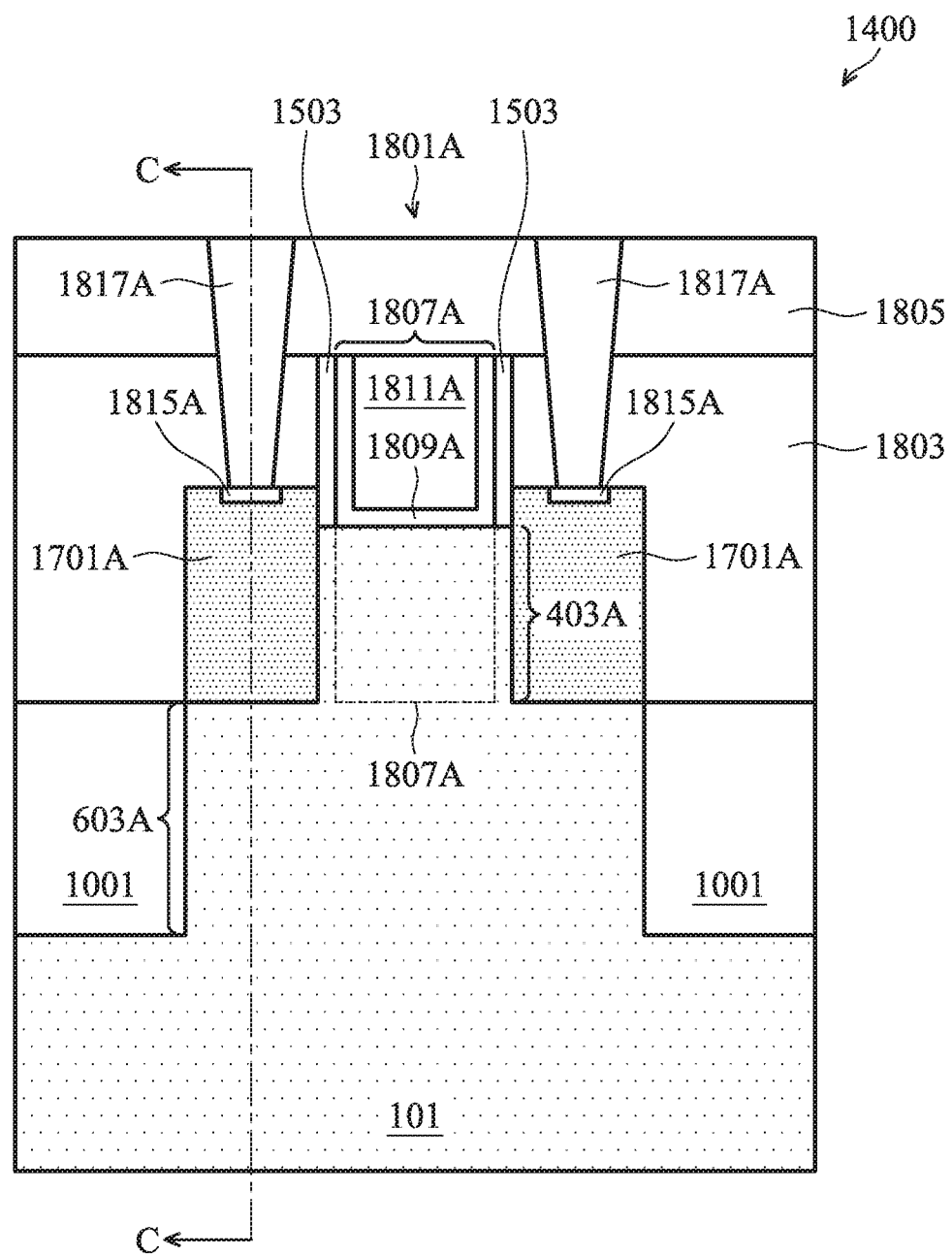
Figure 18C:
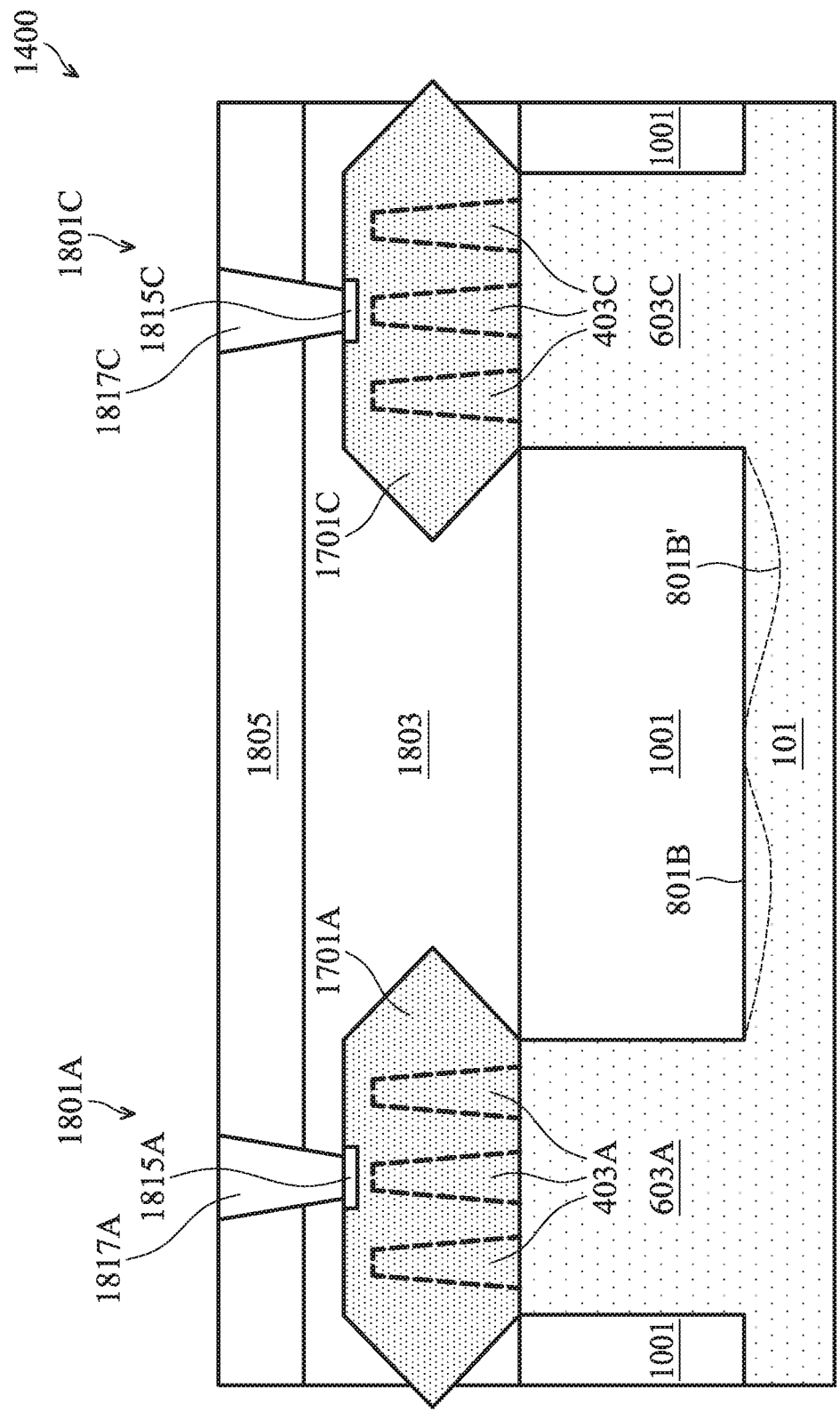

Referring to FIGS. 18A, 18B and 18C, a plurality of process steps is performed to complete the formation of FinFETs 1801A and 1801C. FIG. 18B illustrates a cross-sectional view obtained from a vertical plane containing a line B-B in FIG. 18A, and FIG. 18C illustrates a cross-sectional view obtained from a vertical plane containing a line C-C in FIG. 18B. In some embodiments, the dummy gate stacks 1501A and 1501C (see FIGS. 17A, 17B and 17C) are replaced with replacement gate stacks 1807A and 1807C, respectively. In some embodiments, the formation of the replacement gate stacks 1807A and 1807C may include deposition of an interlayer dielectric (ILD) 1803 over the dummy gate stacks 1501A and 1501C, planarization of the ILD 1803 by, for example, a CMP process until a top surface of the ILD 1803 is substantially level with top surfaces of the dummy gate stacks 1501A and 1501C, and removal of the dummy gate stacks 1501A and 1501C by, for example, a suitable etching process to form recesses in the ILD 1803. Subsequently, the gate dielectrics 1809A and 1809C are formed in the respective recesses, and the gate electrodes 1811A and 1811C are formed over the gate dielectrics 1809A and 1809C, respectively. In some embodiments, excess material overfilling the recesses in the ILD 1803 may be removed by, for example, a CMP process. In such embodiments, the top surface of the ILD 1803 is coplanar with top surfaces of the replacement gate stacks 1807A and 1807C.

The ILD 1803 is formed of a dielectric material such as phosphosilicate glass (PSG), borosilicate glass (BSG), boron-doped phosphosilicate Glass (BPSG), undoped silicate glass (USG), the like, or a combination thereof and may be deposited by any suitable method, such as CVD, PECVD, FCVD, the like, or a combination thereof. In some embodiments, the gate dielectrics 1809A and 1809C may comprise a dielectric material such as, for example, silicon oxide, silicon nitride, multilayers thereof, or the like, and may be deposited or thermally grown according to acceptable techniques. In other embodiments, the gate dielectrics 1809A and 1809C may comprise a high-k dielectric material such as, for example, a metal oxide or a silicate of Hf, Al, Zr, La, Mg, Ba, Ti, Pb, the like, multilayers thereof, and combinations thereof, and may be formed by, for example, molecular-beam deposition (MBD), ALD, PECVD, the like, or a combination thereof. In some embodiments, the gate dielectric 1809A and the gate dielectric 1809C comprise a same dielectric material. In other embodiments, the gate dielectric 1809A and the gate dielectric 1809C comprise different dielectric materials. The gate electrodes 1811A and 1811C may comprise a metallic material such as gold, silver, aluminum, copper, tungsten, molybdenum, nickel, titanium, or alloys thereof, and may be formed using physical vapor deposition (PVD), ALD, plating, the like, or a combination thereof. In some embodiments, the gate electrode 1811A and the gate electrode 1811C comprise a same conductive material. In other embodiments, the gate electrode 1811A and the gate electrode 1811C comprise different conductive materials.

Referring further to FIGS. 18A, 18B and 18C, an ILD 1805 is formed over the ILD 1803 and the replacement gate stacks 1807A and 1807C. The ILD 1805 may be formed using similar materials and methods as the ILD 1803 and the description is not repeated herein for the sake of brevity. In some embodiments, the ILD 1803 and the ILD 1805 may comprise a same dielectric material, such that an interface between the ILD 1803 and the ILD 1805 may not be distinguishable. In other embodiments, the ILD 1803 and the ILD 1805 may comprise different dielectric materials.

In some embodiments, gate contacts 1813A and 1813C, and source/drain contacts 1817A and 1817C are formed in the ILD 1803 and the ILD 1805. The gate contacts 1813A and 1813C are physically and electrically coupled to the replacement gate stacks 1807A and 1807C, respectively. The source/drain contacts 1817A and 1817C are physically and electrically coupled to the source/drain regions 1701A and 1701C, respectively. In some embodiments, openings for the gate contacts 1813A and 1813C and the source/drain contacts 1817A and 1817C are formed through the ILD 1803 and the ILD 1805. The openings may be formed using suitable photolithography and etching techniques. A liner (not shown), such as a diffusion barrier layer, an adhesion layer, or the like, and a conductive material are formed in the openings. The liner may include titanium, titanium nitride, tantalum, tantalum nitride, the like, or a combination thereof. The conductive material may be copper, a copper alloy, silver, gold, tungsten, aluminum, nickel, the like, or a combination thereof. A planarization process, such as a CMP process, may be performed to remove excess materials from a top surface of the ILD 1805. The remaining liner and conductive material form the gate contacts 1813A and 1813C and the source/drain contacts 1817A and 1817C in the respective openings. An anneal process may be performed to form silicides 1815A and 1815C at interfaces between the source/drain regions 1701A and 1701C and the source/drain contacts 1817A and 1817C, respectively. Although not explicitly shown, a person having ordinary skill in the art will readily understand that further processing steps may be performed on the structure in FIGS. 18A, 18B and 18C. For example, various inter-metal dielectrics (IMD) and their corresponding metallizations may be formed over the ILD 1805.

Figure 19A:
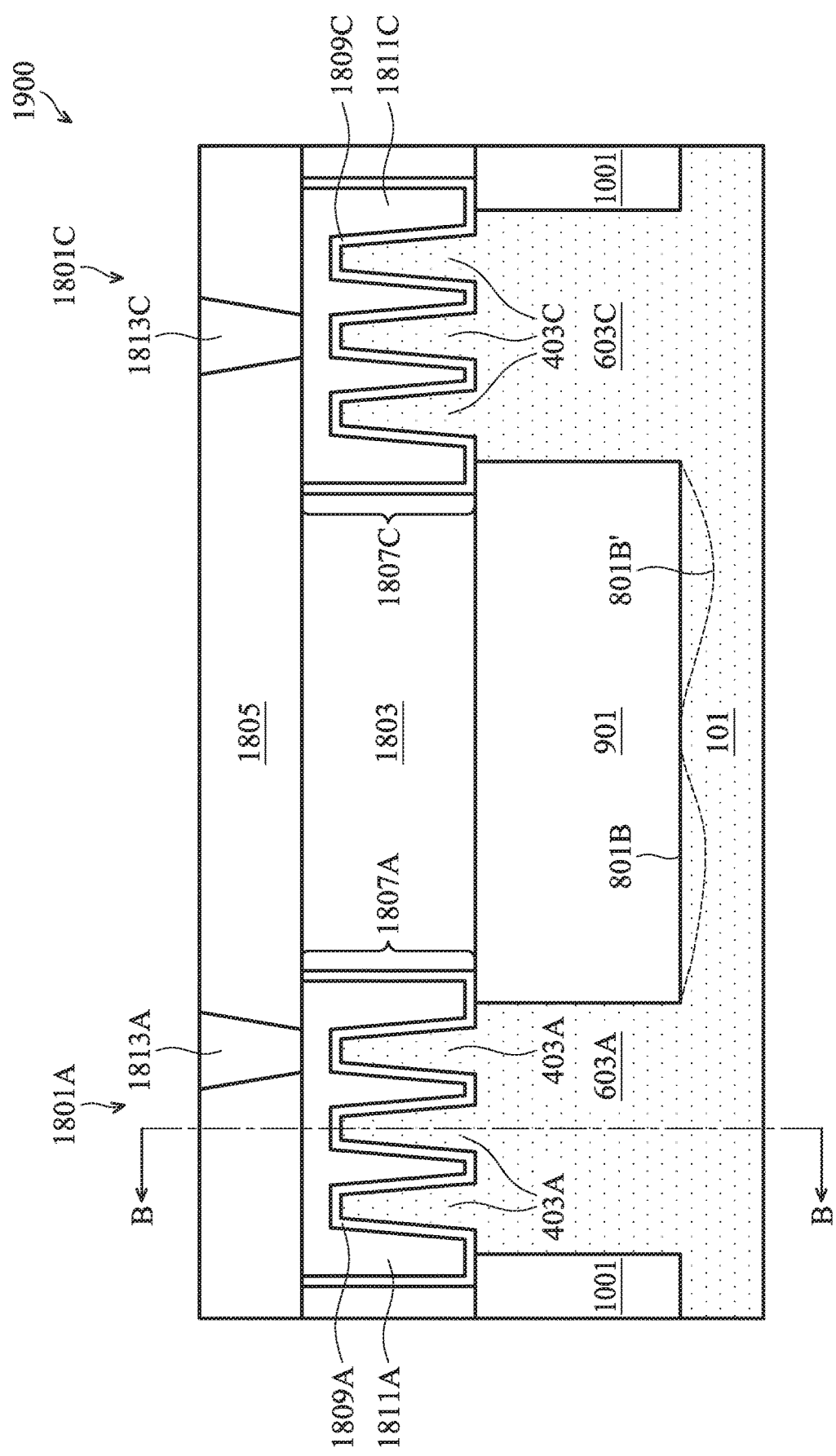
FIGS. 19A, 19B, and 19C illustrate cross-sectional views of a semiconductor device in accordance with some embodiments.
Figure 19B:
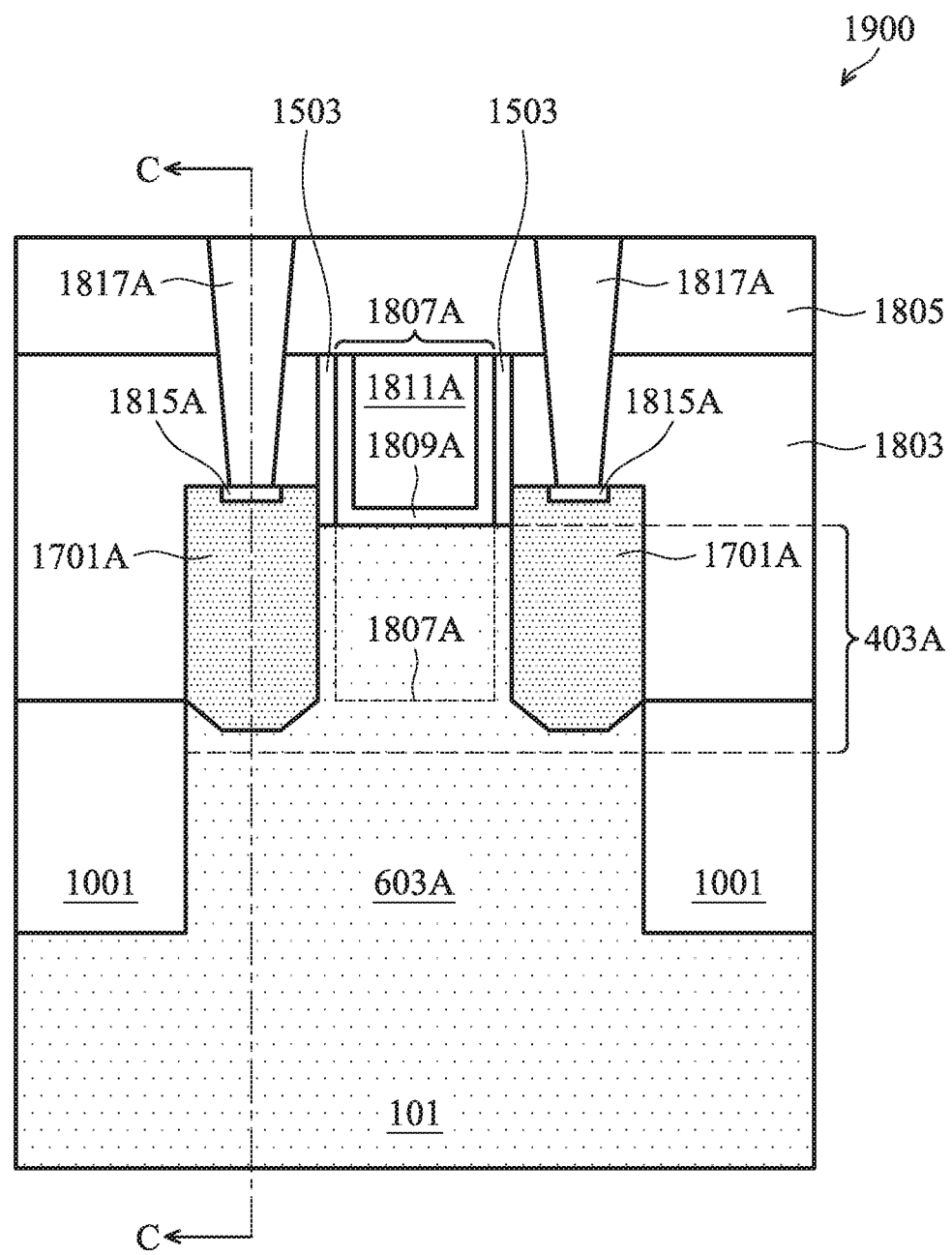
Figure 19C:
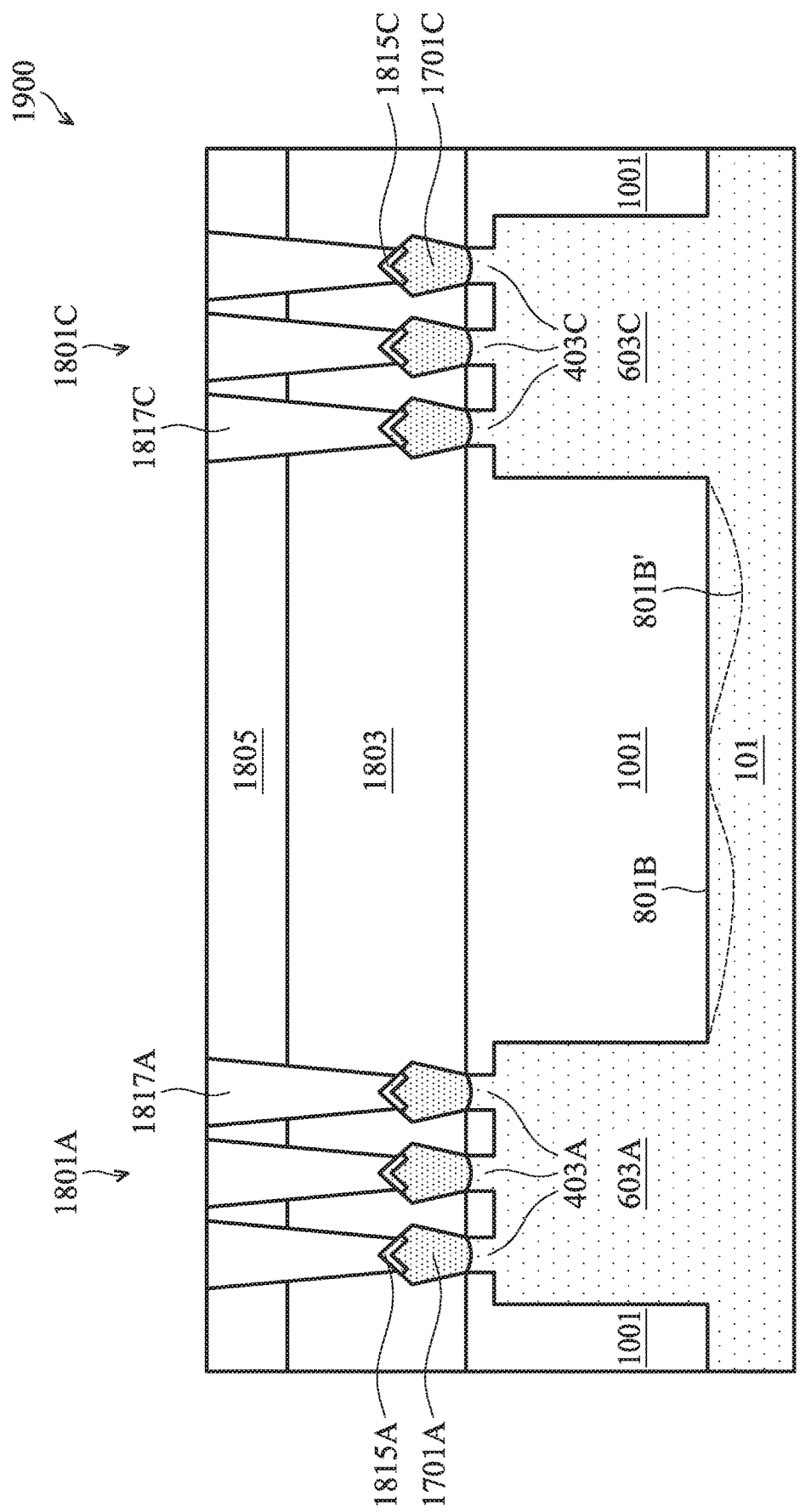

FIGS. 19A, 19B, and 19C illustrate cross-sectional views of a semiconductor device 1900 in accordance with some embodiments. FIG. 19B illustrates a cross-sectional view obtained from a vertical plane containing a line B-B in FIG. 19A, and FIG. 19C illustrates a cross-sectional view obtained from a vertical plane containing a line C-C in FIG. 19B. The semiconductor device 1900 is similar to the semiconductor device 1400 (see FIGS. 18A, 18B, and 18C), with like elements labeled with like numerical references. In some embodiments, the semiconductor device 1900 may be formed using similar materials and methods as the semiconductor device 1400, described above with reference to FIGS. 1A-18C, and the description is not repeated herein for the sake of brevity. In the illustrated embodiment, the source/drain regions 1701A and 1701C are individual source/drain regions for each of the active fins 403A and for each of the active fins 403C, respectively. Accordingly, the source/drain regions 1701A and 1701C do not form common source/drain regions for the group of active fins 403A and the group of active fins 403C, respectively.

Figure 20:
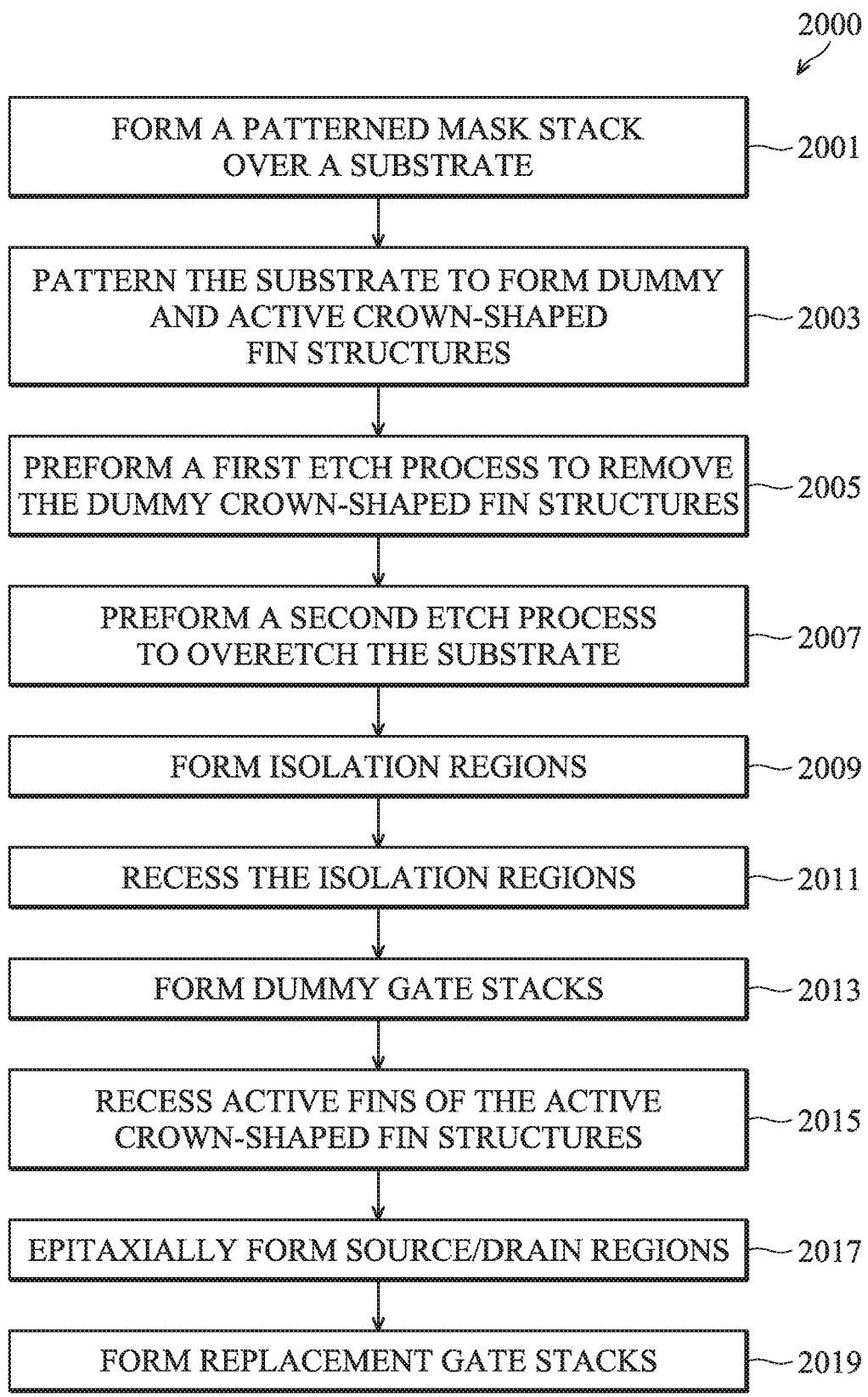
FIG. 20 is a flow diagram illustrating a method of forming a semiconductor device in accordance with some embodiments.

FIG. 20 is a flow diagram illustrating a method 2000 of forming a semiconductor device in accordance with some embodiments. The method 2000 starts with step 2001, where a patterned mask stack (such as the mask stack 109 illustrated in FIGS. 3A and 3B) is formed over a substrate (such as the substrate 101 illustrated in FIGS. 3A and 3B) as described above with reference to FIGS. 1A-3B. In step 2003, the substrate is patterned to form active crown-shaped fin structures (such as the active fins 403A and 403C with the respective active bases 603A and 603C illustrated in FIGS. 6A and 6B) and dummy crown-shaped fin structures (such as the dummy fins 403B with the respective dummy base 603B illustrated in FIGS. 6A and 6B) as described above with reference to FIGS. 4A-6B. In step 2005, a first etch processes is performed to remove the dummy crown-shaped fin structures as described above with reference to FIGS. 7A-8B. In step 2007, a second etch process is performed to overetch the substrate as described above with reference to FIGS. 8A and 8B. In step 2009, isolation regions (such as the STI regions 1001 illustrated in FIG. 10) are formed as described above with reference to FIGS. 9A-10B. In step 2011, the isolation regions are recessed to expose active fins of the active crown-shaped fin structures as described above with reference to FIGS. 11A and 11B. In step 2013, dummy gate stacks (such as the dummy gate stacks 1501A and 1501C illustrated in FIGS. 15A, 15B and 15C) are formed over the expose active fins of the active crown-shaped fin structures as described above with reference to FIGS. 14, 15A, 15B and 15C. In step 2015, the active fins of the active crown-shaped fin structures are recessed as described above with reference to FIGS. 16A, 16B and 16C. In step 2017, source/drain regions (such as the source/drain regions 1701A and 1701C illustrated in FIGS. 17A, 17B and 17C) are epitaxially formed as described above with reference to FIGS. 17A, 17B and 17C. In step 2019, replacement gate stacks (such as the replacement gate stacks 1807A and 1807C illustrated in FIGS. 18A, 18B and 18C) are formed as described above with reference to FIGS. 18A, 18B and 18C.

The embodiments of the present disclosure have some advantageous features. Various embodiments described herein allow for enlarging a fin etch process window, better critical dimension (CD) loading for strained source and drain (SSD) epitaxial (EPI) process, CVD stress effect (bending) improvement, better wafer acceptance test (WAT) and reliability performance, and better circuit probe (CP) yield performance.

According to an embodiment, a method includes forming a first active fin structure and a second active fin structure on a substrate. A dummy fin structure is formed on the substrate, the dummy fin structure being interposed between the first active fin structure and the second active fin structure. The dummy fin structure is removed to expose a first portion of the substrate, the first portion of the substrate being disposed directly below the dummy fin structure. A plurality of protruding features is formed on the first portion of the substrate. A shallow trench isolation (STI) region is formed over the first portion of the substrate, the STI region covering the plurality of protruding features, at least a portion of the first active fin structure and at least a portion of the second active fin structure extending above a topmost surface of the STI region.

According to another embodiment, a method includes forming a first active base and a second active base on a substrate. A dummy base is formed on the substrate, the dummy base being interposed between the first active base and the second active base. A plurality of first active fins is formed on the first active base. A plurality of second active fins is formed on the second active base. A plurality of dummy fins is formed on the dummy base. A first etching process is performed on the plurality of dummy fins and the dummy base to remove the plurality of dummy fins and the dummy base and form a recess in the substrate. A second etching process is performed on a bottom of the recess to form a plurality of protruding features on the bottom of the recess. A shallow trench isolation (STI) region is formed in the recess, a topmost surface of the STI region being below topmost surfaces of the plurality of first active fins and topmost surfaces of the plurality of second active fins.

According to yet another embodiment, a structure includes a plurality of first fins on a substrate, adjacent first fins being separated by a plurality of first recesses, and a plurality of second fins on the substrate, adjacent second fins being separated by a plurality of second recesses. The structure further includes a third recess in the substrate, the third recess being interposed between the plurality of first fins and the plurality of second fins, a bottom of the third recess being lower than bottoms of the plurality of first recesses and bottoms of the plurality of second recesses, and a plurality of protruding features on the bottom of the third recess.

According to yet another embodiment, a device includes a plurality of first fins and a plurality of second fins on a substrate. The plurality of first fins includes a first number of first fins. The plurality of second fins includes a second number of second fins. The second number is equal to the first number. The device further includes a plurality of protruding features on the substrate. The plurality of protruding features is interposed between the plurality of first fins and the plurality of second fins. The plurality of protruding features includes a third number of protruding features. The third number is equal to or less than the first number.

According to yet another embodiment, a device includes a first fin structure and a second fin structure on a substrate. The first fin structure includes a first base structure on the substrate, and first fins extending from a topmost surface of the first base structure. The second fin structure includes a second base structure on the substrate, and second fins extending from a topmost surface of the second base structure. The first fins and the second fins include a same number of fins. The device further includes a plurality of protruding features on the substrate. The plurality of protruding features is interposed between the first fin structure and the second fin structure. A number of the plurality of protruding features is equal to or less than a number of the first fins. The device further includes a shallow trench isolation (STI) region covering the plurality of protruding features. Topmost surfaces of the first fins and topmost surfaces of the second fins are above a topmost surface of the STI region.

According to yet another embodiment, a device includes a first crown-shaped structure and a second crown-shaped structure on a substrate. The first crown-shaped structure includes a first base structure on the substrate, and a plurality of first fins over the first base structure. The plurality of first fins includes a first number of first fins. The second crown-shaped structure includes a second base structure on the substrate, and a plurality of second fins over the second base structure. The plurality of second fins includes a second number of second fins. The second number is equal to the first number. The device further includes a plurality of protruding features on the substrate. The plurality of protruding features is interposed between the first crown-shaped structure and the second crown-shaped structure. The plurality of protruding features includes a third number of protruding features. The third number is equal to or less than the first number. The device further includes a shallow trench isolation (STI) region overfilling trenches between adjacent protruding features. The plurality of first fins and the plurality of second fins extend above a topmost surface of the STI region. The device further includes a first gate dielectric layer extending along topmost surfaces and sidewalls of the plurality of first fins, and a first gate electrode layer over the first gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a plurality of first fins on a substrate, the plurality of first fins comprising a first number of first fins;
   a plurality of second fins on the substrate, the plurality of second fins comprising a second number of second fins, the second number being equal to the first number; and
   a plurality of protruding features on the substrate, the plurality of protruding features being interposed between the plurality of first fins and the plurality of second fins, the plurality of protruding features being only protruding features interposed between the plurality of first fins and the plurality of second fins, the plurality of protruding features comprising a third number of protruding features, the third number being equal to or less than the first number, wherein the plurality of protruding features comprise a first protruding feature, a second protruding feature and a third protruding feature, the second protruding feature being interposed between the first protruding feature and the third protruding feature, a height of the second protruding feature being greater than a height of the first protruding feature and a height of the third protruding feature.

2. The device of claim 1, wherein the third number is equal to the first number.

3. The device of claim 1, wherein the third number is less than the first number.

4. The device of claim 1, wherein the height of the first protruding feature of the plurality of protruding features and the height of the third protruding feature of the plurality of protruding features are substantially equal.

5. The device of claim 1, further comprising a shallow trench isolation (STI) region covering the plurality of protruding features, the plurality of first fins and the plurality of second fins extending above a topmost surface of the STI region.

6. The device of claim 1, further comprising:
   a first gate stack extending along topmost surfaces and sidewalls of the plurality of first fins; and
   a second gate stack extending along topmost surfaces and sidewalls of the plurality of second fins.

7. The device of claim 1, wherein a difference between the height of the first protruding feature and the height of the second protruding feature is between about 1 nm and about 200 nm.

8. A device comprising:
   a first fin structure on a substrate, the first fin structure comprising:
      a first base structure on the substrate; and
      first fins extending from a topmost surface of the first base structure;
   a second fin structure on the substrate, the second fin structure comprising:
      a second base structure on the substrate; and
      second fins extending from a topmost surface of the second base structure, a number of the first fins being equal to a number of the second fins;
   a plurality of protruding features on the substrate, the plurality of protruding features being interposed between the first fin structure and the second fin structure, the plurality of protruding features being only protruding features interposed between the first fin structure and the second fin structure, a number of the plurality of protruding features being equal to or less than the number of the first fins, wherein the plurality of protruding features comprise a first protruding feature, a second protruding feature and a third protruding feature, the second protruding feature being interposed between the first protruding feature and the third protruding feature, a topmost portion of the second protruding feature is lower than a topmost portion of the first protruding feature and a topmost portion of the third protruding feature; and
   a shallow trench isolation (STI) region covering the plurality of protruding features, topmost surfaces of the first fins and topmost surfaces of the second fins being above a topmost surface of the STI region.

9. The device of claim 8, wherein the number of the plurality of protruding features is equal to the number of the first fins.

10. The device of claim 8, wherein the number of the plurality of protruding features is less than the number of the first fins.

11. The device of claim 8, wherein a height of the first protruding feature of the plurality of protruding features and a height of the third protruding feature of the plurality of protruding features are substantially equal.

12. The device of claim 8, wherein a height of the first protruding feature of the plurality of protruding features is greater than a height of the second protruding feature of the plurality of protruding features.

13. The device of claim 8, wherein the topmost surface of the STI region is above the topmost surface of the first base structure and the topmost surface of the second base structure.

14. The device of claim 8, wherein the topmost surface of the STI region is level with the topmost surface of the first base structure and the topmost surface of the second base structure.

15. A device comprising:
   a first crown-shaped structure on a substrate, the first crown-shaped structure comprising:
     a first base structure on the substrate; and
     a plurality of first fins over the first base structure, the plurality of first fins comprising a first number of first fins;
   a second crown-shaped structure on the substrate, the second crown-shaped structure comprising:
     a second base structure on the substrate; and
     a plurality of second fins over the second base structure, the plurality of second fins comprising a second number of second fins, the second number being equal to the first number;
   a plurality of protruding features on the substrate, the plurality of protruding features being interposed between the first crown-shaped structure and the second crown-shaped structure, the plurality of protruding features comprising a third number of protruding features, the third number being equal to or less than the first number, wherein the plurality of protruding features comprise a first protruding feature, a second protruding feature and a third protruding feature, the second protruding feature being interposed between the first protruding feature and the third protruding feature, a height of the second protruding feature being greater than a height of the first protruding feature and a height of the third protruding feature;
   a shallow trench isolation (STI) region overfilling trenches between adjacent protruding features, the plurality of first fins and the plurality of second fins extending above a topmost surface of the STI region;
   a first gate dielectric layer extending along topmost surfaces and sidewalls of the plurality of first fins; and
   a first gate electrode layer over the first gate dielectric layer.

16. The device of claim 15, wherein the third number is equal to the first number.

17. The device of claim 15, wherein the third number is less than the first number.

18. The device of claim 15, wherein the trenches have concave bottom surfaces.

19. The device of claim 15, wherein the topmost surface of the STI region is above a topmost surface of the first base structure of the first crown-shaped structure and a topmost surface of the second base structure of the second crown-shaped structure.

20. The device of claim 15, further comprising:
   a second gate dielectric layer extending along topmost surfaces and sidewalls of the plurality of second fins; and
   a second gate electrode layer over the second gate dielectric layer.

* * * * *